United States Patent [19]

Itoh et al.

[11] Patent Number: 5,787,126
[45] Date of Patent: Jul. 28, 1998

[54] DETECTOR AND RECEIVING AND TRANSMITTING APPARATUS

[75] Inventors: Kenji Itoh; Mitsuhiro Shimozawa; Kenji Kawakami; Noriharu Suematsu; Akio Iida, all of Tokyo, Japan

[73] Assignee: Mitsubishi Denki Kabushiki Kaisha, Tokyo, Japan

[21] Appl. No.: 597,708

[22] Filed: Feb. 7, 1996

[30] Foreign Application Priority Data

Mar. 3, 1995 [JP] Japan .................................. 7-044312

[51] Int. Cl.$^6$ .................................................. H04L 27/22
[52] U.S. Cl. ........................ 375/340; 375/324; 375/329; 329/306
[58] Field of Search ............................ 375/340, 324, 375/325, 329; 329/306, 304, 302, 300, 346, 345, 323, 315; 455/215, 258, 259, 324

[56] References Cited

U.S. PATENT DOCUMENTS

| | | | |
|---|---|---|---|
| 5,303,417 | 4/1994 | Laws | 455/314 |
| 5,361,408 | 11/1994 | Watanabe et al. | 455/324 |
| 5,436,931 | 7/1995 | Minami | 375/334 |
| 5,446,762 | 8/1995 | Ohba et al. | 375/324 |
| 5,550,869 | 8/1996 | Gurantz et al. | 375/340 |

OTHER PUBLICATIONS

Philips Journal of Research "Some Features of Signal Demodulation Resulting From the Practical Implementation of a Direct Conversion Radio Receiver", vol. 41, No. 3, 1986.

Journal of the Institute of Electronics, Information and Communication Engineers, "A Direct Conversion Receiver Employing a Frequency Multiplied Digital Phase-Shifting Demodulator", Nov. 1993.

Primary Examiner—Stephen Chin
Assistant Examiner—Betsy L. Deppe
Attorney, Agent, or Firm—Wolf, Greenfield & Sacks, P.C.

[57] ABSTRACT

The detector comprises a first distributor for distributing a signal wave, a 45 degree shifter for shifting a local oscillation, a first even harmonic mixer and a second even harmonic mixer for generating a mixed wave between a double frequency wave of said local oscillation wave and said signal wave. The present invention can be used for increasing the accuracy and downsizing of quadrature mixer used in a receiving transmitting apparatus of a wireless communication system.

25 Claims, 59 Drawing Sheets

OPEN CIRCUITED STUB
CONCENTRATED-CONSTANT STUB A & C

SHORT-CIRCUITED STUB
CONCENTRATED-CONSTANT STUB B & D

DETECTOR AND RECEIVING AND TRANSMITTING APPARATUS

BACKGROUND OF THE INVENTION

1. Field of the Invention

This invention relates to a detector used in a receiving/transmitting apparatus in a wireless communication system, and also to a receiving/transmitting apparatus comprising such detector.

2. Description of the Prior Art

FIG. 52 shows a functional block diagram of a conventional receiving apparatus by homodyne construction disclosed in Phillips Journal of Research vol. 41, No. 3, pages 219–231 published in 1986, or Article Magazine of The Institute of Electronics, Information and Communication Engineers, C-1,vol.J76-C-1, No. 11 pages 462–469 published in 1993.

The configuration of FIG. 52 comprises antenna (ANT) 1 for receiving a signal, low noise amplifier (LNA) 2 for amplifying an output which have been received at antenna 1, band pass filter (BPF) 3 where a received signal outputted from low noise amplifier 2 pass through, quadrature mixer 7 for detecting the received signal and outputting base band signals, namely I-signal and Q-signal which are quadrature to each other.

FIG. 53 shows a block diagram of inside configuration of quadrature mixer 7. Quadrature mixer 7 comprises zero-degree distributor 6 for distributing a signal outputted form band pass filter 3 (frequency $f_{rf}$) into two signals which are equal in both phase and magnitude, 90-degree distributor 5 for distributing a local oscillation wave inputted from outside (frequency $f_p$) into two signals which are equal in magnitude but different in phase by 90-degrees, a mixer (MIX) 4a for multiplying output from zero-degree distributor 6 and 90-degree distributor 5 in analog mode and a mixer (MIX) 4b for multiplying output from zero-degree distributor 6 and output of local oscillator 8 in analog mode, to obtain base band signals, namely I-signal and Q-signal.

The outputs from mixers 4a, 4b respectively inputted to low pass filters (LPF) 9a and 9b. The output from low pass filters 9a, 9b are amplified in base band amplifiers (AMP) 10a and 10b. Data is demodulated in demodulation circuit 11 according to I-signal and Q-signal.

An operation is explained as follows. In the receiving apparatus shown in FIG. 52, a received wave signal RF (frequency $f_{rf}$) received at antenna 1 is amplified in low noise amplifier 2, filtered in band pass filter 3, and provided with quadrature mixer 7. As shown in FIG. 53, in quadrature mixer 7, frequencies are mixed by mixers 4a, 4b. In mixer 4a, a local oscillation wave having a phase-shift of 90-degrees from LO is multiplied with a received wave signal RF (0 deg) in analog mode. In mixer 4b, a local oscillation wave having no phase-shift from LO is multiplied with a received wave signal RF (0 deg) in analog mode.

As shown by the spectrum in FIG. 54, when local oscillation frequency $f_p$ and received wave signal frequency $f_{rf}$ are almost the same ($f_p \approx f_{rf}$), modulation component of received wave signal RF is obtained if I-output and Q-output outputted from mixers 4a, 4b in quadrature mixer 7 respectively are filtered by low pass filters 9a, 9b so that a frequency close to the base band is extracted. FIG. 55 shows an example of output as a result of detecting a received wave signal RF of quadrature phase shift keying modulation (QPSK) by quadrature mixer 7 in case of $f_{rf}=f_p$. The shift of a symbol point along with the time is outputted on the line as shown in FIG. 55. The outputs, namely I-output and Q-output, are amplified by base band amplifiers 10a, 10b, respectively. After increasing the levels, the amplified outputs are then provided with demodulator 11, which reproduce data according to these outputs.

FIG. 56 shows another configuration of quadrature mixer 7 where a received wave signal, instead of local oscillation wave as shown in FIG. 53, is distributed into two signals which are different in phase to each other by 90 degrees. The same effects as obtained in the quadrature mixer shown in FIG. 53 are also obtained in this quadrature mixer 7 of FIG. 56. Instead of 90-degree phase shifter 5, 90-degree hybrid distributor such as a brunch line coupler or a Lange coupler may be used.

A receiver of homodyne construction shown in FIG. 52 has more advantageous points than a receiver of heterodyne construction. Since an intermediate frequency circuit is not necessary, such receiver of homodyne construction can be made smaller and by low cost. Band pass filter 3 can be also made smaller since no image frequency of mixer exists. For these reasons, the receivers of homodyne construction are used for amplitude modulation radios, frequency modulation radios, or pagers (FSK modulation) e.t.c.

As mixers 4a, 4b in quadrature mixer 7 used in a receiver of homodyne construction, there is a general diode-balancing mixer shown in FIG. 57, or a balancing-mixer such as Gilbert cell using transistors shown in FIG. 58, disclosed in P. R. Gray, R. G. Mayor: "Analysis and Design of analog integrated circuits", chapter 10.3, published by Baifukan.

The configuration of FIG. 57 comprises mixer diodes 13a, 13b, 13c, 13d, baluns 14a, 14b, local oscillation (LO) wave input terminal 15, received signal (RF) wave input terminal 16, base band output terminal 17. Both RF and LO are fed to mixer diodes 13a–13d by baluns 14a, 14b. Mixed waves generated by multiplying waves RF, LO in analog mode in mixer diodes 13a–13d are outputted to base band output terminal 17. Neither wave RF nor LO by itself is outputted to terminal 17 since they are canceled by each other.

The configuration of FIG. 58 comprises resistors 18a, 18b, transistors 19a, 19b, 19c, 19d, 19e, 19f, current source 20. RF and LO are inputted from differential inputs. RF signals which are inverted phase to each other are fed to transistors 19a, 19b and transistors 19c, 19d. LO signals which are also inverted phase to each other are fed to transistors 19e, 19f. A mixed wave generated by multiplying signals RF and LO in analog mode in transistors 19a–19f is outputted to differential-output base band output terminal 17 connected to the collectors of transistors 19a, 19c as well as the collectors of transistors 19b, 19d, respectively. Neither wave RF nor LO by itself is outputted to terminal 17 since they are canceled by each other.

Although the construction of above-mentioned conventional receiver of homodyne construction is simple, the utility is quite limited due to several problems discussed below.

First, as shown in FIG. 59, in case of a cellular phone as an example, power of a received wave RF received by antenna 1 is small around −90dBm. Therefore, high sensitivity and gain are required for the design of a receiver. For this reason, if a local oscillation wave LO around 5 dBm is emitted from a printed board, LO is inputted to antenna 1. Even if the attenuation is as much as 90 dB at emission, the level of LO becomes the same as that of RF, i.e. −85 dBm. On that account, LO is inputted into quadrature mixer 7 with RF and they interfere each other. Its frequency relationship is shown in FIG. 60. An interference wave $f_p'$ as well as a received wave $f_{rf}$ are detected in quadrature mixer 7 and then direct currently outputted such as $f_p-f_p'$ in FIG. 60. Since this DC-output ($f_p-f_p'$) includes noise component of LO, it interferes a desired wave ($f_{rf}-f_p$), resulting in restrain to the sensitivity of a receiver. As show in FIG. 61, vector errors increases due to DC offset for I-Q components. For this reason, code error rate deteriorates if such is applied to digital communication.

Even if there is no interference, the above-mentioned problem caused by DC offset is brought about as described in "Mixers as phase detector", W J company Tech-note Vol. 5, No. 1 published in 1978. In diodes balancing mixer shown in FIG. 57, if characteristic variation exists in each mixer diode 13a, 13b, 13c, 13d, a rectified current of LO is not canceled in each mixer diodes 13a~13d and then resulting in DC offset. The same problem is caused in the Gilbert cell using transistors shown in FIG. 58.

Moreover in the field of wireless communication, sensitivity deterioration caused by distortion generated when two waves more powerful than a desired wave are inputted must be restrained other than the sensitivity. In other words, low distortion is required. FIG. 62 shows a general distortion characteristic, the most of which is due to the third-order distortion caused by adjacent channel waves, which is the same problem in the receiver of heterodyne construction. In FIG. 62, the desired received wave is f1, adjacent channel waves are f2, f3, and the dotted lines depicts third-order distortions caused by f2 and f3.

Furthermore, even-order distortions such as the second-order are also reported in connection with a conventional receiver of homodyne construction. FIG. 63 shows a frequency relationship of even-order (i.e. the second-order in case of FIG. 63) distortion reported at Autumn National Conference of the Institute of Electronics, Information and Communication Engineers, B-329 in 1993 or Autumn National Conference of the Institute of Electronics, Information and Communication Engineers C-73 in 1994. The dotted line shows the second-order distortion, by which a frequency differential $\Delta f=f3-f2$ of adjacent channel waves f2 and f3 is generated and near the base band. This problem is unique to the receiver of homodyne construction, and not observed in case of the receiver of heterodyne construction. In a conventional receiver of homodyne construction, there is a problem caused by the even-order distortion as well as the third-order distortion, which causes deterioration of sensitivity.

It is an object of the invention to provide a detector in which the sensitivity of a receiver is improved, the code error rate is decreased, DC-offset as well as even-order distortion such as the second-order distortion is reduced.

SUMMARY OF THE INVENTION

According to one aspect of the invention, a detector comprises a first distributor for distributing a signal wave provided from outside, a 45 degree shifter for shifting a local oscillation wave provided from a local oscillator, a first even harmonic mixer for generating a mixed wave between a double frequency wave of the local oscillation wave from the shifter and the signal wave from the first distributor (6), and a second even harmonic mixer for generating a mixed wave between a double frequency wave of the local oscillation wave from the local oscillator and the signal wave from the first distributor(6).

Preferably, a detector in the present invention, the first distributor feeds the signal wave to the first even harmonic mixer and the second even harmonic mixer so that the signal wave is distributed equally in phase and magnitude, the local oscillator feeds local oscillation wave to the second even harmonic mixer, and the shifter feeds the local oscillation wave, which is different in phase by 45 degrees from the local oscillation wave but equal in magnitude, to the first even harmonic mixer.

Preferably, a detector in the present invention, the first distributor feeds the signal wave to the first even harmonic mixer and the second even harmonic mixer so that the signal wave is distributed by 90 degrees to each other in phase difference but the same magnitudes, the local oscillator feeds local oscillation wave to the second even harmonic mixer, and the shifter feeds the local oscillation wave, which is the same phase and the same amplitude with the local oscillation wave, to the first even harmonic mixer.

Preferably, a detector in the present invention, a center frequency of the first distributor is set between a frequency of the signal wave and a frequency of the local oscillation wave.

Preferably, a detector in the present invention, a center frequency of the shifter is set between a frequency of the signal wave and a frequency of the local oscillation wave.

Preferably, a detector in the present invention, further comprises a first amplifier for amplifying an output from the first distributor and providing the output with the first even harmonic mixer, and a second amplifier for amplifying an output from the first distributor and providing the output with the second even harmonic mixer.

Preferably, a detector in the present invention, further comprises a third amplifier for amplifying an output from the local oscillator and for providing the output with the second even harmonic mixer, and the fourth amplifier for amplifying an output from the shifter and providing the output with the first even harmonic mixer.

Preferably, a detector in the present invention, further comprises a first filter arranged between the first distributor and the first even harmonic mixer so that the signal wave pass through the first filter, and a second filter arranged between the first distributor and the second even harmonic mixer so that the signal wave pass thorough the second filter.

Preferably, a detector in the present invention, further comprises a third filter arranged between the local oscillator and the second even harmonic mixer so that the local oscillation wave pass through the third filter, and a fourth filter arranged between the shifter and the first even harmonic mixer so that the local oscillation wave pass through the fourth filter.

Preferably, a detector in the present invention, the filter blocks a frequency sum ($f_{in}+2f_p$), when the signal wave frequency is $f_{in}$, and the local oscillation wave frequency is $f_p$.

Preferably, a detector in the present invention, further comprises a doubled-wave restraining filter for restraining a double frequency wave contained in the local oscillation wave which is provided from the local oscillator to the shifter and the second even harmonic mixer.

Preferably, a detector in the present invention, further comprises a limiter for restraining an amplitude fluctuation contained in the local oscillation wave which is provided from the local oscillator to the shifter and the second even harmonic mixer.

Preferably, a detector in the present invention, further comprises a divider for dividing the local oscillation wave which is provided from the local oscillator to the shifter and the second even harmonic mixer.

Preferably, a detector in the present invention, further comprises a first load resistance having a value of above 50Ω on an output terminal of the first even harmonic mixer, and a second load resistance having a value of above 50Ω on an output terminal of the second even harmonic mixer.

Preferably, a detector in the present invention, further comprises a first low pass filter arranged on an output terminal of the first even harmonic mixer so that a frequency of converted base band adjacent channel wave becomes a cutoff frequency, and a second low pass filter arranged on an output terminal of the second even harmonic mixer so that a frequency of converted base band adjacent channel wave becomes a cutoff frequency.

Preferably, a detector in the present invention, each the first even harmonic mixer or the second even harmonic mixer comprises a diode pair comprised of two diodes connected in parallel, the two diodes are connected in opposite polarity to each other, a first terminal (A) at parallel connection of the two diodes is connected to an input terminal of the signal wave and also connected to an output terminal of the mixed wave, a second terminal (B) of parallel connection of the two diodes is connected to an input terminal of the local oscillation wave, a first diplexer connected to the first terminal (A) of parallel connection, the first diplexer comprised of concentrated constant, the first diplexer being short at a frequency of the local oscillation wave, and being open at a frequency of the signal wave, and a second diplexer connected to the second terminal (B) of parallel connection, the second diplexer comprised of concentrated-constant, the second diplexer being open at a frequency of the local oscillation wave, and being short at a frequency of the signal wave.

Preferably, a detector in the present invention, the first diplexer is comprised of a serial resonant circuit comprised of a capacitor and a inductor connected in series, and a capacitor connected in parallel with the serial resonant circuit.

Preferably, a detector in the present invention, the first diplexer is comprised of a parallel resonant circuit comprised of a capacitor and a inductor connected in parallel, and a capacitor connected in series with the parallel resonant circuit.

Preferably, a detector in the present invention, the second diplexer is comprised of a serial resonant circuit comprised of a capacitor and a inductor connected in series, and a inductor connected in parallel with the serial resonant circuit.

Preferably, a detector in the present invention, the second diplexer is comprised of a parallel resonant circuit comprised of a capacitor and a inductor connected in parallel, and an inductor connected in series with the parallel resonant circuit.

Preferably, a detector in the present invention, each the first even harmonic mixer or the second even harmonic mixer comprises a differential amplifier for amplifying the local oscillation wave to output the local oscillation wave as a first output and a second output which is inverted from first output, and a mixing portion comprised of a diode ring, the diode ring comprising a plurality of diode pairs connected to each other in ring shape, each of the diode pairs comprised of two diodes connected in parallel, the two diode being connected in opposite polarity, for outputting a mixed wave mixed with a signal wave and a double frequency wave of the local oscillation wave inputted to the diode ring according to the two outputs from the differential amplifier.

Preferably, a detector in the present invention, further comprises a filter connected between the differential amplifier and the mixing portion for removing harmonics included in an output waveform from the differential amplifier.

Preferably, a detector in the present invention, each the first even harmonic mixer or the second even harmonic mixer comprises a first differential amplifier for amplifying a signal wave and for outputting the signal wave as a first output and a second output which is inverted from the first output, and a second differential amplifier for receiving the local oscillation wave and for generating a double frequency wave of a local oscillation wave and then for multiplying the double frequency wave and the first output from the first differential amplifier to output as differential signals, a third differential amplifier having an output terminal connected in parallel with an output of the second differential amplifier, for receiving the local oscillation wave and for generating a double frequency wave which is in inverted phase to a double frequency wave of a local oscillation wave generated in the first differential amplifier, and then for multiplying the double frequency wave and the second output from the first differential amplifier to output as differential signals.

A receiving apparatus comprising the detector of the present invention comprises an antenna, an amplifier for amplifying a signal received by the antenna, a local oscillator for generating a local oscillation wave, a detector for detecting an output of the amplifier and for outputting base-band I-signal and base-band Q-signal according to the local oscillation wave, and a demodulation circuit for demodulating data according to the I-signal and Q-signal.

A transmitting apparatus comprising the detector of the present invention comprises a modulation circuit for modulating data according to the I-signal and Q-signal, a local oscillator for generating a local oscillation wave, a vector modulator for modulating vector of each the I-signal and Q-signal according to the local oscillation wave, an amplifier for amplifying an output from the vector modulator, and an antenna for transmitting an output from the amplifier.

DETAILED DESCRIPTION OF THE PREFERRED EMBODIMENTS

Embodiment 1.

Referring to a figure, a receiving apparatus using an quadrature mixer according to a first embodiment of the present invention is explained as follows. The configuration of FIG. 1 comprises antenna 1 (hereinafter ANT) for receiving a received wave $f_{rf}$, low noise amplifier 2 (hereinafter LNA) for amplifying a wave received by the antenna, band pass filter 3 (hereinafter BPF) for filtering an output from the low noise amplifier, and even harmonic quadrature mixer 41 for quadraturely detecting the output from the band pass filter 3 and then outputs I-signal and Q-signal.

Figure 2:
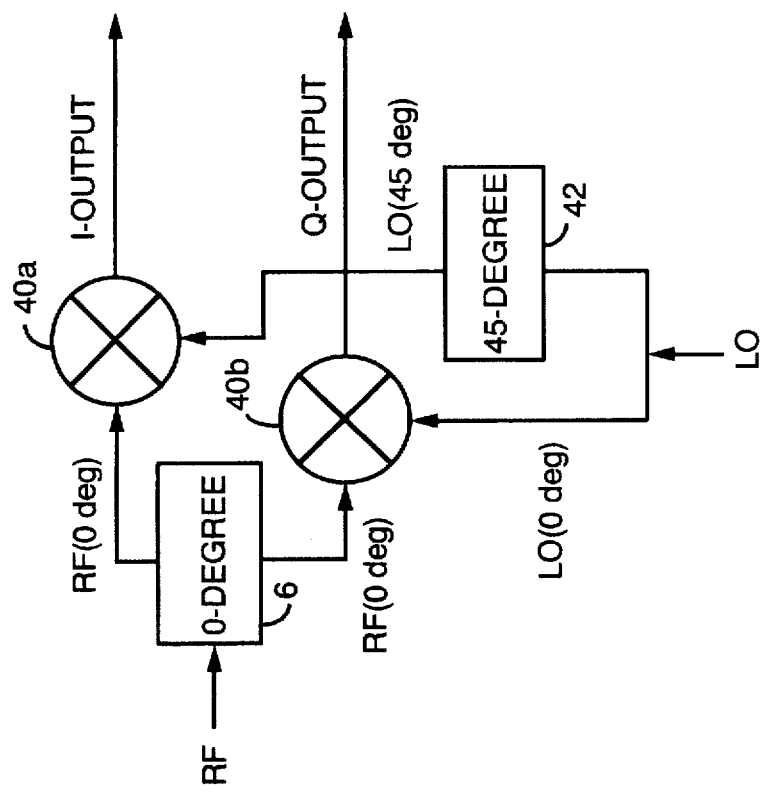
FIG. 2 shows a configuration of an even harmonic quadrature mixer according to the first embodiment of the present invention.

Even harmonic quadrature mixer 41, as shown in FIG. 2, comprises zero-degree distributor 6 for distributing the output from band pass filter 3 into two signals RF(0 deg) which are equal in phase and magnitude, 45-degree phase shifter 42 for shifting a local frequency signal LO by 45 degrees, and even harmonic mixers 40a, 40b for receiving outputs from zero-degree distributor 6 and 45-degree phase shifter 42 respectively for generating base band signals, namely I signal (I-output) and Q-signal (Q-output).

Figure 3:
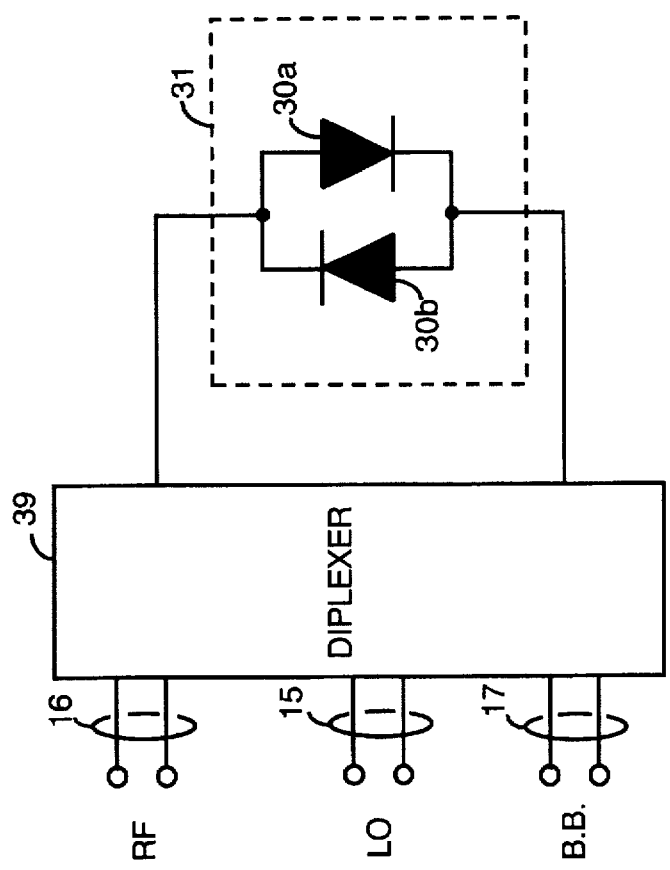
FIG. 3 shows a general configuration of an even harmonic mixer.

FIG. 3 shows a configuration of even harmonic mixer 40a and 40b. Two mixer diodes 30a, 30b of the opposite polarities are connected in parallel to constitute anti parallel diode pair (hereinafter APDP) 31. APDP 31 detects a base band signal by multiplying RF signal and a double frequency wave of LO signal, in analog mode. Branch wave circuit 39 provides RF signal inputted from terminal 16 and LO signal inputted from terminal 15 with APDP 31, and extracts a detected base band (B.B.) signal, and then output it via terminal 17.

Figure 1:
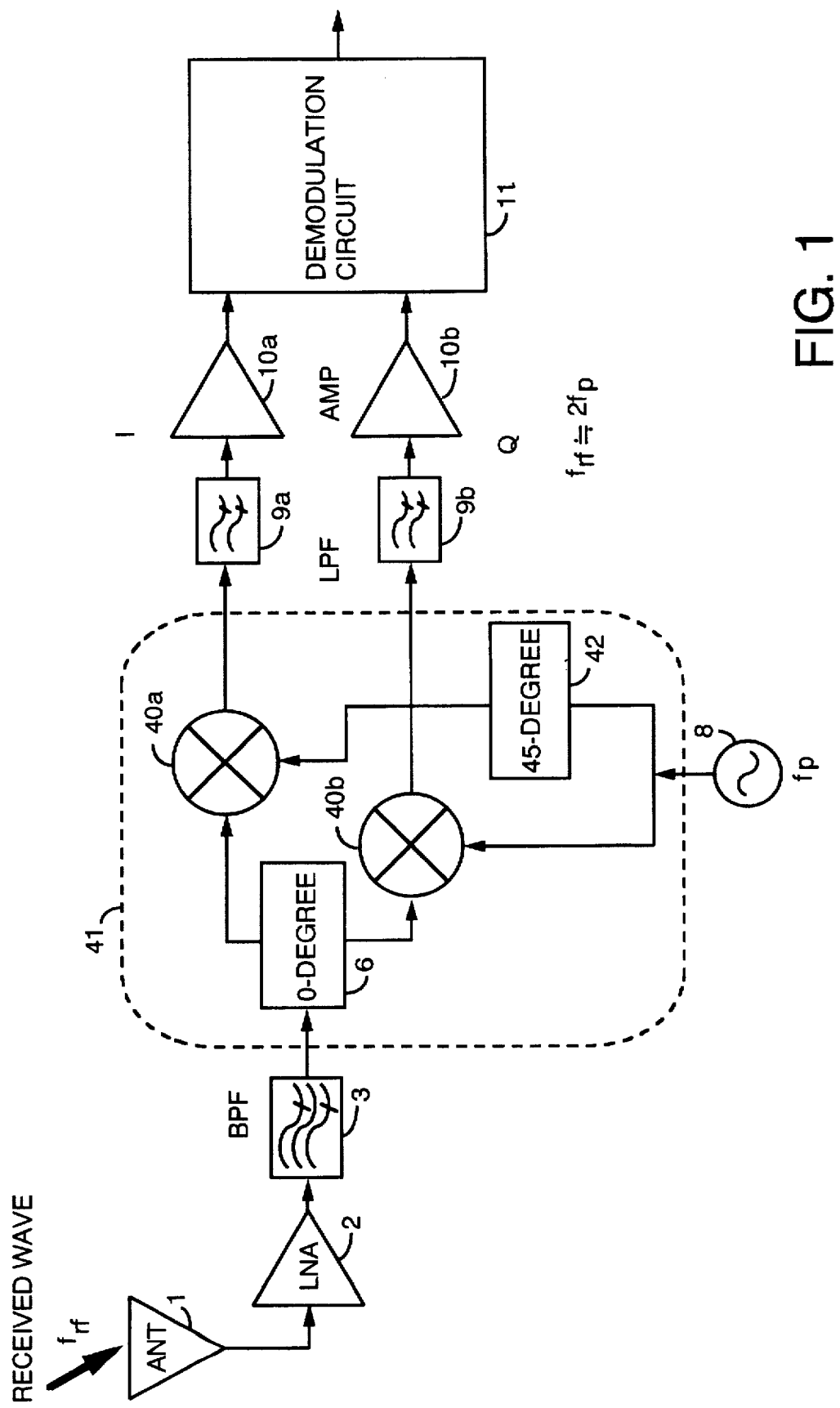
FIG. 1 shows a configuration of a receiver according to a first embodiment of the present invention.

In FIG. 1, the local oscillator 8 generates a local oscillation signal (LO). I-signal and Q-signal outputted from even harmonic mixers 40a, 40b are received in low pass filters 9a, 9b respectively, where low frequency components are extracted from the signals and then outputted respectively to base band amplifiers 10a, 10b. Base band amplifiers 10a, 10b amplify the outputs from low pass filters 9a, 9b respectively. Demodulation circuit 11 demodulates data according to the outputs from base band amplifiers 10a, 10b.

An operation of the configuration of FIG. 1 is described as follows. In FIG. 1, a signal received by antenna 1 is amplified in low noise amplifier 2 and then inputted into band pass filter 3, where only signals of a desired band range are extracted and then inputted to even harmonic quadrature mixer 41. The even harmonic quadrature mixer 41 detects a signal wave and outputs modulated components of the base band as I-signal and Q-signal.

An operation of even harmonic quadrature mixer 41 is described in detail as follows. Receiving an output from band pass filter 3, zero-degree distributor 6 distributes a received signal into two signals which are equal both in phase and magnitude. 45-degree phase shifter 42 shifts an output from local oscillator 8 by 45 degrees. Even harmonic mixer 40a extracts a base band I-signal by multiplying one of the outputs from zero-degree distributor 6 and a double frequency of the local oscillation wave shifted by 45-degrees in analog mode. On the other hand, even harmonic mixer 40b extracts a base band Q-signal by multiplying the other output from zero-degree distributor 6 and a double frequency of the local oscillation wave in analog mode. Since even harmonic mixer 40a deals with a double frequency of local oscillation wave, the phase shift in the phase shifter 42 by 45 degrees becomes at the even harmonic mixer 40a.

Low pass filters 9a, 9b extract low frequency components from I-signal and Q-signal outputted from even harmonic mixers 40a, 40b, respectively. Base band amplifiers 10a, 10b amplify outputs from low pass filters 9a, 9b respectively and then output them to demodulation circuit 11. Demodulation circuit 11 demodulates data according to such I-signal and Q-signal.

Figure 4:
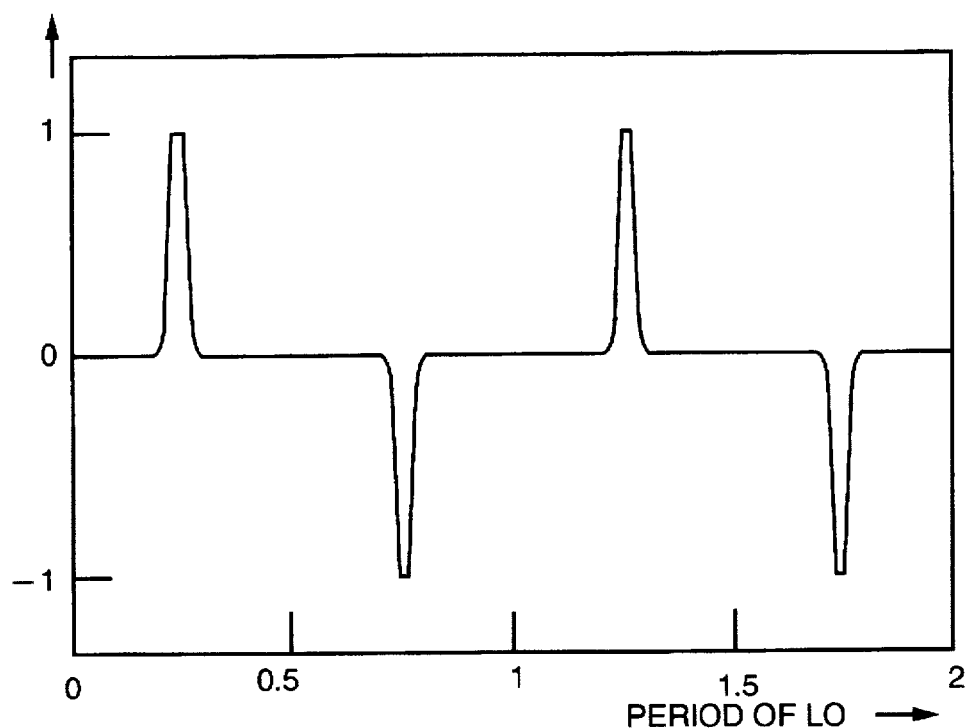
FIG. 4 is a waveform diagram of current flowing through APDP.
Figure 5:
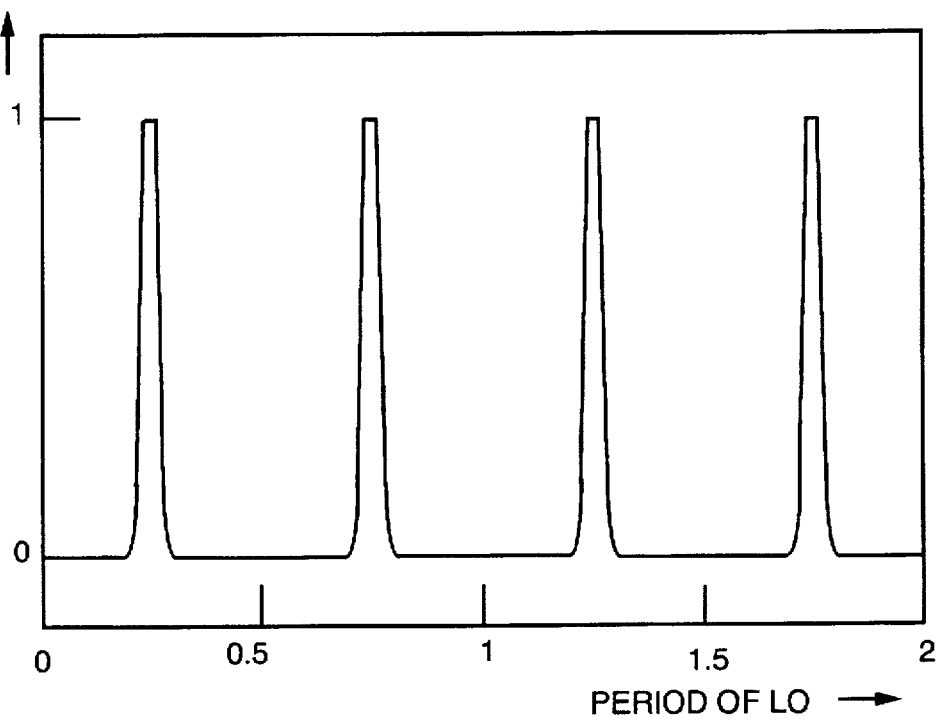
FIG. 5 is a waveform diagram of conductance of APDP.

In even harmonic mixers 40a, 40b as shown in FIG. 3, mixer diodes 30a, 30b turn on in every half period when LO is applied to them, and the current as shown in FIG. 4 starts flowing. Thereby, the conductance of the diodes rises in every half period as shown in FIG. 5. On that account, the harmonic of LO appears only in every odd cycle, and the harmonic of conductance appears only in every even cycle.

Accordingly, when APDP 31 is comprised in a mixer configuration, a signal wave $f_{rf}$ is mixed with a double frequency wave $2f_p$ of local oscillation (LO) signal, since it seems as if APDP 31 were modulated by even harmonics of LO. Therefore, the mixing between $f_p$ and the $f_{rf}$ is restrained. Due to this reason, a phase of local oscillation waves $f_p$ is likely to be doubled. This is the reason why the phase shifter of the local oscillation waves in even harmonic quadrature mixer 41 shifts the phase by 45 degrees. In even harmonic mixer 40a using this APDP 31, the harmonics appearing in every even cycle of LO and every odd cycle of conductance are restrained by balancing two diodes 30a, 30b. The above restraint depends on only the balance of these two diodes, but the accuracy of a circuit such as a balun. Therefore, the quadrature mixer according to the first embodiment more effectively restrains the harmonics than a conventional parallel mixer which comprises four diodes and depends on the accuracy of balun. In addition to that, a general parallel mixer restrains the harmonics up to about 25 dB in microwave, but the even harmonic mixer shown in FIG. 3 restrains the harmonics ranging from 50 dB to 60 dB.

Output frequency $f_{out}$ of this even harmonic mixers 40a, 40b (referred to as $f_{out}$ hereinafter) are represented by the following formula.

$$f_{out} = ABS(m \cdot f_{rf} \pm n \cdot f_p) \quad (1)$$

where, $f_{rf}$ is frequency of the received signal, $f_p$ is frequency of local oscillation wave, m and n are any integers which make absolute-value (m±n) odd, and ABS stands for absolute-value.

When multi-carrier is inputted, the sum of the coefficients which correspond to each carrier of the mixed wave becomes odd. Accordingly, in a normal operation, $f_{out}$ is obtained by the following formula.

$$f_{out} = ABS(f_{rf} \pm 2 \cdot f_p) \quad (2)$$

Under this condition, since the mixer can be operated in half of $f_p$, the mixers are used for a transmitting and receiving apparatus of heterodyne configuration in microwaves, especially milli-meter waves.

Figure 6:
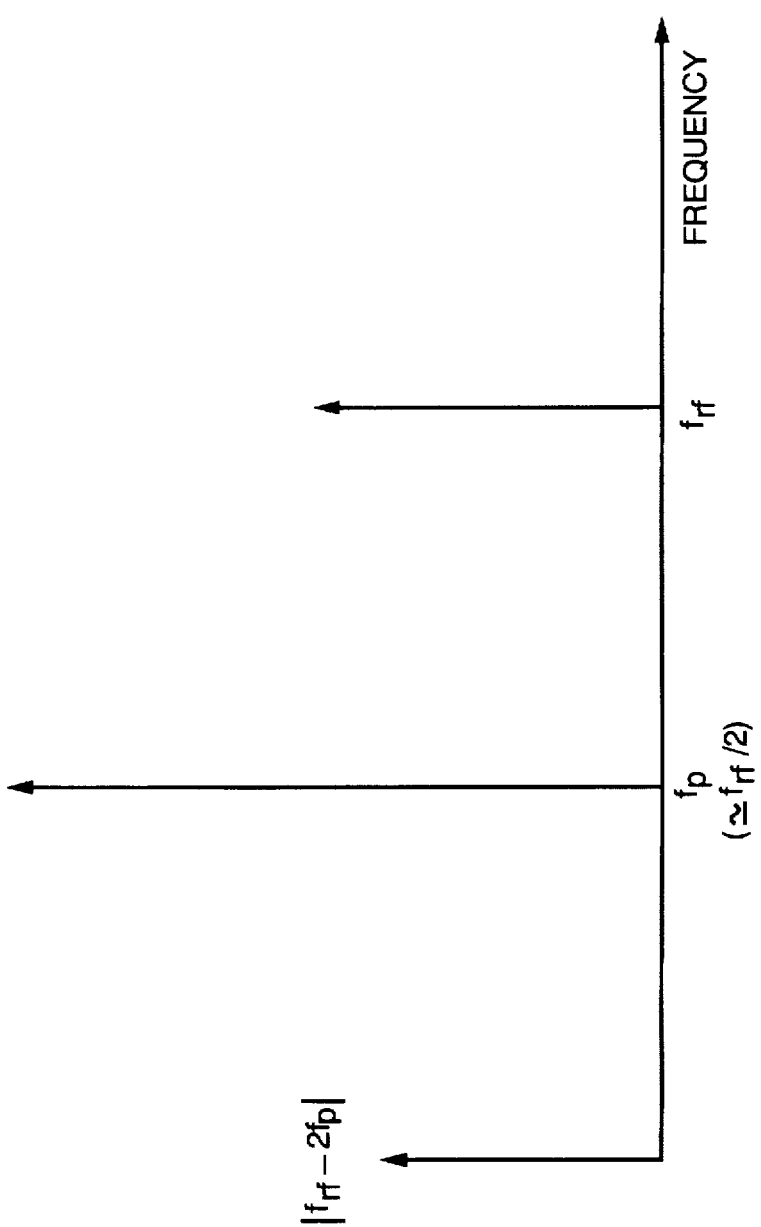
FIG. 6 shows a frequency relationship of a receiver according to the first embodiment of the present invention.

FIG. 6 shows a frequency relationship when such even harmonic mixers 40a, 40b mentioned-above applied to a receiving apparatus of homodyne configuration. As is evident from the above formula (2), the frequency of LO ($f_p$) is about half of RF ($f_{rf}$), namely, $f_p \approx f_{rf}/2$.

Accordingly, when the mixers are applied to a receiving apparatus of homodyne configuration, DC component of even harmonic mixers 40a, 40b is obtained by the above formula (1) under the condition that both m and n are zero.

Since this DC component can be regarded even-order, it is strongly restrained and then becomes low level. According to the first embodiment, it has an effect to decrease the code error rate by restraining DC offset.

Figure 7:
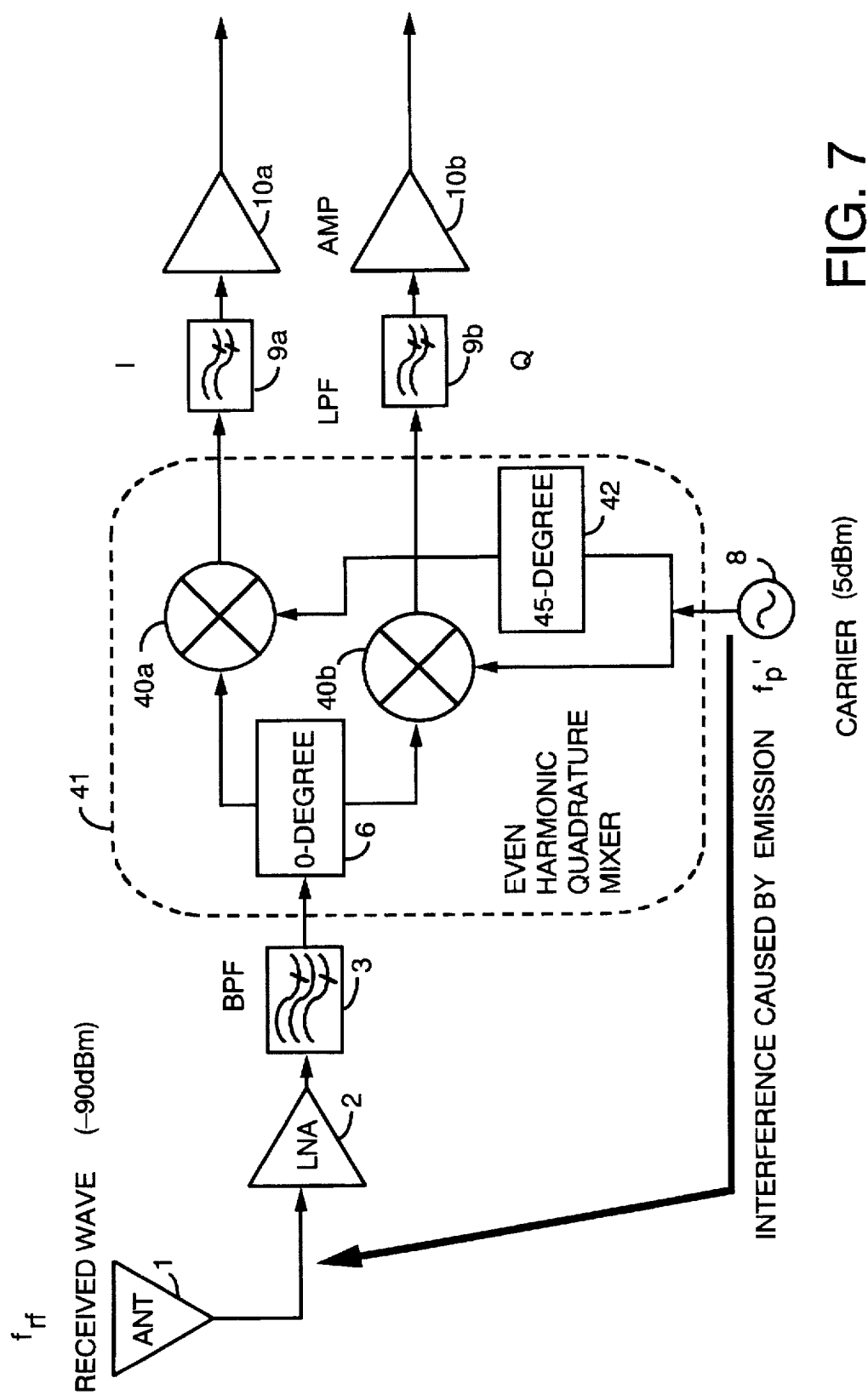
FIG. 7 illustrates an interference that arises in an even harmonic quadrature mixer according to the first embodiment of the present invention.
Figure 8:
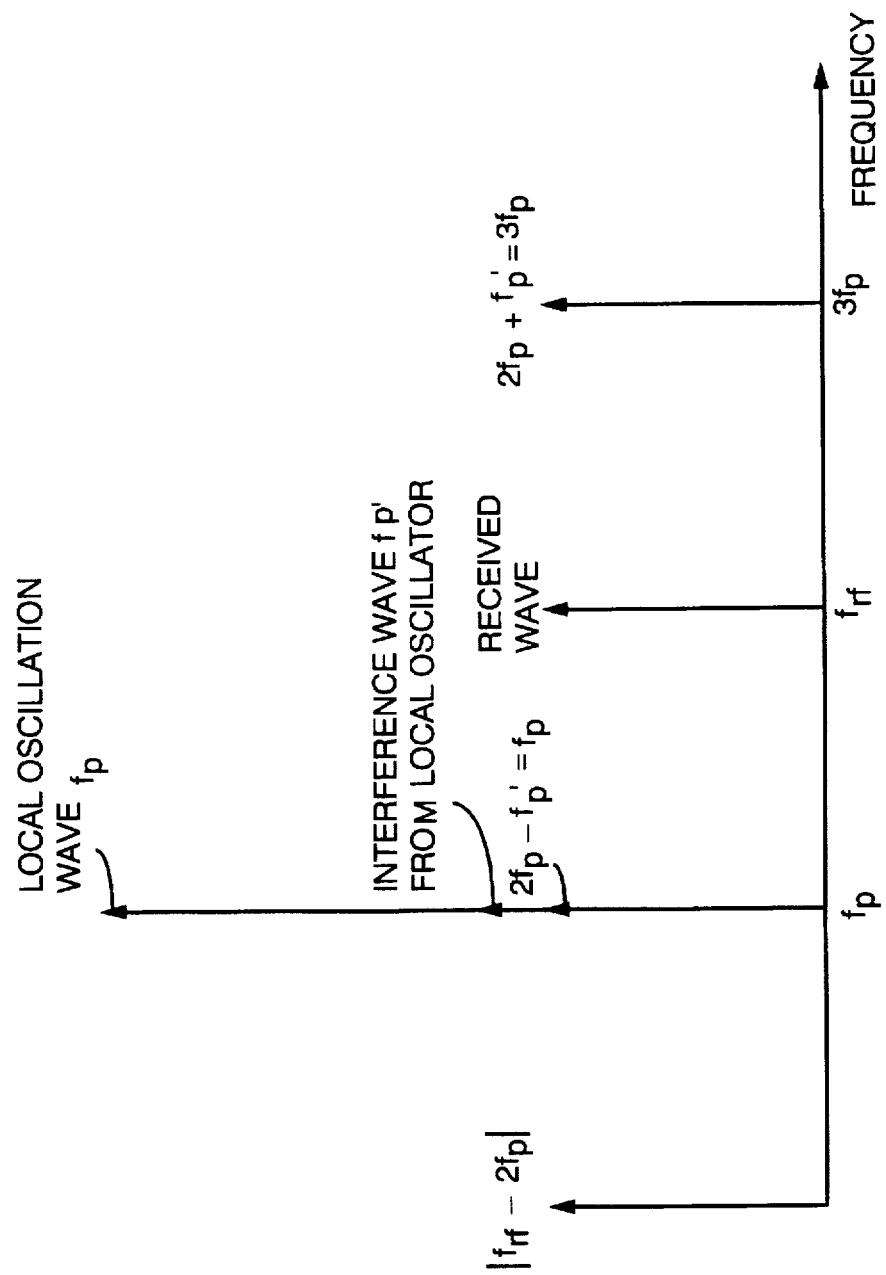
FIG. 8 shows a frequency relationship when an interference wave exists in a receiver according to the first embodiment of the present invention.

Even if an interference caused by emission $f_p'$ ($=f_p$) of LO exists as shown in FIG. 7, the receiver shown in FIG. 1 is barely affected. This is because a received wave outputted from the antenna is mixed in even harmonic quadrature mixer 41 with a signal of frequency $2f_p$ to make the frequency of the mixed wave either $f_p$ ($=2f_p-f_p'$) or $3f_p$ ($=2f_p+f_p'$), which are not outputted to base band. According to the first embodiment, interference is neglected since the interference waves do not contain the base band components.

Figure 9:
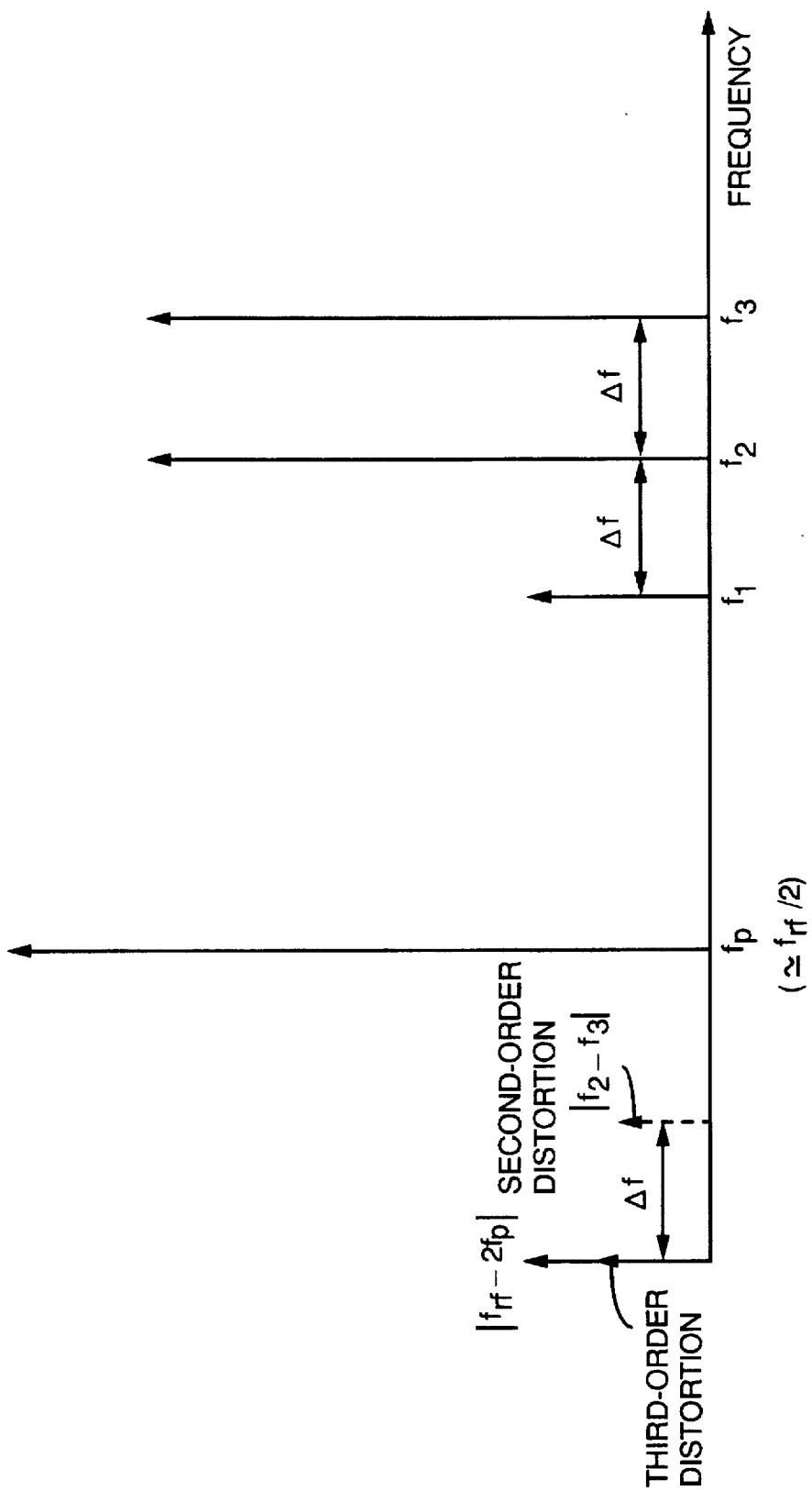
FIG. 9 shows a frequency relationship of distortions in a receiver according to the first embodiment of the present invention.

Principally as is evident from the formula (1), only mixed waves of the odd-order are generated in the receiver of the first embodiment. Accordingly, the second-order distortion as shown in dotted line in FIG. 9, becomes very low. Although the third-order distortion can not be restrained, the level of the second-order distortion is lowered. Therefore, the deterioration in the sensitivity of the receiver is avoidable according to the first embodiment, since.

Although the explanation so far is concerned with an quadrature mixer, the same explanation is applied to a detecting apparatus using a plurality of mixers, and similar effects are obtained therein.

Embodiment 2.

Figure 10:
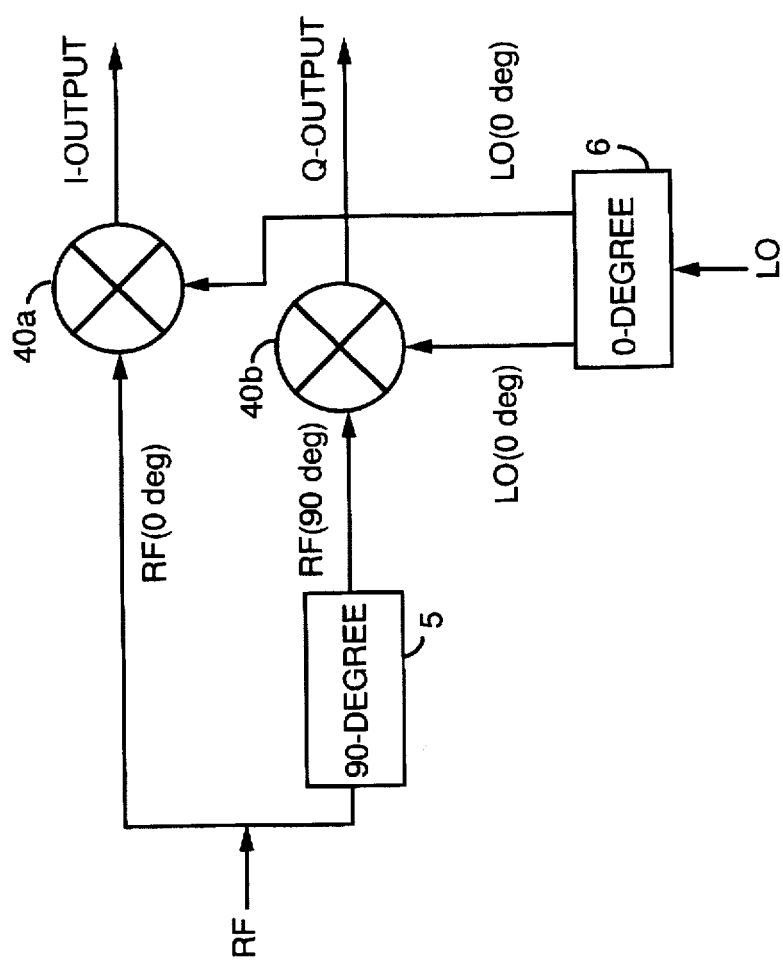
FIG. 10 shows a configuration of an even harmonic quadrature mixer according to a second embodiment of the present invention.

FIG. 10 shows another possible configuration of even harmonic quadrature mixer 41 according to a second embodiment, instead of that shown in FIG. 2 of a first embodiment.

In FIG. 10, a received signal RF is shifted by 90 deg in 90-degree shifter 5. Local oscillation wave LO from local oscillator 8 is distributed into two signals, namely LO (0 deg) and LO (0 deg), which are the same in both phase and magnitude by zero-degree distributor 6.

Even harmonic mixer 40a mixes a received signal RF (0 deg) with one of the double frequency of local oscillation waves LO (0 deg) to output a base band I-signal (I-output). Even harmonic mixer 40b mixes a received signal RF (90 deg) with another double frequency of local oscillation waves LO (0 deg) to output another base band Q-signal (Q-output).

In this second embodiment, similar effects as described in the first embodiment are also obtained.

Embodiment 3.

Figure 14:
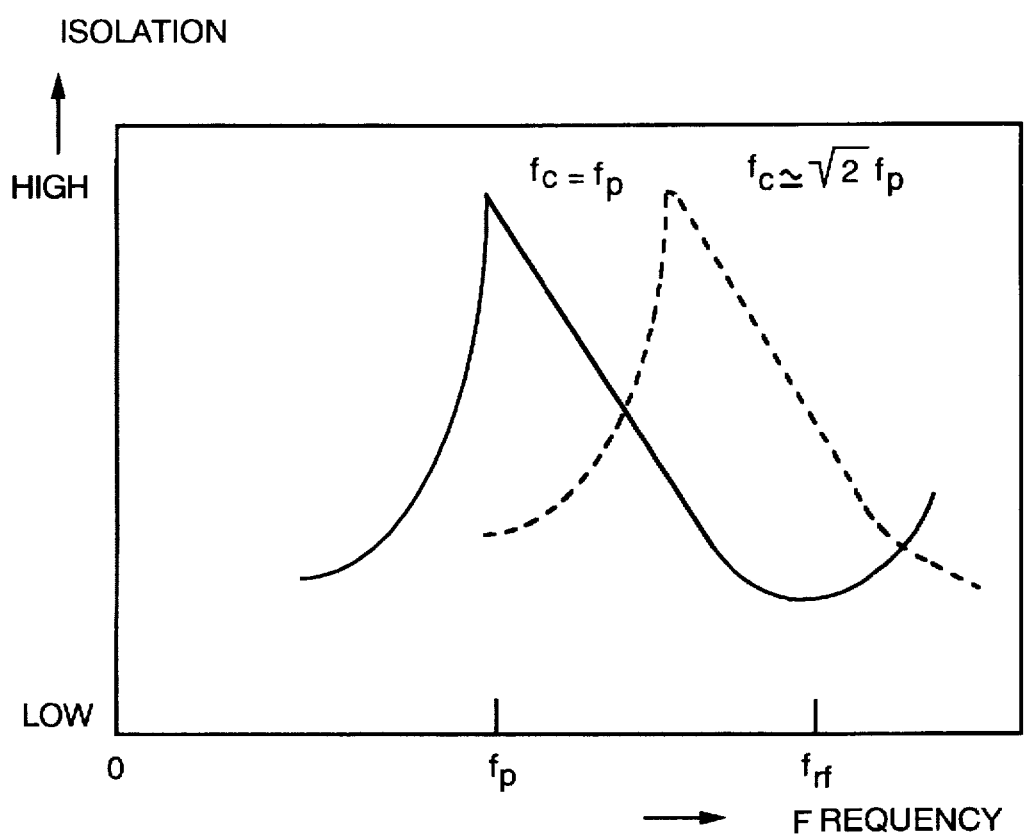
FIG. 14 shows an isolation characteristic of distributor in an even harmonic quadrature mixer according to the third embodiment of the present invention.

According to a third embodiment, even harmonic quadrature mixer 41 comprises a distributor for RF signals and distributor for LO signals, in which the center frequency of the RF distributor and both or either one of the center frequency of the LO distributor are set between $f_{rf}$ and $f_p$ (for example, $f_c \approx \sqrt{2} fp$), as shown by the dotted-line curve in FIG. 14.

The meaning of the center frequencies which are set in the distributor is explained as follows. Although the reception performance according to the first and second embodiments can be improved using even harmonic quadrature mixer 41 which comprises even harmonic mixers 40a, 40b, it causes unexpected problems because $f_p$ is about half of $f_{rf}$.

Figure 11:
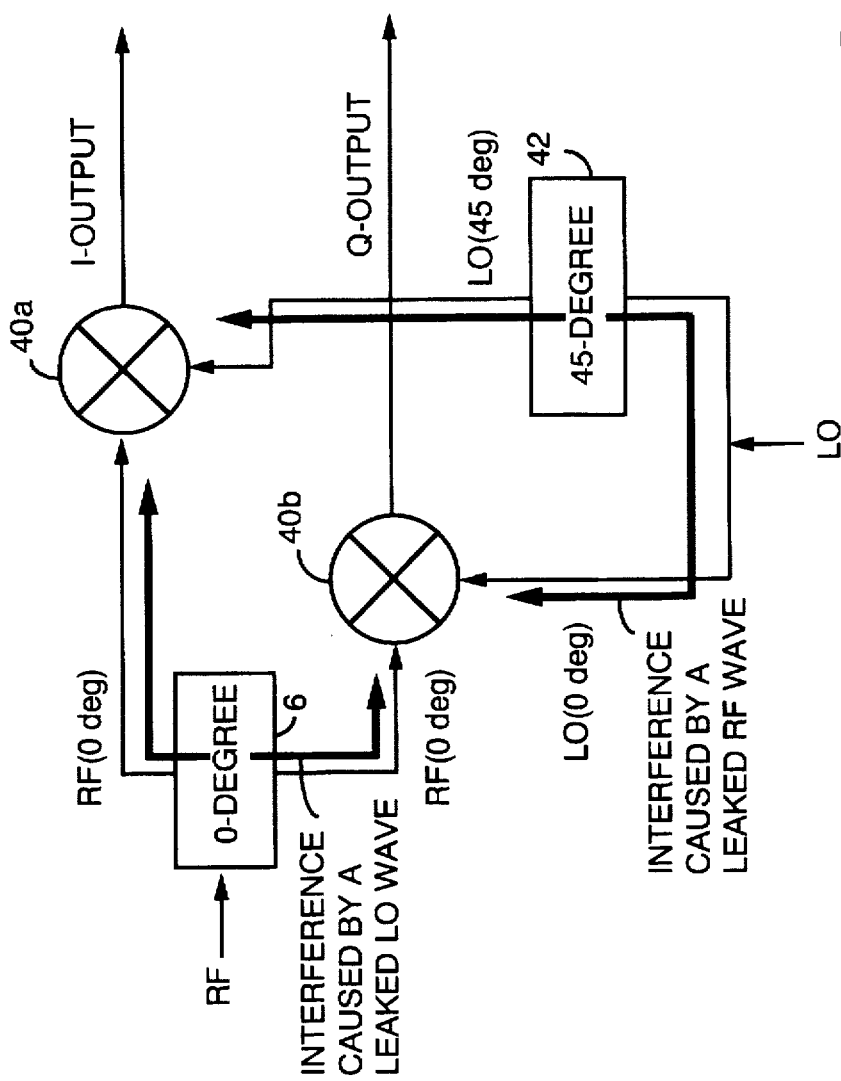
FIG. 11 illustrates an interference that arises in an even harmonic quadrature mixer according to a third embodiment.
Figure 12:
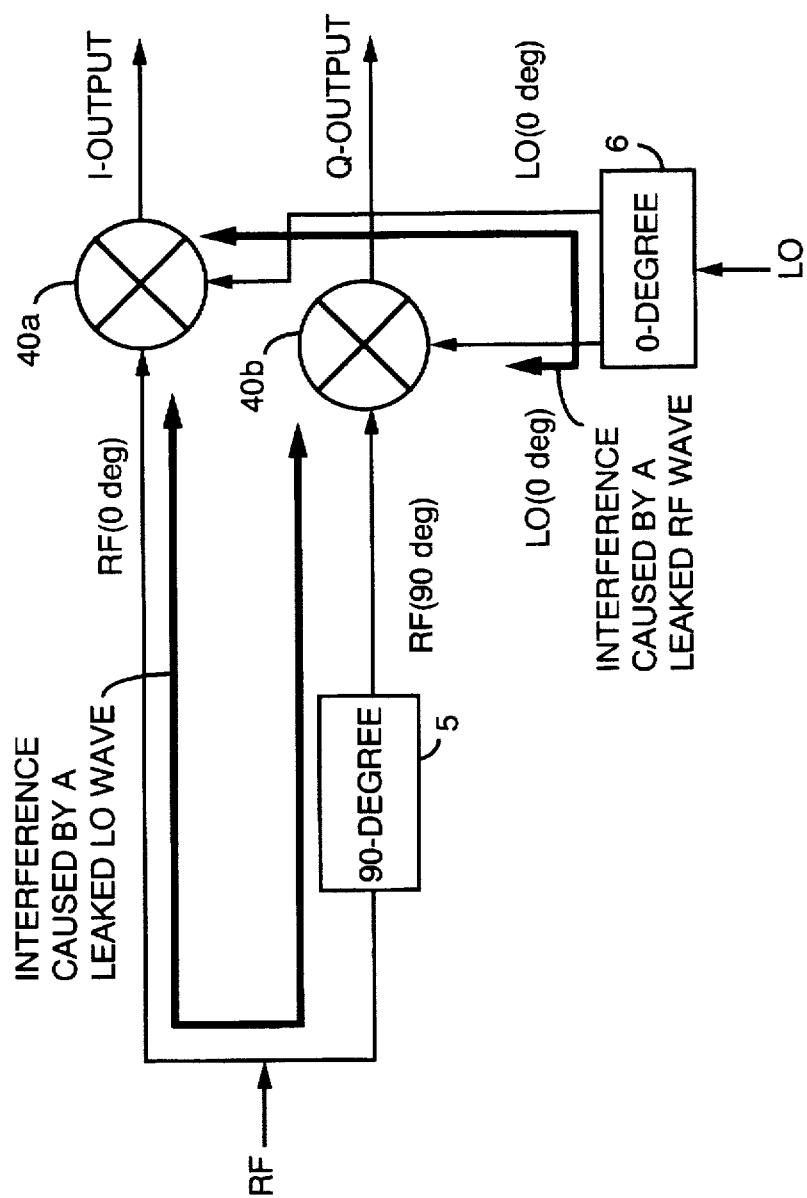
FIG. 12 illustrates an interference that arises in an even harmonic quadrature mixer according to the third embodiment.

More precisely, if there is a leak between the terminals of even harmonic mixers 40a, 40b as shown in FIG. 11 and FIG. 12, interferences are caused between the two mixers 40a and 40b and vector errors are liable to increase. In a conventional quadrature mixer, since $f_p$ and $f_{rf}$ are almost the same frequency, the center frequency of distributors for RF and the center frequency of distributors for LO are the same and thus the terminals are satisfactorily isolated from each other in each distributor.

Figure 13:
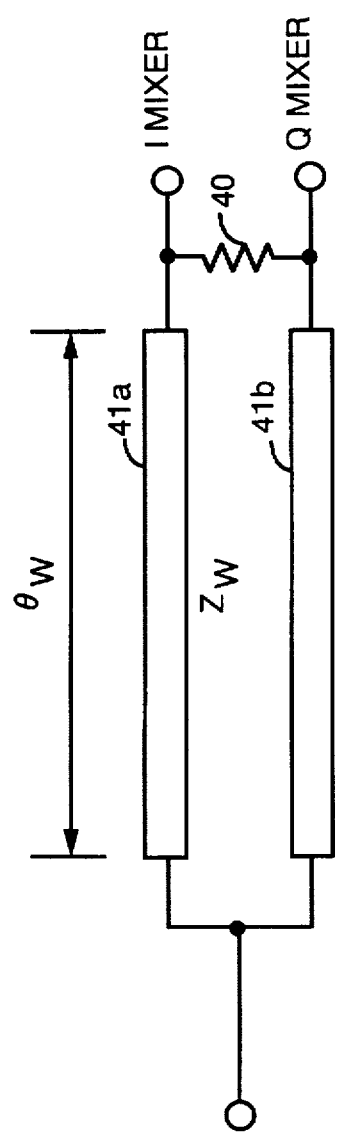
FIG. 13 shows a configuration of an Wilkinson's distributor.

However, in case of even harmonic quadrature mixer 41 of the first and second embodiments, since RF frequency $f_{rf}$ is twice as large as LO frequency $f_p$, neither RF distributor nor LO distributor can not be completely isolated from each other between respective terminals. For example, if the center frequency in the Wilkinson's distributor shown in FIG. 13 is assumed to be $f_p$, the isolation between the terminals in the distributor is barely obtained at frequency $2f_p$, namely $f_{rf}$, since this distributor has a characteristic shown by the solid-line curve in FIG. 14. Accordingly, the double frequency ($2f_p$) of local oscillation waves interferes each other between the two even harmonic mixers 40a and 40b, which results in extreme deterioration of quadrature accuracy.

According to the third embodiment of the present invention, the center frequency of RF distributor and either one or both of the center frequencies of LO distributor are determined between $f_{rf}$ and $f_p$ ($f_c \approx \sqrt{2} fp$) as shown by the dotted-line curve in FIG. 14. Therefore, the isolation characteristic is improved at frequency $2f_p$, namely $f_{rf}$. Therefore, the complete isolation in each distributor is obtained at frequency $f_p$ and $f_{rf}$ respectively.

Accordingly, since the center frequency of RF distributor and either one or both of the center frequencies of LO distributor are determined between $f_{rf}$ and $f_p$ in the third embodiment, the isolation in each RF and LO distributor is enhanced for restraining deterioration caused by vector errors.

Embodiment 4.

The isolation is enhanced by adjusting center frequency of the distributor appropriately in the third embodiments. According to a fourth embodiment, the isolation is enhanced by buffer amplifiers 43a, 43b equipped between RF distributor and even harmonic mixers 40a, 40b by their unidirectional characteristic as shown in FIG. 15 and FIG. 16.

Figure 15:
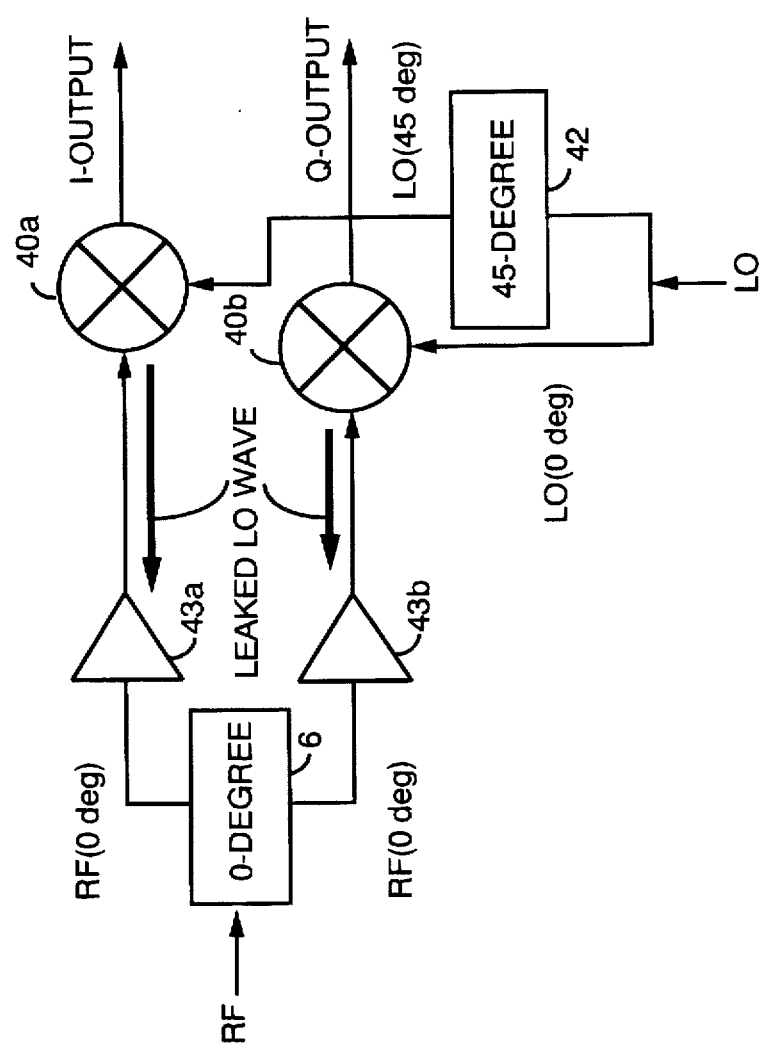
FIG. 15 shows a configuration of an even harmonic quadrature mixer according to a fourth embodiment of the present invention.

Even harmonic quadrature mixer 41 in FIG. 15 further comprises two buffer amplifiers 43a, 43b which are added to the even harmonic quadrature mixer of FIG. 2. The received signal RF, having divided into two signals, is inputted to these buffer amplifiers 43a, 43b to be amplified. Each output from buffer amplifiers 43a, 43b is provided with even harmonic mixer 40a and 40b, respectively. In even harmonic quadrature mixer 41 of FIG. 15, the local oscillation waves, which are leaked from even harmonic mixers 40a, 40b, are prevented from flowing backward to distributor 6 by buffer amplifiers 43a, 43b.

Figure 16:
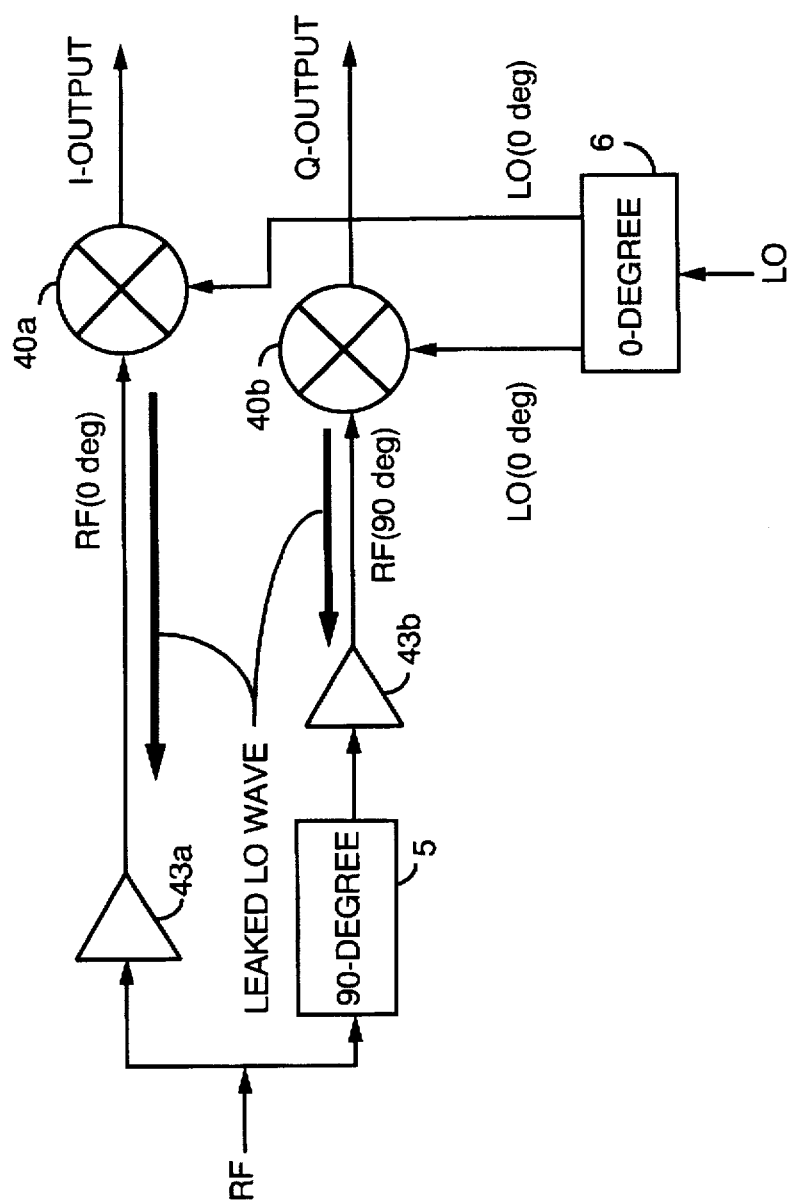
FIG. 16 shows another configuration of an even harmonic quadrature mixer according to the fourth embodiment of the present invention.

Even harmonic quadrature mixer 41 in FIG. 16 further comprises two buffer amplifiers 43a, 43b which are added to the even harmonic quadrature mixer of FIG. 10. The received signal RF is divided into two signals and inputted to these buffer amplifiers 43a, 43b to be amplified. Each output from buffer amplifiers 43a, 43b is provided with even harmonic mixer 40a and 40b, respectively. In even harmonic quadrature mixer 41 of FIG. 16, the local oscillation waves, which are leaked from even harmonic mixers 40a, 40b, are prevented from flowing backward to distributor 6 by buffer amplifiers 43a, 43b.

According to the fourth embodiment, the isolation between RF and LO distributors is enhanced, and the deterioration caused by vector errors is decreased, since the buffer amplifiers 43a, 43b prevent the backward flows of leaked local oscillation waves from even harmonic mixers 40a, 40b, respectively.

Embodiment 5.

According to the fourth embodiment, the isolation is enhanced by equipping buffer amplifiers 43a, 43b between RF distributor and even harmonic mixers 40a, 40b which prevent backward flows of the leaks. In a fifth embodiment, the isolation is enhanced by buffer amplifiers 43a, 43b equipped between LO distributor and even harmonic mixers 40a, 40b, which prevent backward flows of the leak. In the fifth embodiment, the same effects as described in the fourth embodiment are obtained.

Embodiment 6.

Figure 17:
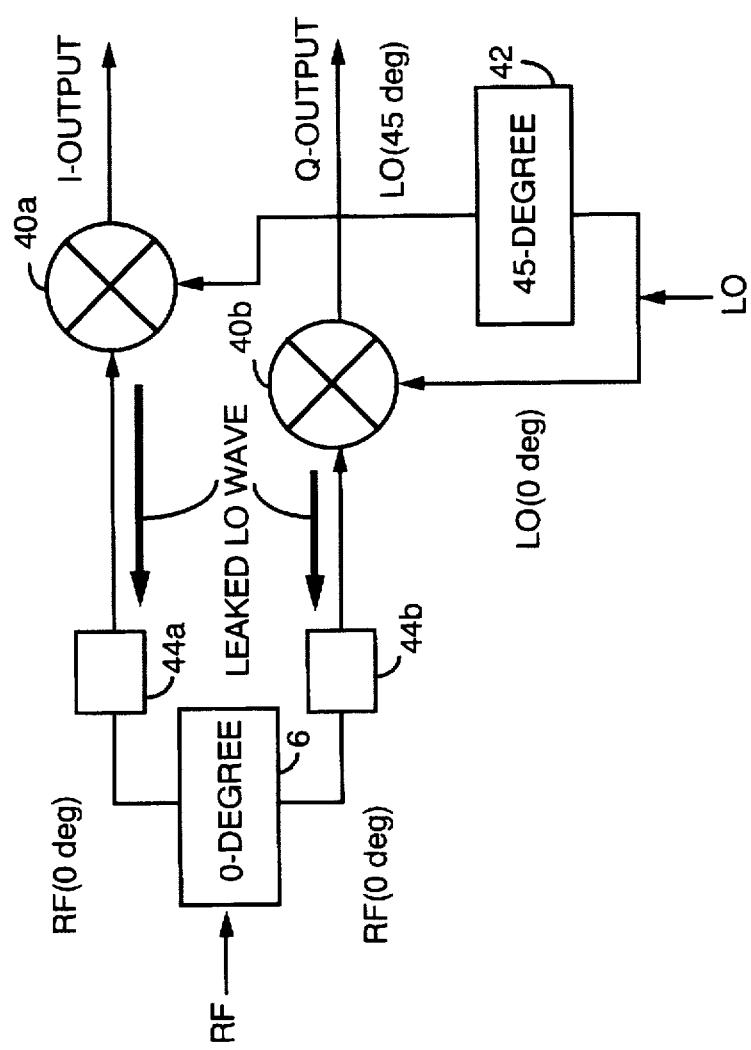
FIG. 17 shows a configuration of an even harmonic quadrature mixer according to a sixth embodiment of the present invention.
Figure 18:
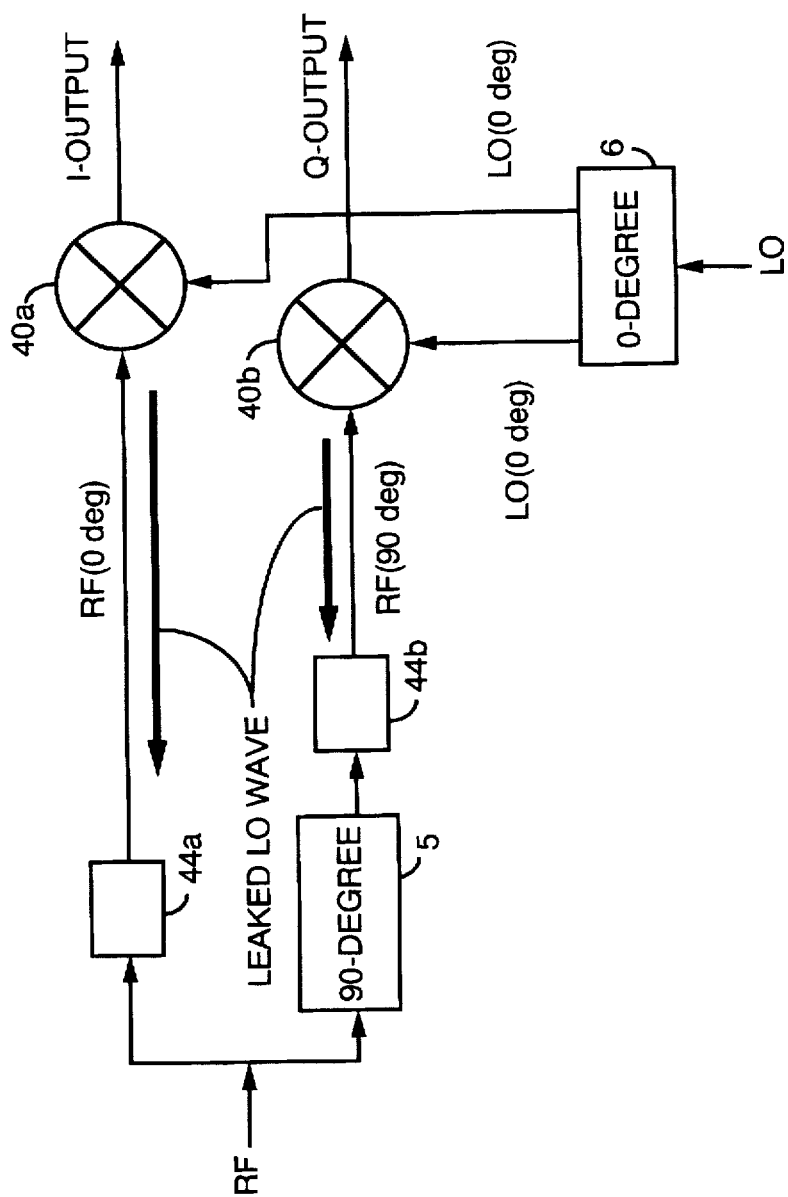
FIG. 18 shows another configuration of an even harmonic quadrature mixer according to the sixth embodiment of the present invention.

According to the fourth or fifth embodiments, the isolation is enhanced by equipping buffer amplifiers 43a, 43b between RF distributor and even harmonic mixers 40a, 40b, or between LO distributor and even harmonic mixers 40a, 40b, which prevent backward flows of the leaks. In a sixth embodiment, two filters 44a, 44b are equipped between RF distributor and even harmonic mixers 40a, 40b, as shown in FIG. 17 and FIG. 18. Although filters 44a, 44b pass RF signals, the local oscillation waves LO are rejected by these filters. Thereby, the isolation is enhanced at the RF side by rejecting LO waves. Therefore, in the sixth embodiment, the same effects as described in the fourth or fifth embodiment are obtained.

Embodiment 7.

Figure 19:
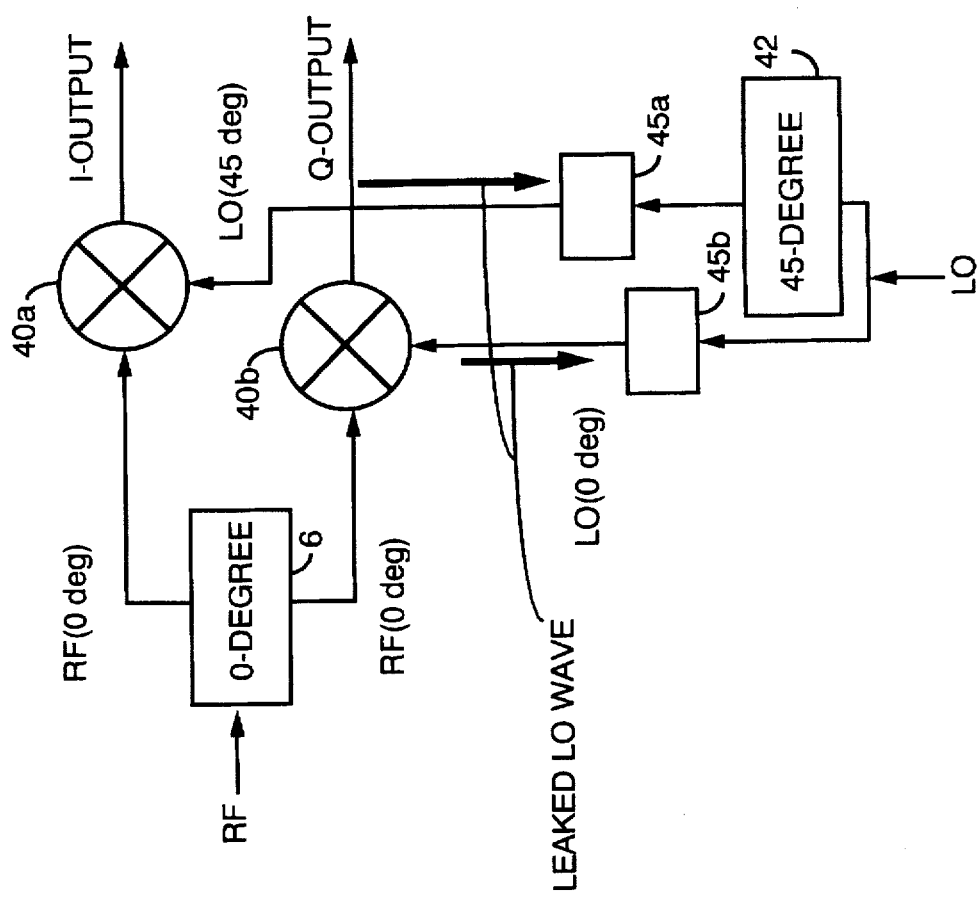
FIG. 19 shows a configuration of an even harmonic quadrature mixer according to a seventh embodiment of the present invention.
Figure 20:
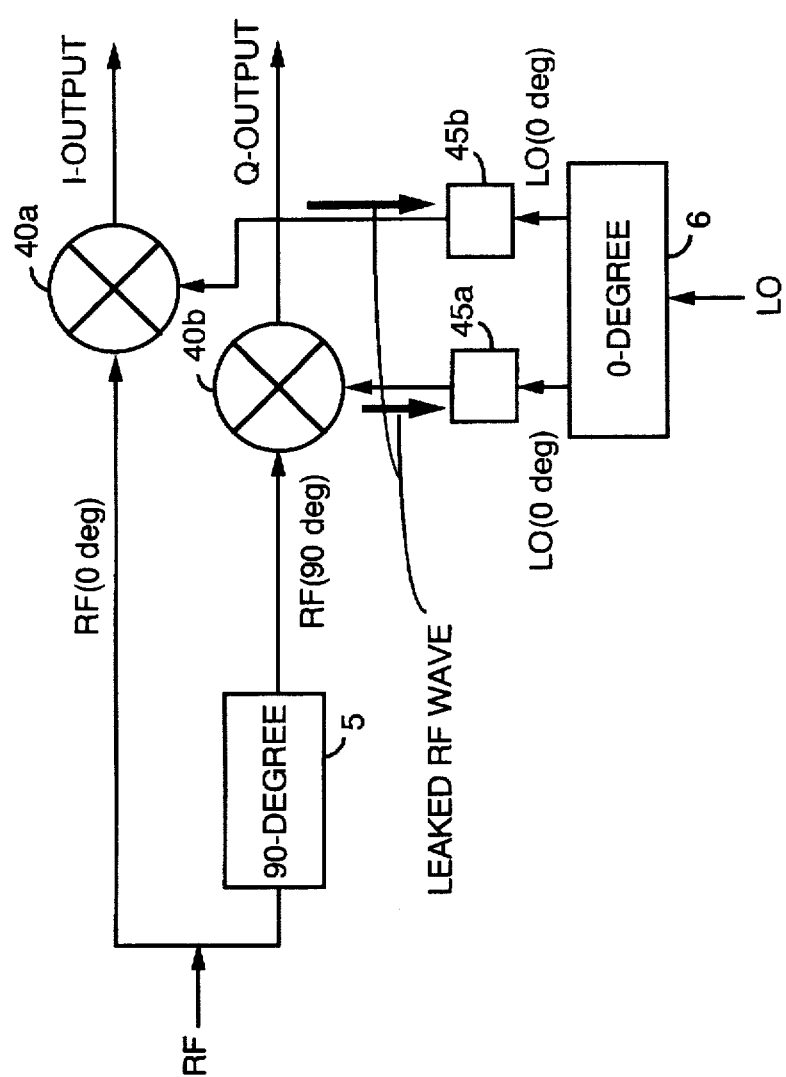
FIG. 20 shows another configuration of an even harmonic quadrature mixer according to the seventh embodiment of the present invention.

According to the sixth embodiment, the isolation is enhanced by equipping filters 44a, 44b between RF distributor and even harmonic mixers 40a, 40b which prevent backward flows of LO waves. In a seventh embodiment, two filters 45a, 45b are equipped between LO and 45-degree phase shifter 42 and even harmonic mixers 40a, 40b, respectively, as shown in FIG. 19 and FIG. 20. Although the local oscillation waves pass through filters 45a, 45b. RF signals are blocked by these filters. Thereby, the isolation is enhanced at the LO side by rejecting RF waves. Therefore, in the seventh embodiment, the same effects as described in the fourth or fifth embodiment are obtained.

Embodiment 8.

Figure 21:
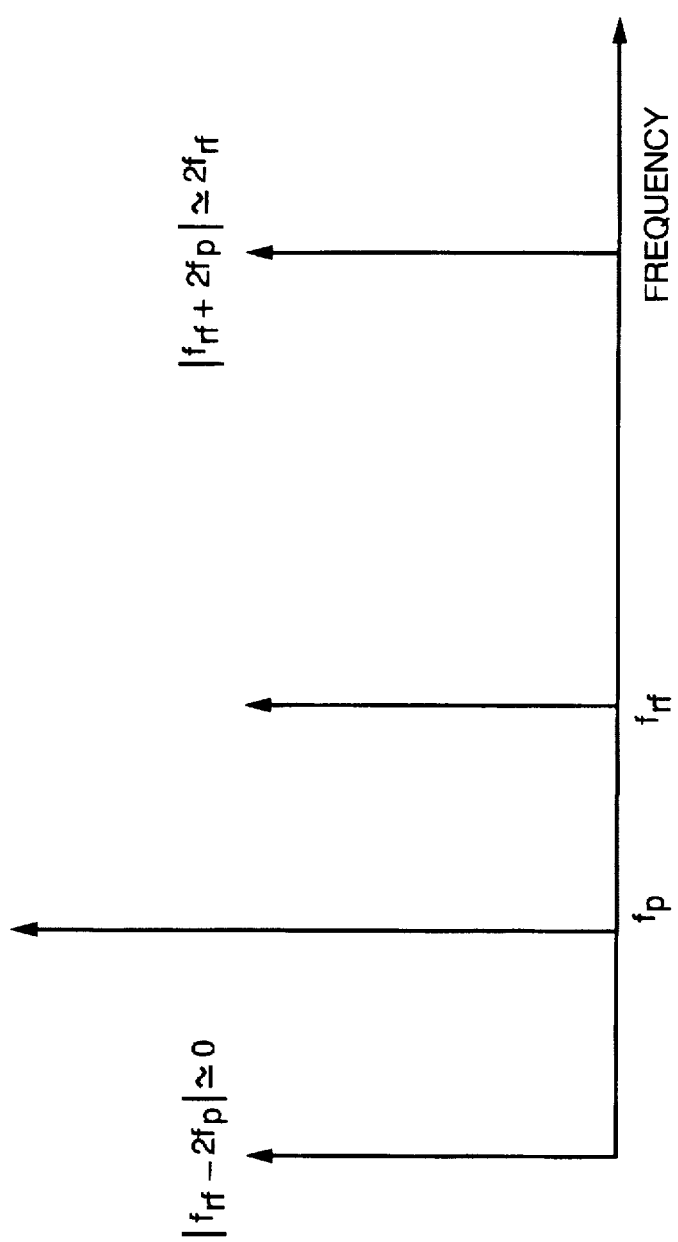
FIG. 21 shows a frequency relationship of a receiver according to an eighth embodiment of the present invention.

FIG. 21 shows a frequency relationship of the quadrature mixer in the above-mentioned embodiments. FIG. 21 shows that the difference frequency $f_{rf}-2f_p$ is very close to the base band, while the sum frequency $f_{rf}+2f_p$ is almost equal to $2f_{rf}$. Both difference frequency $f_{rf}-2f_p$ and sum frequency $f_{rf}+2f_p$ are in the same order having relatively high level. Accordingly, if interferences are caused between even harmonic mixers 40a, 40b, vector errors are liable to increase.

Figure 22:
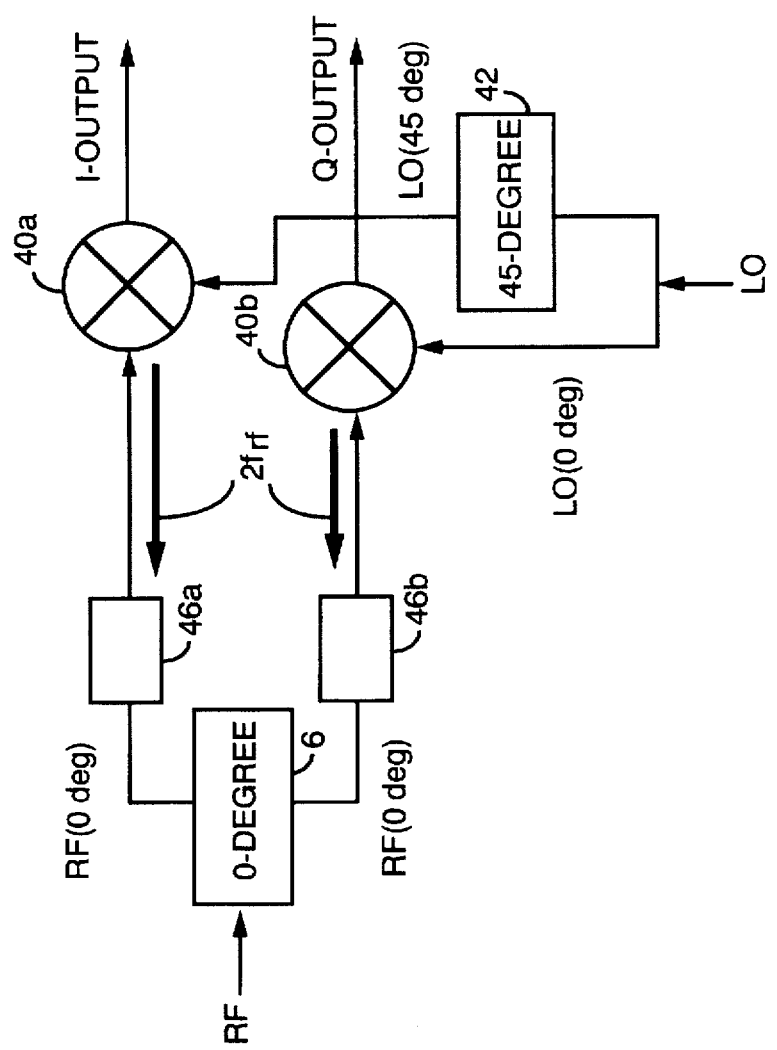
FIG. 22 shows a configuration of an even harmonic quadrature mixer according to the eighth embodiment of the present invention.
Figure 23:
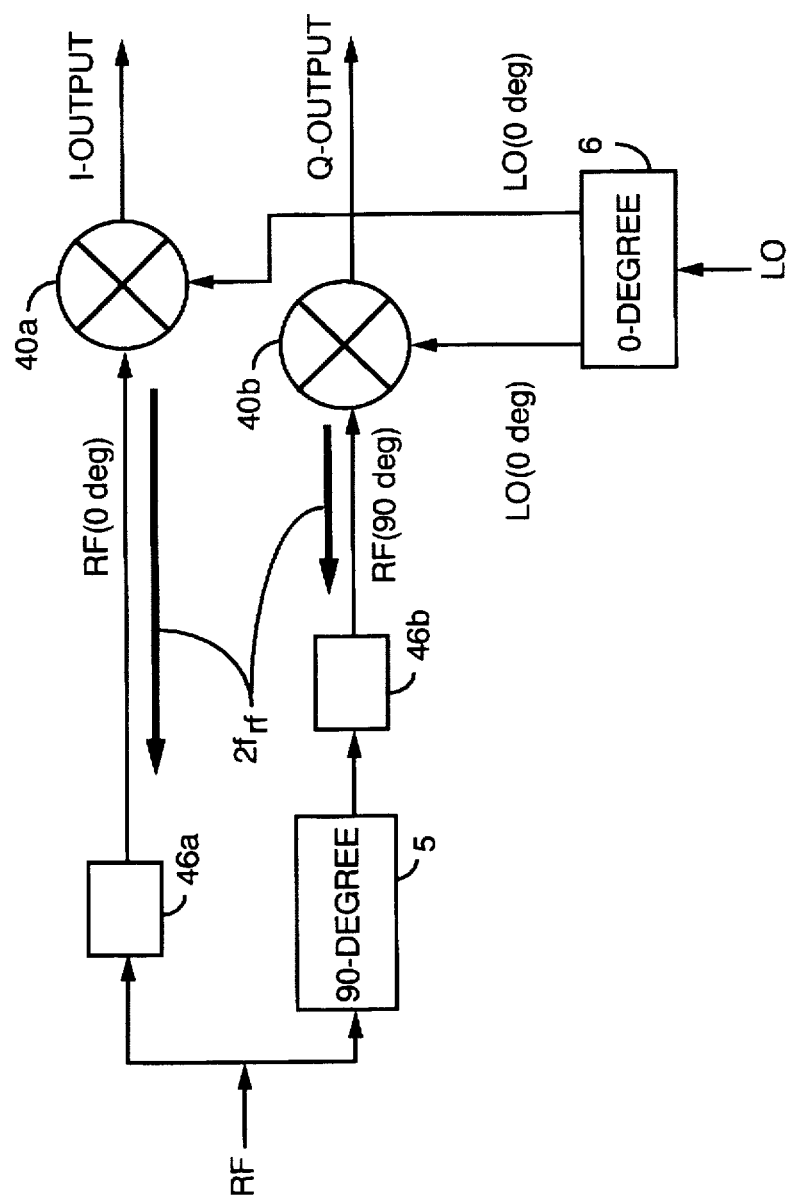
FIG. 23 shows another configuration of an even harmonic quadrature mixer according to the eighth embodiment of the present invention.
Figure 24:
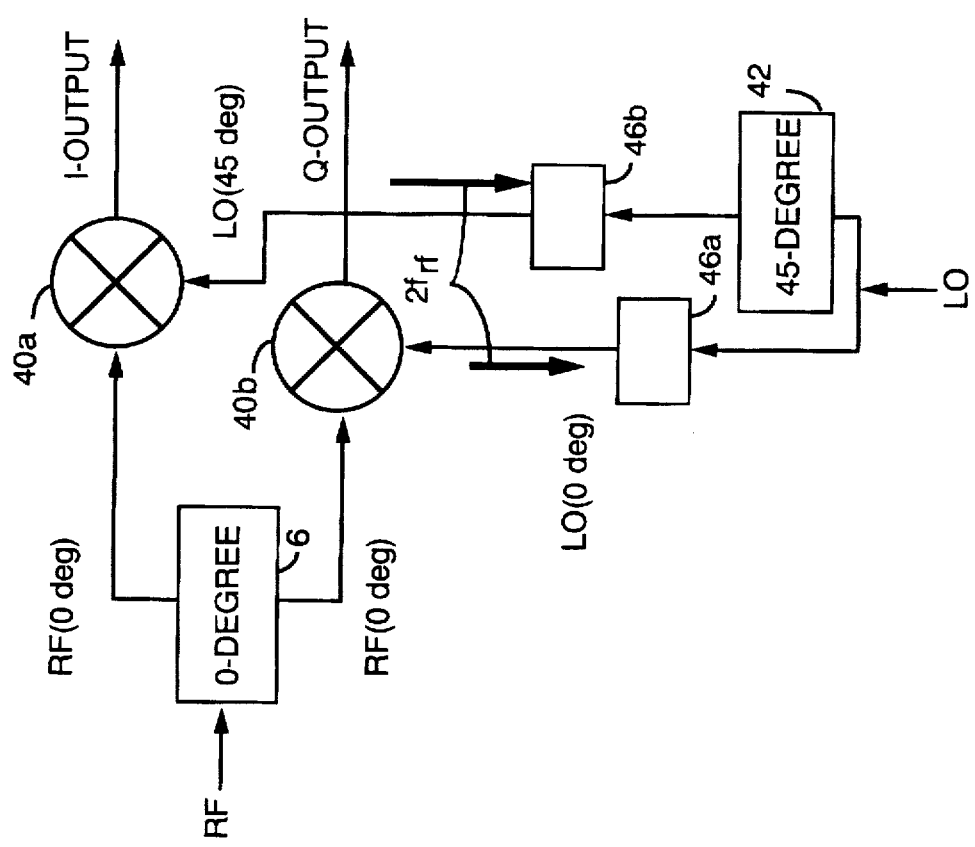
FIG. 24 shows other configuration of an even harmonic quadrature mixer according to the eighth embodiment of the present invention.
Figure 25:
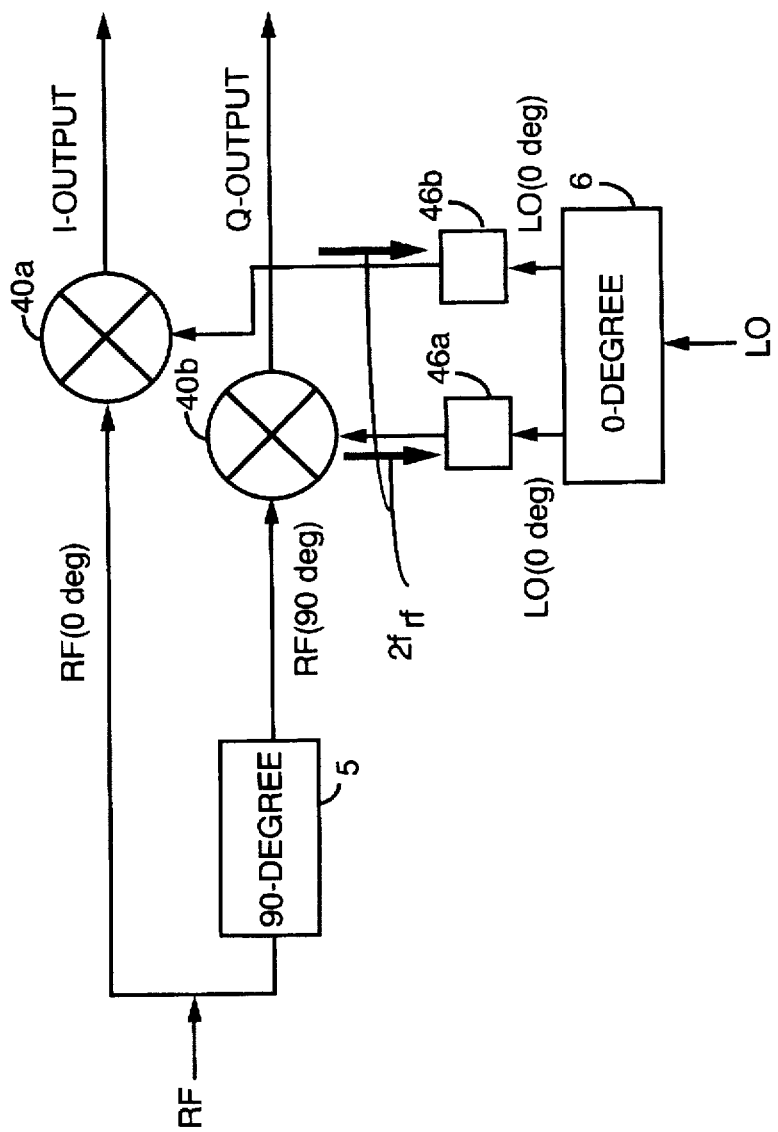
FIG. 25 shows other configuration of an even harmonic quadrature mixer according to the eighth embodiment of the present invention.

In the eighth embodiment,in order to prevent the effects from the sum frequency $f_{rf}+2f_p$ ($\approx 2f_{rf}$), two filters 46a, 46b are further equipped between RF distributor and even harmonic mixers 40a, 40b as shown in FIG. 22 and FIG. 23, or between LO and 45-degree phase shifter 42 and even harmonic mixers 40a, 40b as shown in FIG. 24 and FIG. 25. Filters 46a, 46b block the sum frequency $f_{rf}+2f_p$ ($\approx 2f_{rf}$).

According to the eighth embodiment, the isolation between even harmonic mixers 40a, 40b is enhanced, which prevents deterioration caused by vector errors.

Embodiment 9.

Figure 26:
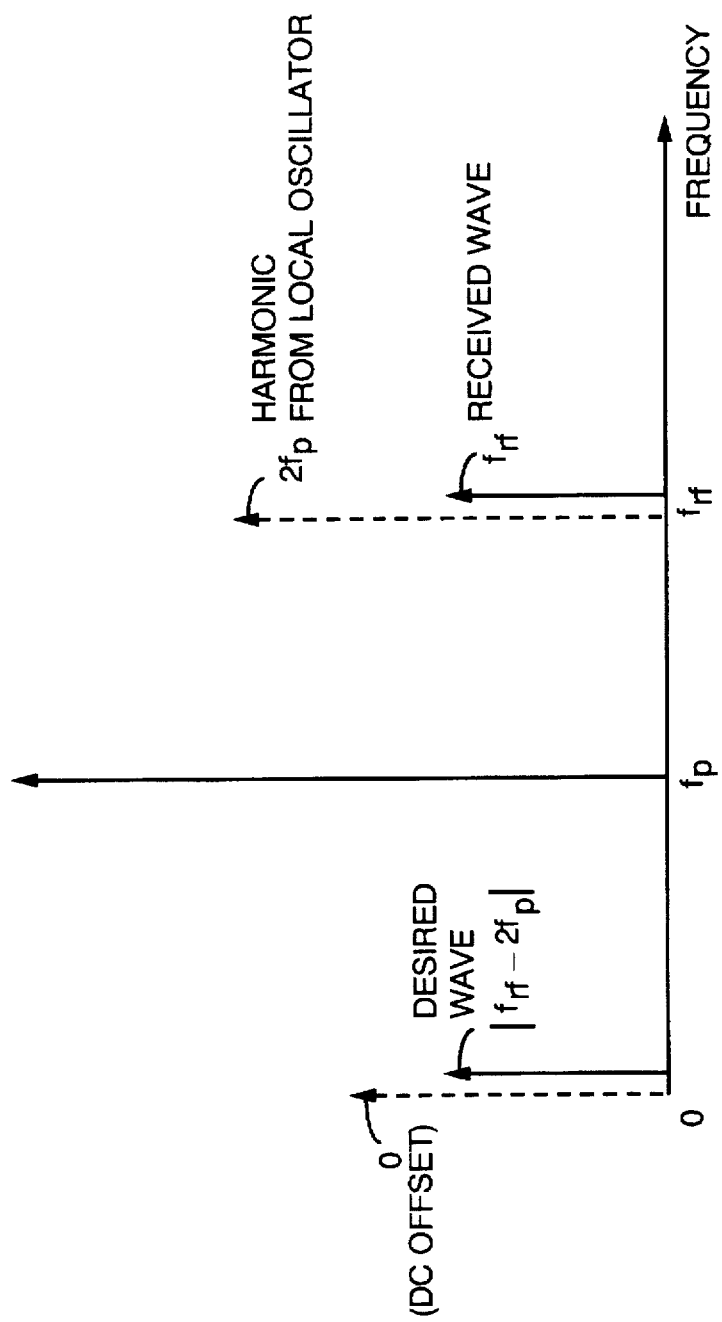
FIG. 26 illustrates an effect of the second harmonic to a local oscillator.
Figure 27:
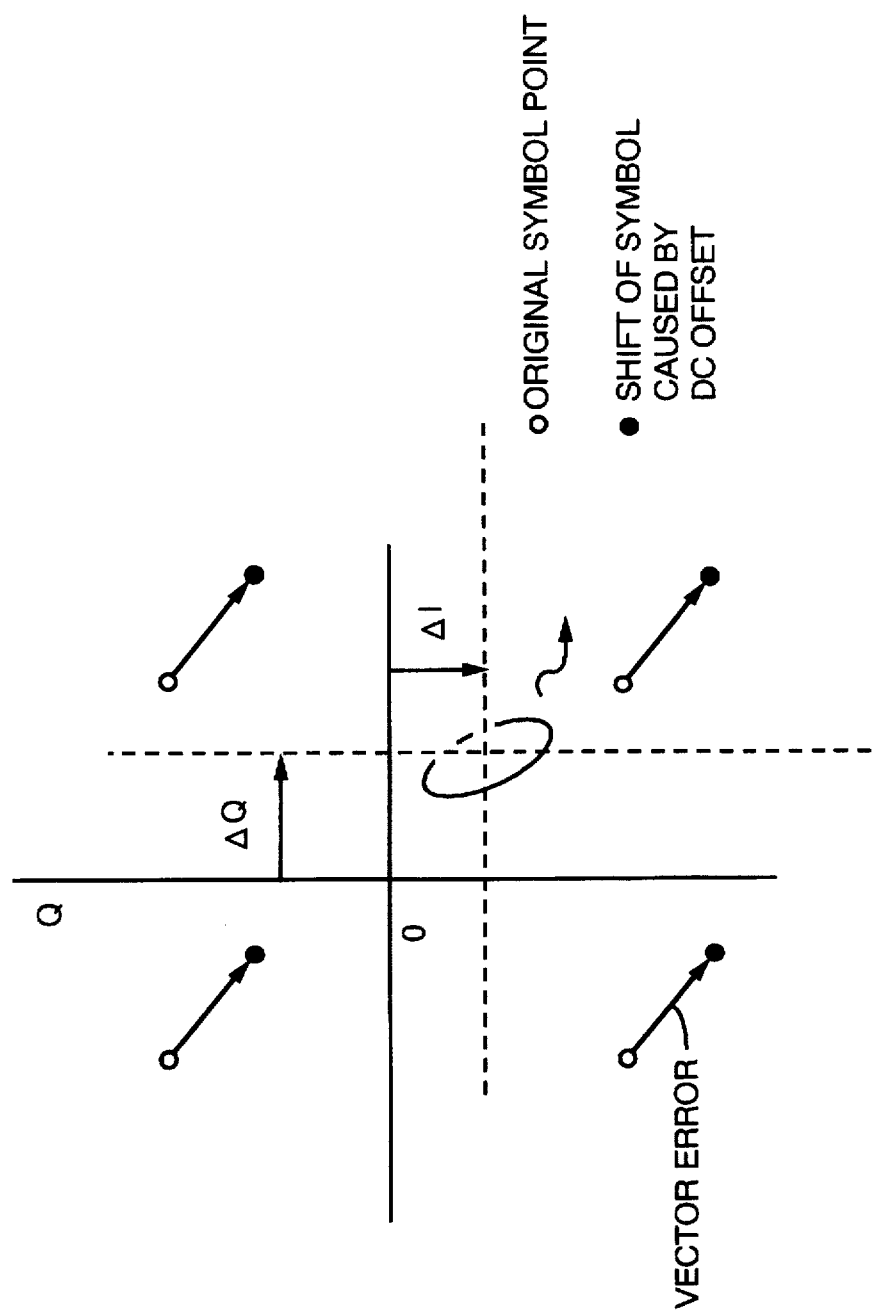
FIG. 27 illustrates another effect of the second harmonic of a local oscillator.

As shown by a dotted line in FIG. 26, harmonic components such as $2f_p$ caused by non-linear operation of local oscillator 8 are contained in the output of local oscillator 8 in addition to $f_p$. If such local oscillation wave $f_p$ is applied to even harmonic quadrature mixer 41, the double frequency of local oscillation waves $2f_p$ interferes RF signal ($f_{rf}$). Furthermore, harmonics contained in the local oscillation wave are detected by even harmonic quadrature mixer 41 and become DC component as shown by the dotted line in FIG. 26. This DC component causes vector errors shown in FIG. 27.

Figure 28:
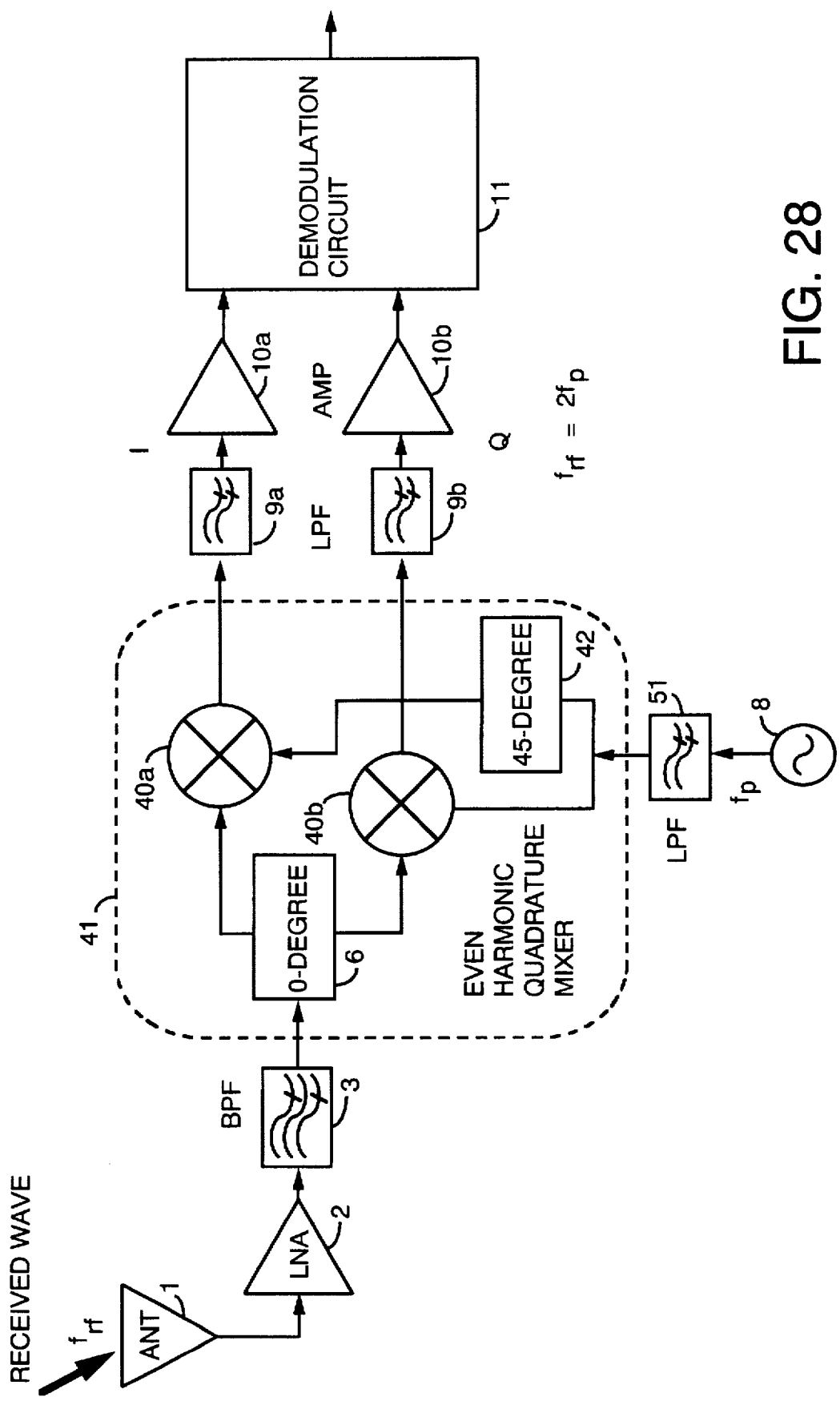
FIG. 28 shows a configuration of a receiver according to a ninth embodiment of the present invention.

According to a ninth embodiment, as shown in FIG. 28 a receiving apparatus further comprises local oscillator filter (LPF) 51 between local oscillator 8 and even harmonic quadrature mixer 41 for restraining a second harmonic contained in local oscillation wave. The filter 51 has a frequency characteristic which passes through the local oscillation waves $f_p$, but blocks RF signals $f_{rf}$ as shown by the dotted line in FIG. 29.

Figure 29:
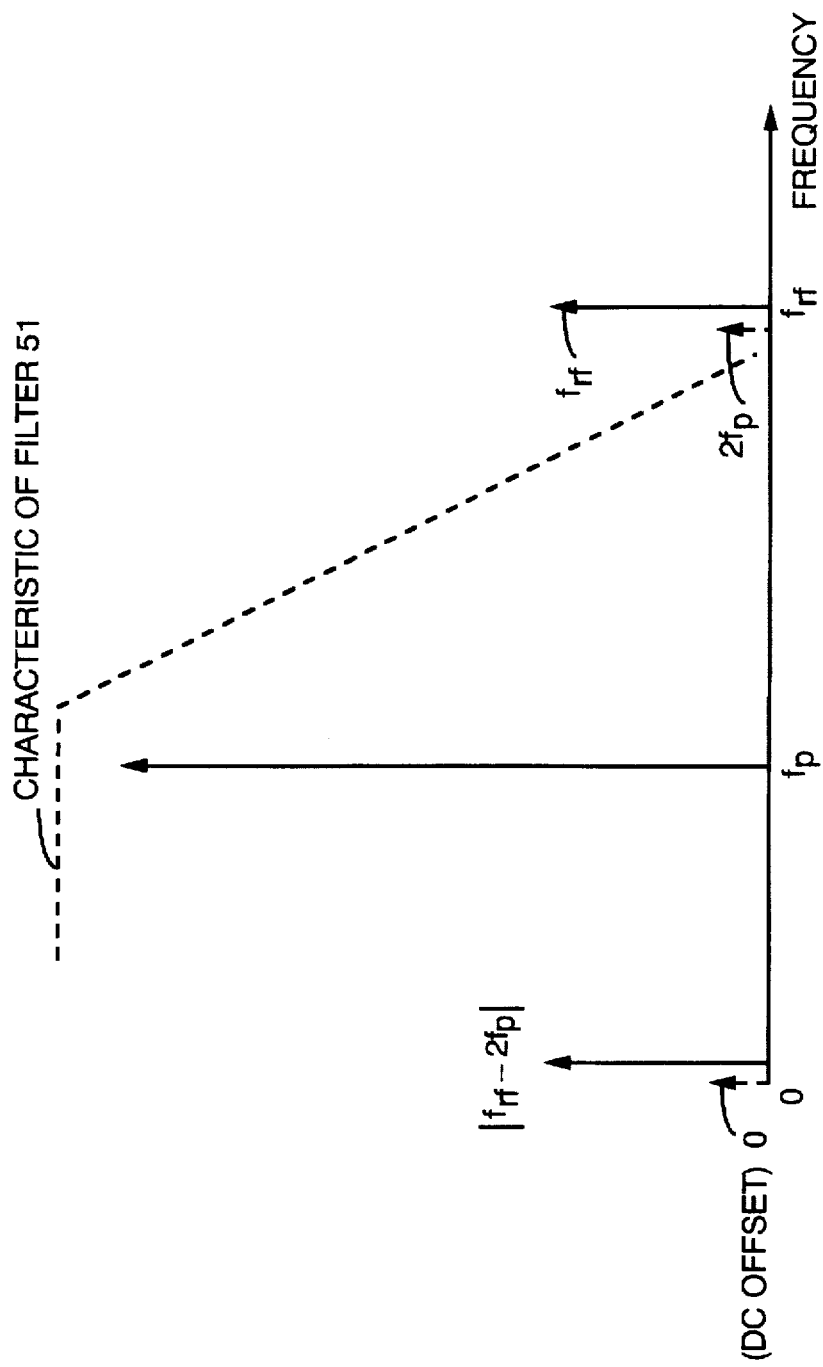
FIG. 29 illustrates an operation of filter for a local oscillator according to the ninth embodiment of the present invention.

This LPF 51 prevents interference waves and vector errors by decreasing the level of the double frequency wave $2f_p$ contained in the local oscillation wave as shown in FIG. 29. Although the above-mentioned description is concerned with a receiving apparatus, the same description may be applicable to a transmitting apparatus. The vector errors are also prevented by restraining carrier wave components generated by double frequency wave $2f_p$.

Embodiment 10.

Figure 30:
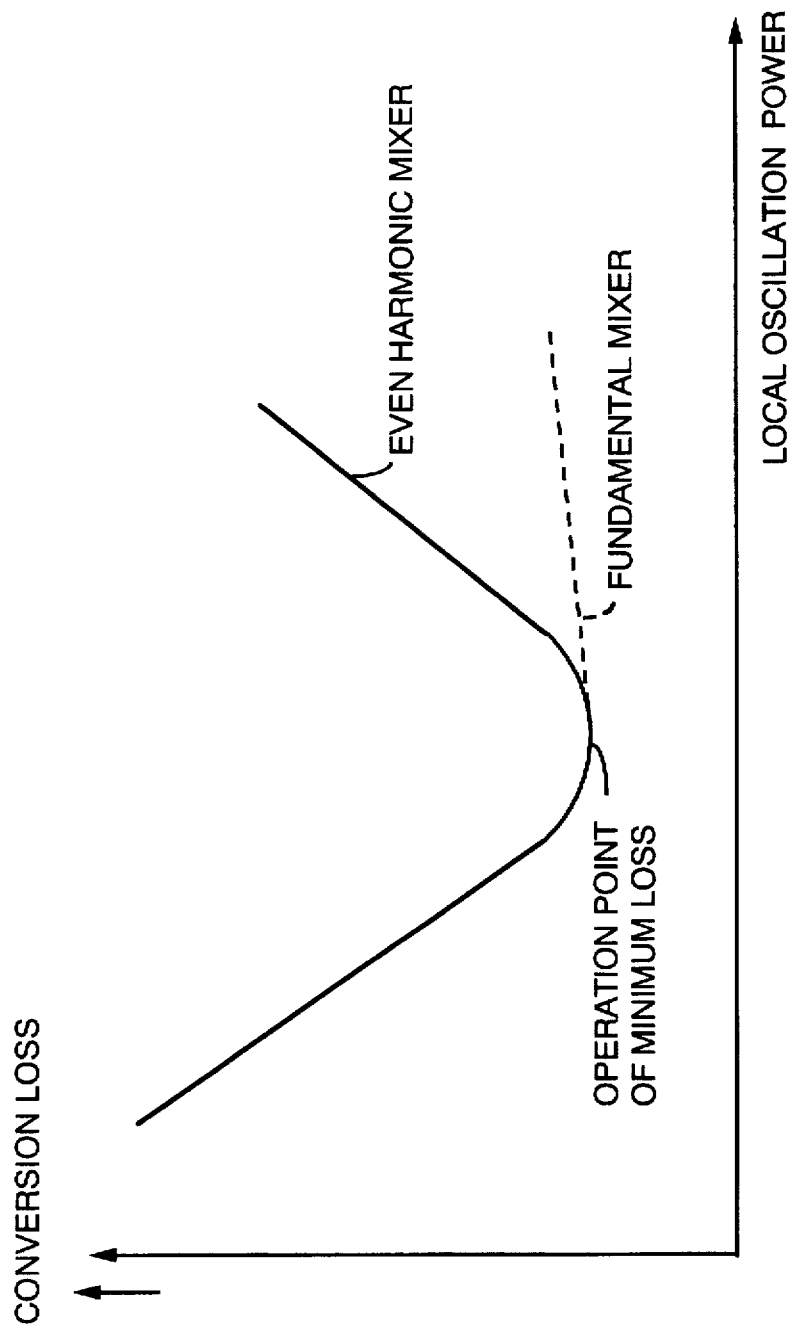
FIG. 30 shows a conversion loss of an even harmonic mixer against an inputted local oscillation power.

FIG. 30 shows relationship between a conversion loss of even harmonic mixers 40a, 40b and a power of local oscillation wave. The conversion loss of a general mixer of the fundamental waves has a saturation characteristic as shown by the dotted line in FIG. 30, which is stable against local oscillation power. On the other hand, the conversion loss of even harmonic mixer 40a, 40b is not stable as shown by a solid line in FIG. 30. This is due to the following reason. In APDP 31, when power of local oscillation wave increases, turn-on period of each mixer diodes 30a, 30b becomes longer and finally both of the mixer diodes turn on at the same time, which breaks the non-linearity of APDP 31. For this reason, if power of local oscillation wave fluctuates due to temperature changes, the gain of receiving apparatus greatly varies.

Figure 31:
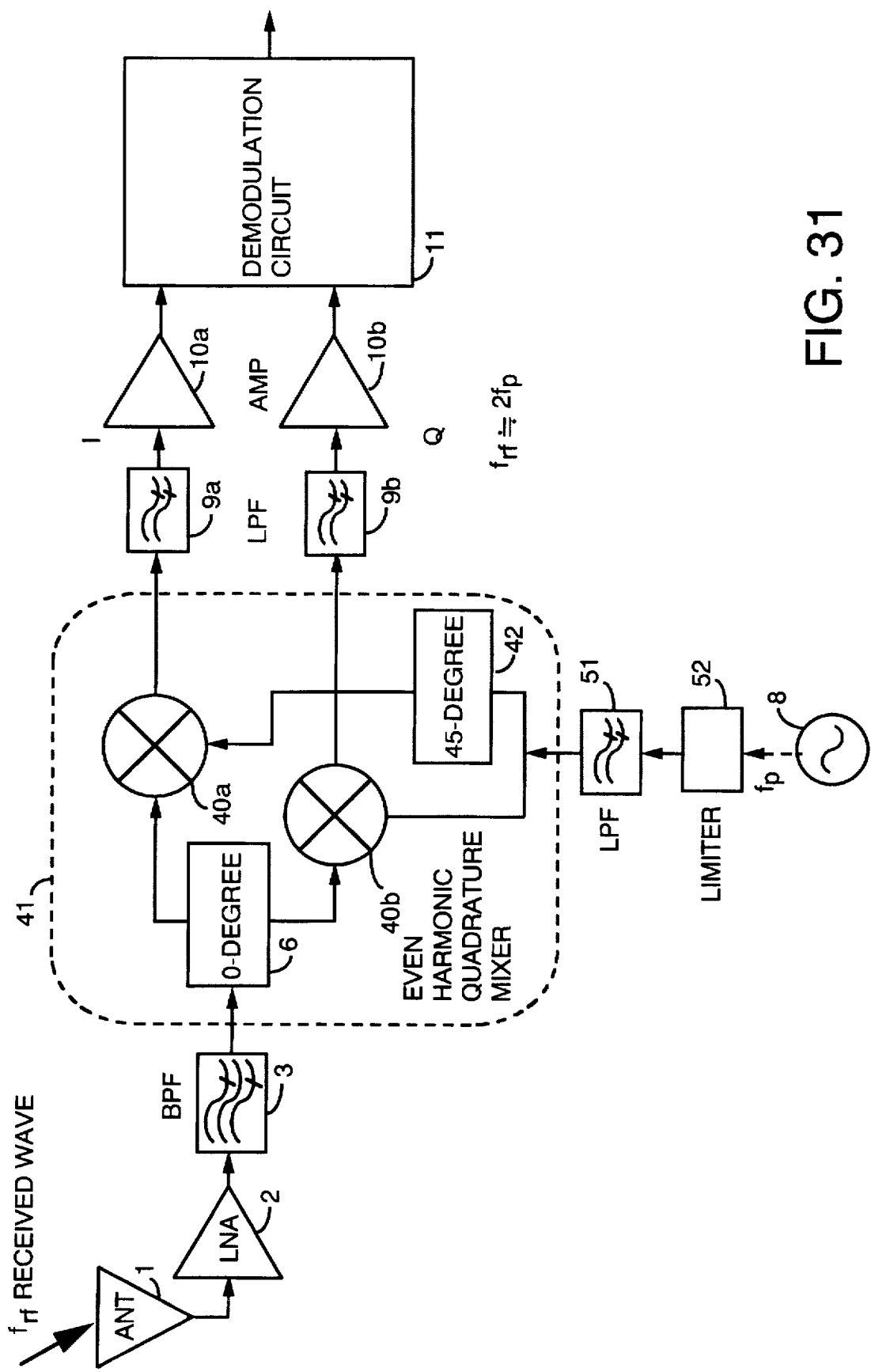
FIG. 31 shows a configuration of a receiver according to a tenth embodiment of the present invention.
Figure 32:
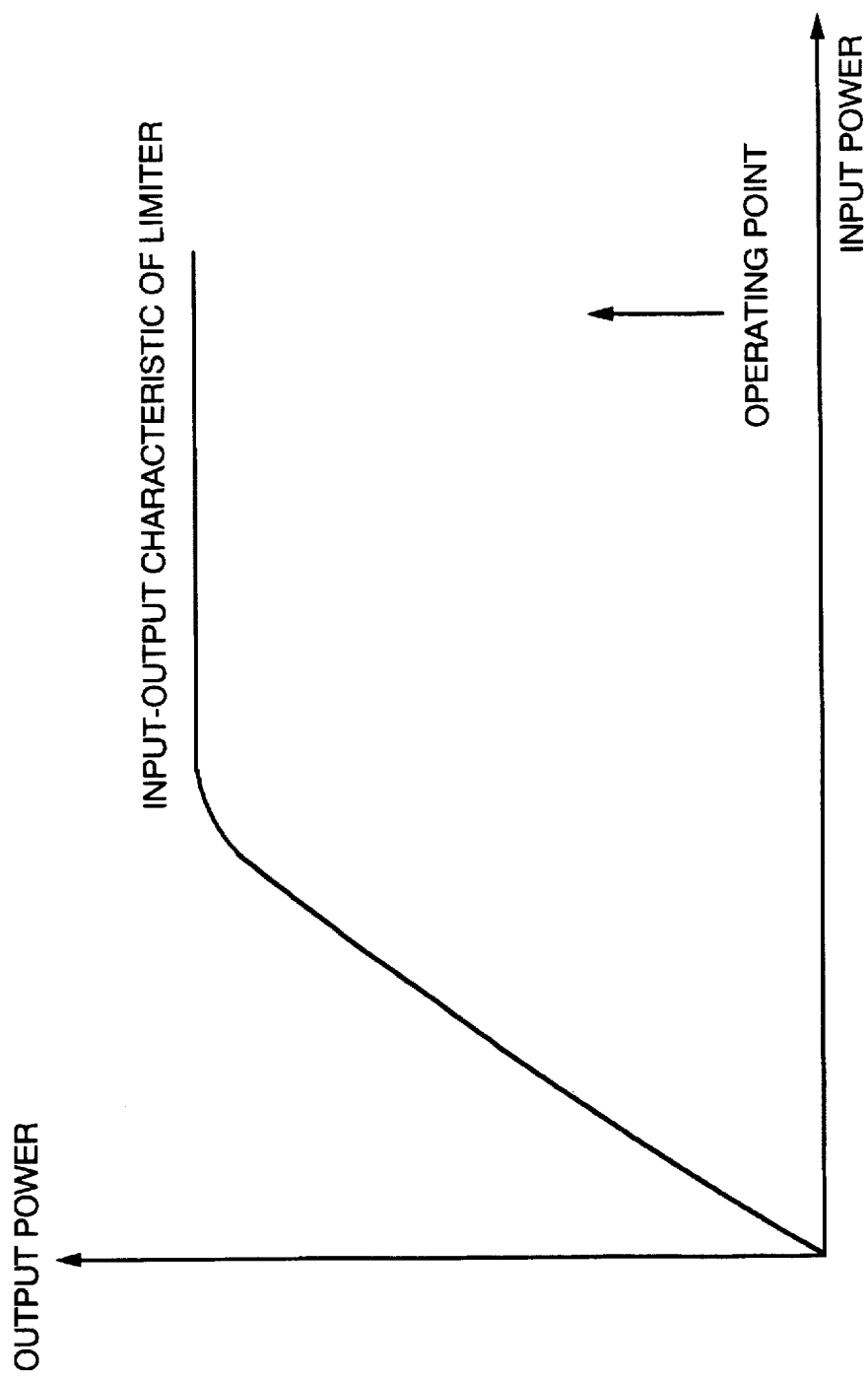
FIG. 32 shows a characteristic of a limiter according to the tenth embodiment of the present invention.
Figure 33:
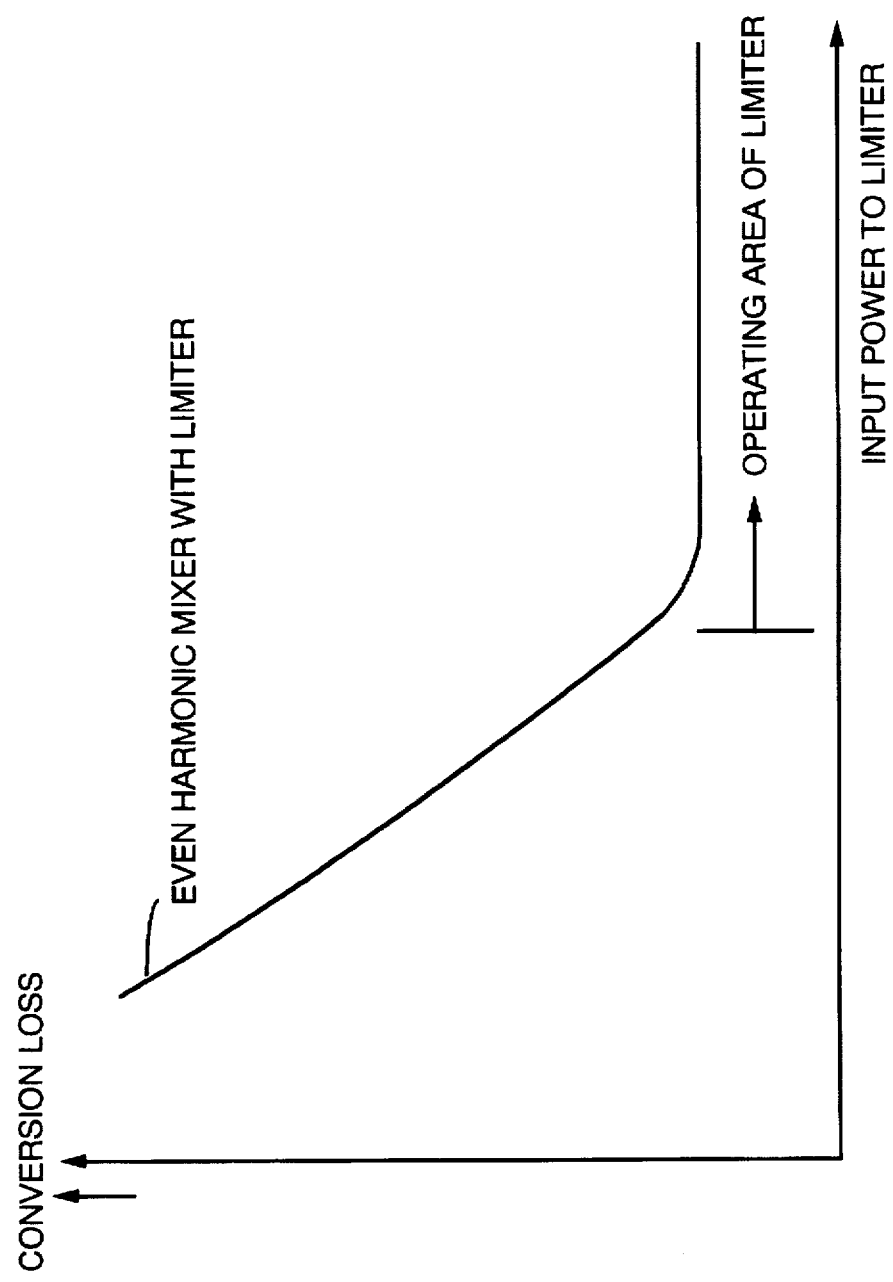
FIG. 33 shows a characteristic of an even harmonic mixer comprising a limiter according to the tenth embodiment of the present invention.

According to a tenth embodiment, a receiving apparatus comprises limiter 52 between oscillator 8 and even harmonic quadrature mixer 41 as shown in FIG. 31, for restraining power fluctuation of local oscillation wave which has a characteristic as shown in FIG. 32. Limiter 52 operates to make the power of local oscillation wave constant when the power of the local oscillation wave become above the bottom point where the loss becomes minimum in FIG. 30. As a result, the characteristics of even harmonic mixers 40a, 40b become stable as shown in FIG. 33 which is similar to the dotted line in FIG. 30, even if the power of local oscillation wave fluctuates.

Since limiter 52 emits a lot of harmonics, it is better to set LPF 51 at the output port of limiter 52 for preventing bad effects of harmonics contained in the local oscillation waves. Although the above-mentioned description is concerned with a reception apparatus, the same description may be applicable to a transmitting apparatus and the gain variation due to power fluctuation of local oscillation wave can be also stabilized.

Embodiment 11.

In even harmonic quadrature mixer 41 using even harmonic mixers 40a, 40b, local oscillation waves LO are doubled by the mixers before mixed with signal waves. Therefore, if a synthesizer is used as a local oscillator 8, the channel interval is also doubled. Accordingly, in order to obtain a predetermined interval, it is necessary to prepare a synthesizer having a half interval as much as the predetermined interval in advance. Usually, a synthesizer of PLL configuration is used as a local oscillator, where the channel interval becomes the reference frequency of PLL. Accordingly, in even harmonic quadrature mixer 41, the reference frequency of PLL in local oscillator 8 becomes half compared with that in usual mixers.

However, convergence time and noise characteristic of PLL are better when the reference frequency is higher. With this regard, PLL characteristic deteriorates when even harmonic quadrature mixer 41 is used which has low reference frequency.

Figure 34:
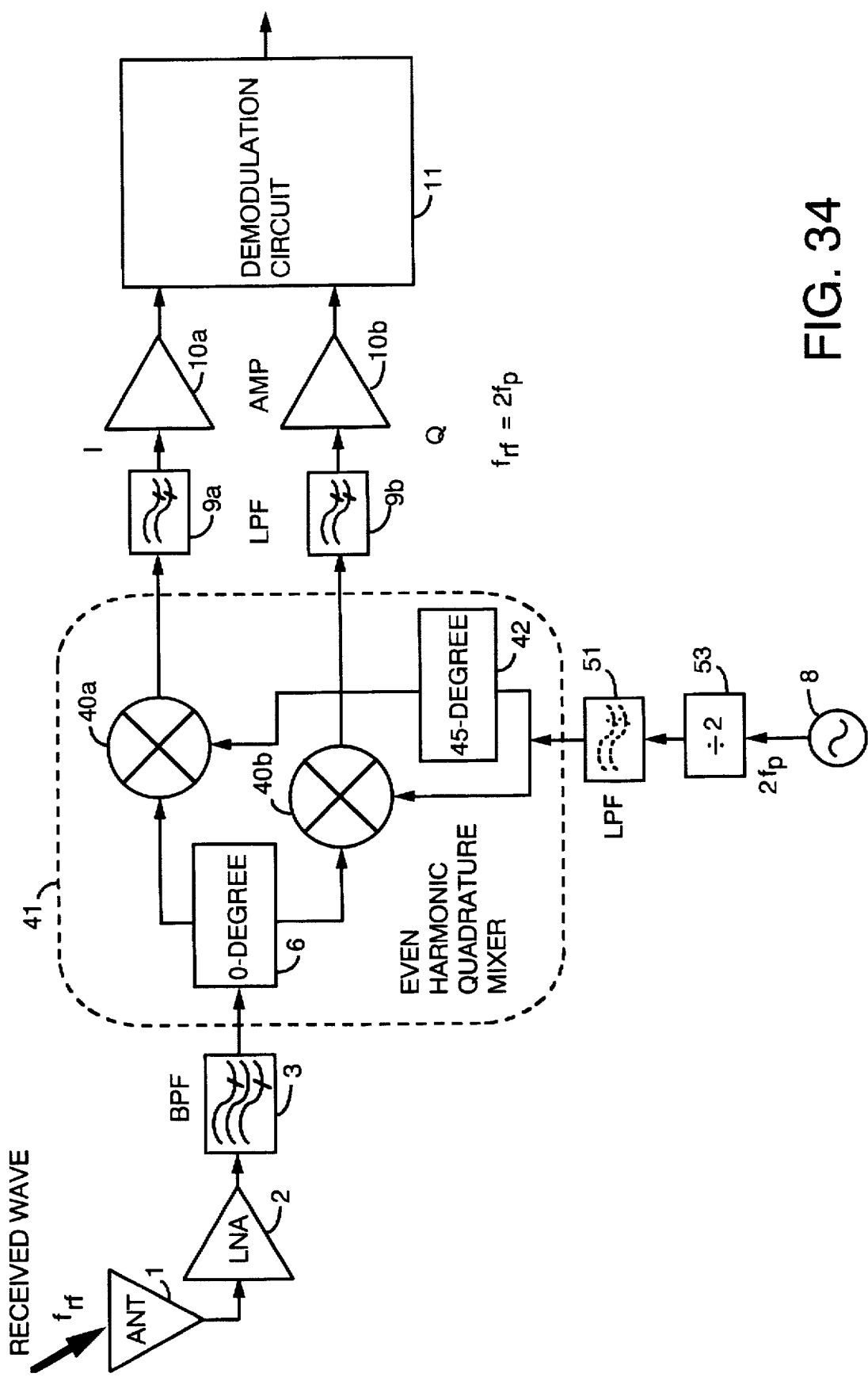
FIG. 34 shows a configuration of a receiver according to an eleventh embodiment of the present invention.
Figure 35:
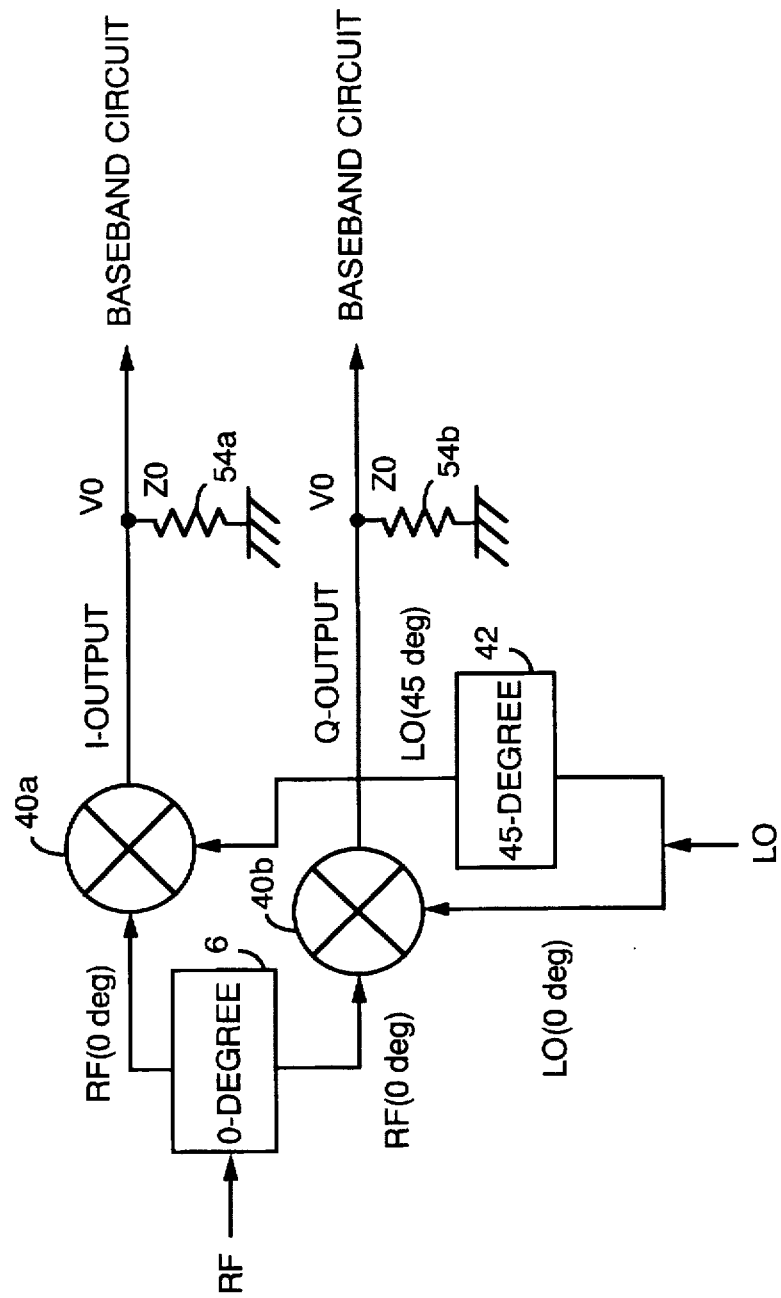
FIG. 35 shows a configuration of an even harmonic quadrature mixer according to a twelfth embodiment of the present invention.

According to a eleventh embodiment, a receiving apparatus comprises divider 53, which divides local oscillation waves by two, between local oscillator 8 and even harmonic quadrature mixer 41 as shown in FIG. 34. A frequency of outputted from local oscillator 8 is temporally lowered to half by divider 53, then the output from divider 53 is provided with even harmonic quadrature mixer 41 via LPF 51. In even harmonic quadrature mixer 41, the frequency received from LPF 51 is doubled to the original frequency and then mixed with signal waves. The doubling effects in the mixers are canceled by divider 53.

According to the eleventh embodiment, a local oscillator 8 having similar construction of the conventional receiving apparatus can be used in order to retain the deterioration of PLL characteristics. Since many harmonics are emitted from the divider 53, the same problem as mentioned above in the ninth embodiment also caused. Therefore, as shown in FIG. 34, LPF 51 is equipped before after divider 53 for eliminating harmonics. Although the above-mentioned description is concerned with a reception apparatus, the same description may be applicable to a transmitting apparatus using a vector modulator consisted of even harmonic quadrature mixer, where the same effects as described so far is also obtained.

Embodiment 12.

Figure 57:
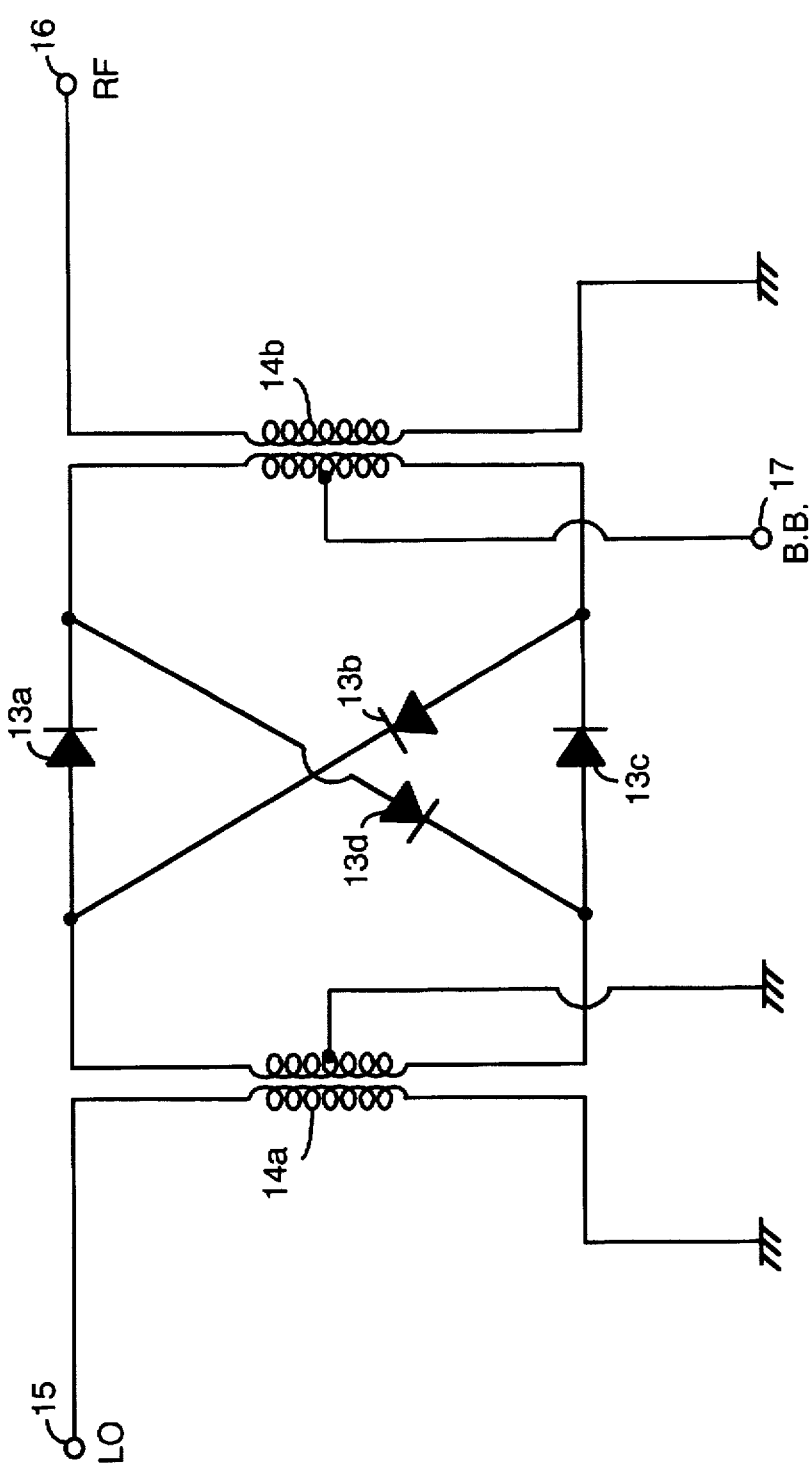
FIG. 57 shows a configuration of a conventional diodes balancing mixer.

As disclosed in "Mixers as phase detector" in Tech-note Vol. 5, No. 1 published by WJ corp. in 1978, if a general mixer which is not a even harmonic mixer (esp. diode mixer) is used as a detector, the mixer is often terminated by terminal resistance ZO of 50Ω and the terminal voltage VO is outputted to a base band circuit such as LPF 9 shown in FIG. 1. This is because the resistance of each terminal is considered as 50Ω in a conventional mixer (e.g. diode mixer by the configuration of FIG. 57).

Since even harmonic mixers 41a, 41b demodulates signal waves using the second order harmonic, the conversion loss is higher by 1~3 dB than that of the usual mixers. In order to increase the conversion efficiency, the output level of even harmonic mixers 41a, 41b should be raised.

Figure 36:
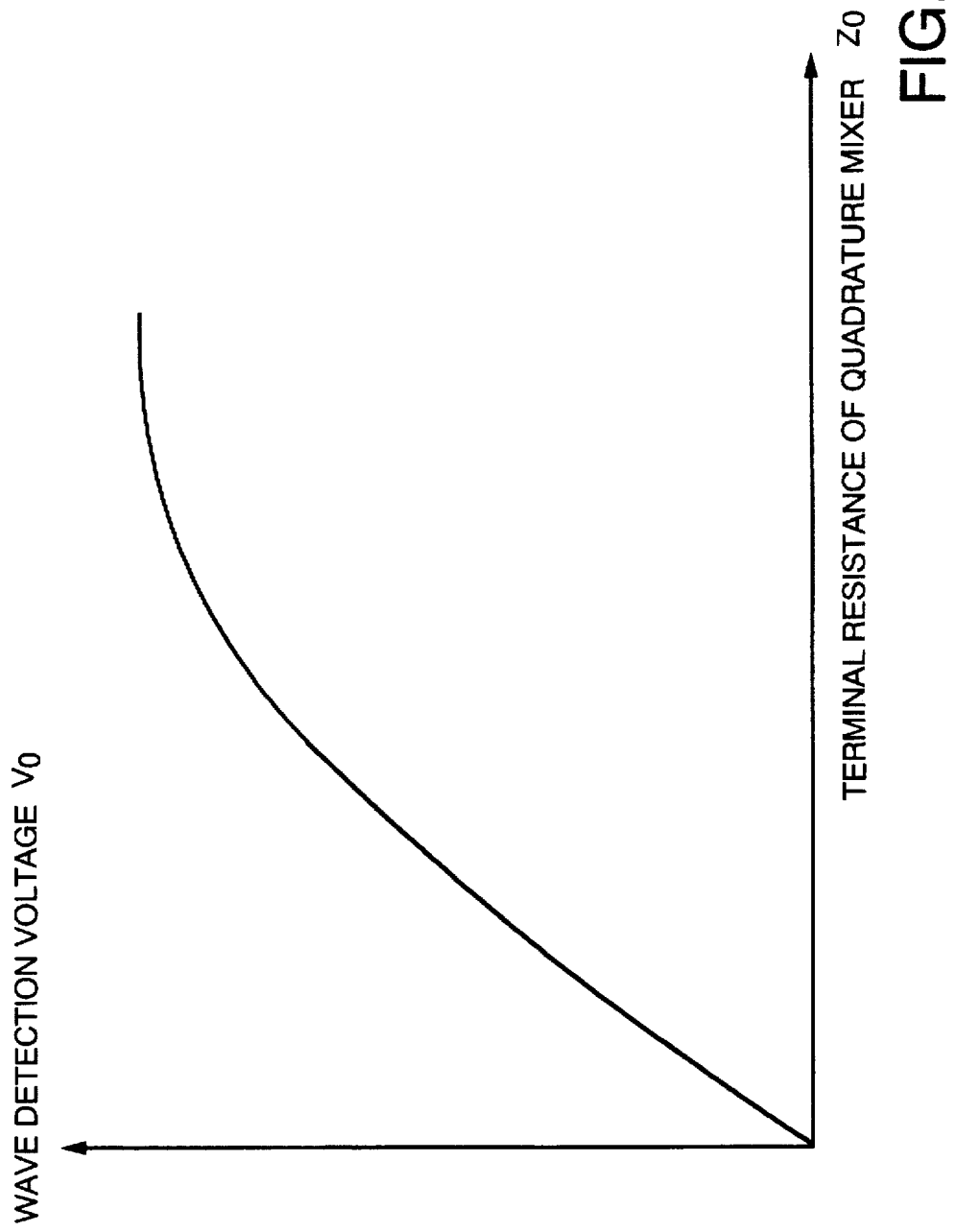
FIG. 36 shows a relationship between terminal resistance value and detection voltage according to a thirteenth embodiment of the present invention.

According to a twelfth embodiment, an quadrature mixer comprises terminal resistances 54a, 54b which have impedance higher than 50Ω in order to raise the terminal voltage VO. This terminal voltage VO is outputted to a base band circuit (LPF 9a, 9b in FIG. 1). FIG. 36 shows characteristic of terminal voltage VO corresponding to the value of terminal resistance ZO, where the terminal voltage VO increases as the value of terminal resistance ZO increases. It is known by an experiment that the terminal voltage VO becomes approximately twice higher, if the value of terminal resistance ZO is raised as much as 200Ω in even harmonic mixers 40a, 40a. Such higher voltage condition is a level which can compensate conversion loss which is unique to even harmonic mixers, and gives similar effects where conversion efficiency is improved from the operational point.

There is less bad effect if the value of terminal resistance is different from 50Ω, as mentioned in the twelfth embodiment. It is because, usually, a base band circuit utilizing an operational amplifier is assumed as a voltage transmission systems, not a power transmission systems and then the terminal resistance of 50Ω has no important meaning except as the matching resistance. Because in the operational-amplifier, only the terminal voltage is amplified without flowoing current. That is, this system is called a voltage transmission system.

Embodiment 13.

As described so far, distortions of even harmonics can be eliminated by using even harmonic mixer. The performance of reception may also be affected by distortions in odd-order, especially by the distortion of third-order.

According to an even harmonic quadrature mixer 41 of a thirteenth embodiment, the third-order distortion can be eliminate by using a recovery effect of other frequency, which is applied generally to mixers, especially diode mixers.

Figure 38:
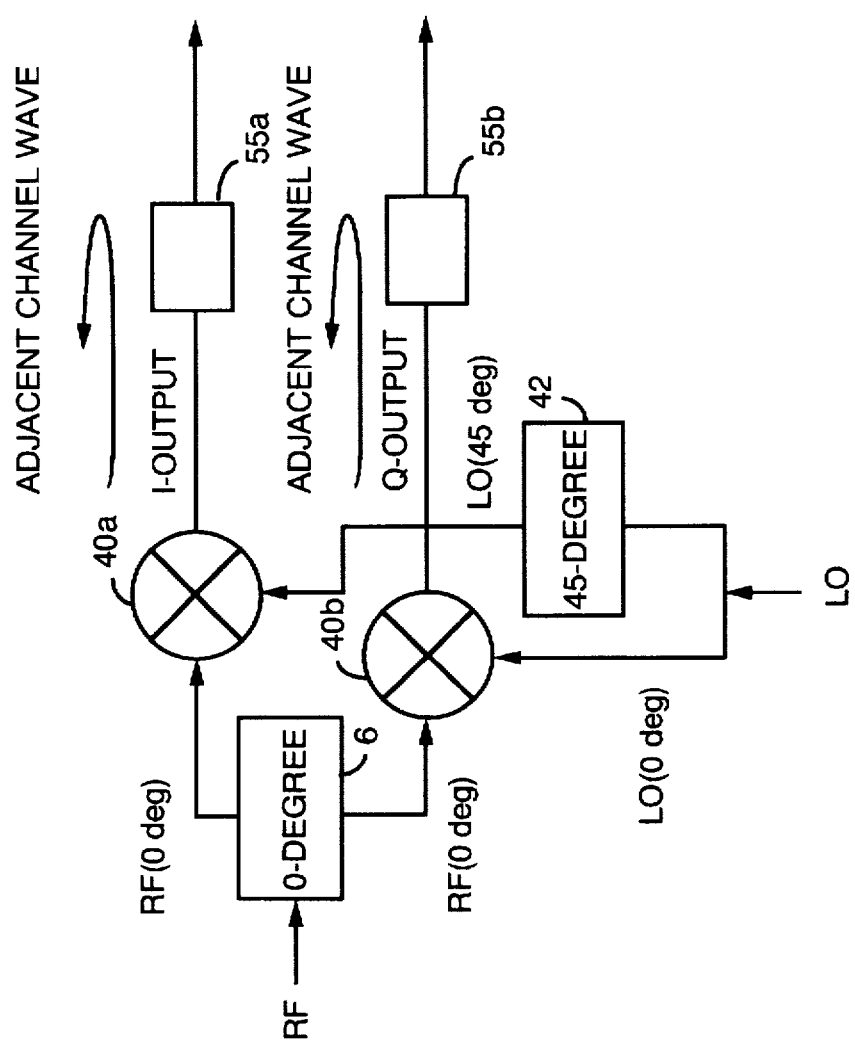
FIG. 38 shows a configuration of an even harmonic quadrature mixer according to the thirteenth embodiment of the present invention.

FIG. 38 shows a configuration of even harmonic quadrature mixer 41 comprising recovery filters 55a, 55b on each output terminal of even harmonic mixers 40a, 40b. These recovery filters 55a, 55b is comprised of passive elements such as LCR.

Figure 37:
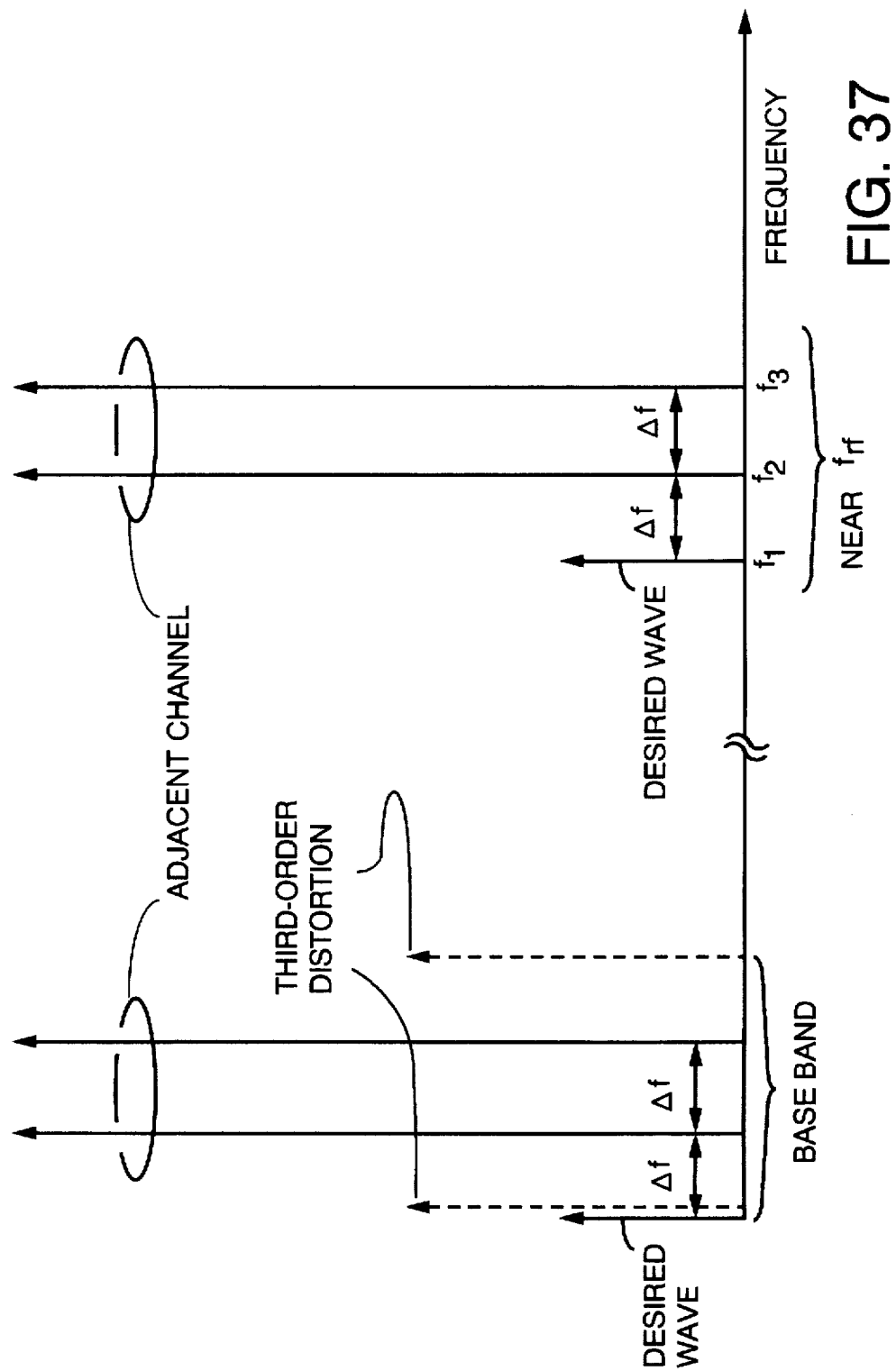
FIG. 37 shows a frequency arrangement of the third-order distortion in a receiver.
Figure 39:
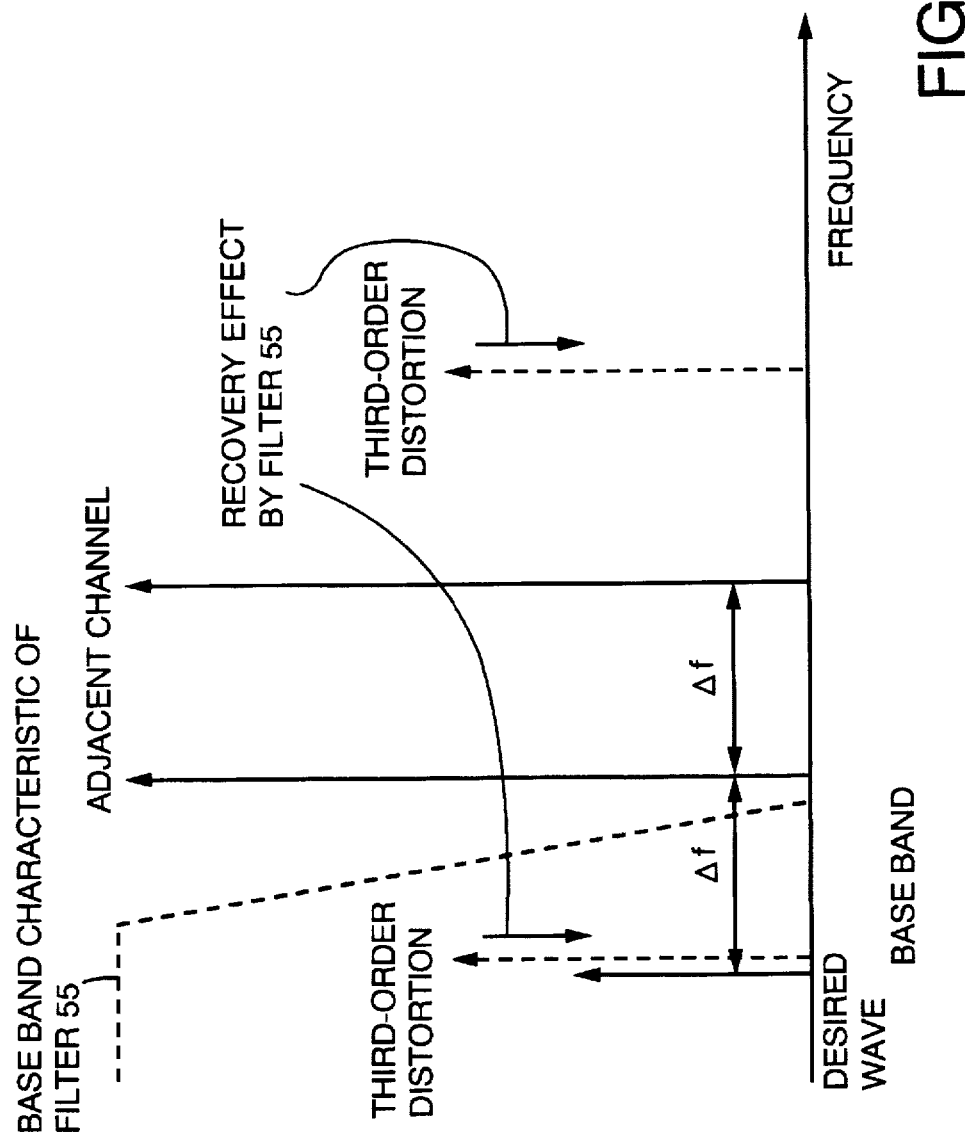
FIG. 39 illustrates an operation of an even harmonic quadrature mixer according to the thirteenth embodiment of the present invention.

An operation is described as follows. FIG. 37 shows a characteristic of the third order distortion. Focusing on base band frequency, it is known that strong waves of adjacent channels are arranged by Δf pitch. The characteristic of recovery filters 55a, 55b has a cut off frequency at adjacent channel which is converted into frequency of the base band as shown in FIG. 39. A frequency cutoff appears. The adjacent channel wave which is converted to base band is reflected at the recovery filters 55a, 55b and goes back to even harmonic mixers 40a, 40b. If the backward phase is set appropriately in accordance with the characteristic of diodes in the mixer, the component of third order distortion which is converted into a frequency of a desired wave can be canceled.

According to the thirteenth embodiment, the component of the third order distortion is reduced and the distortion characteristic of the third order may be improved.

Embodiment 14.

Figure 40:
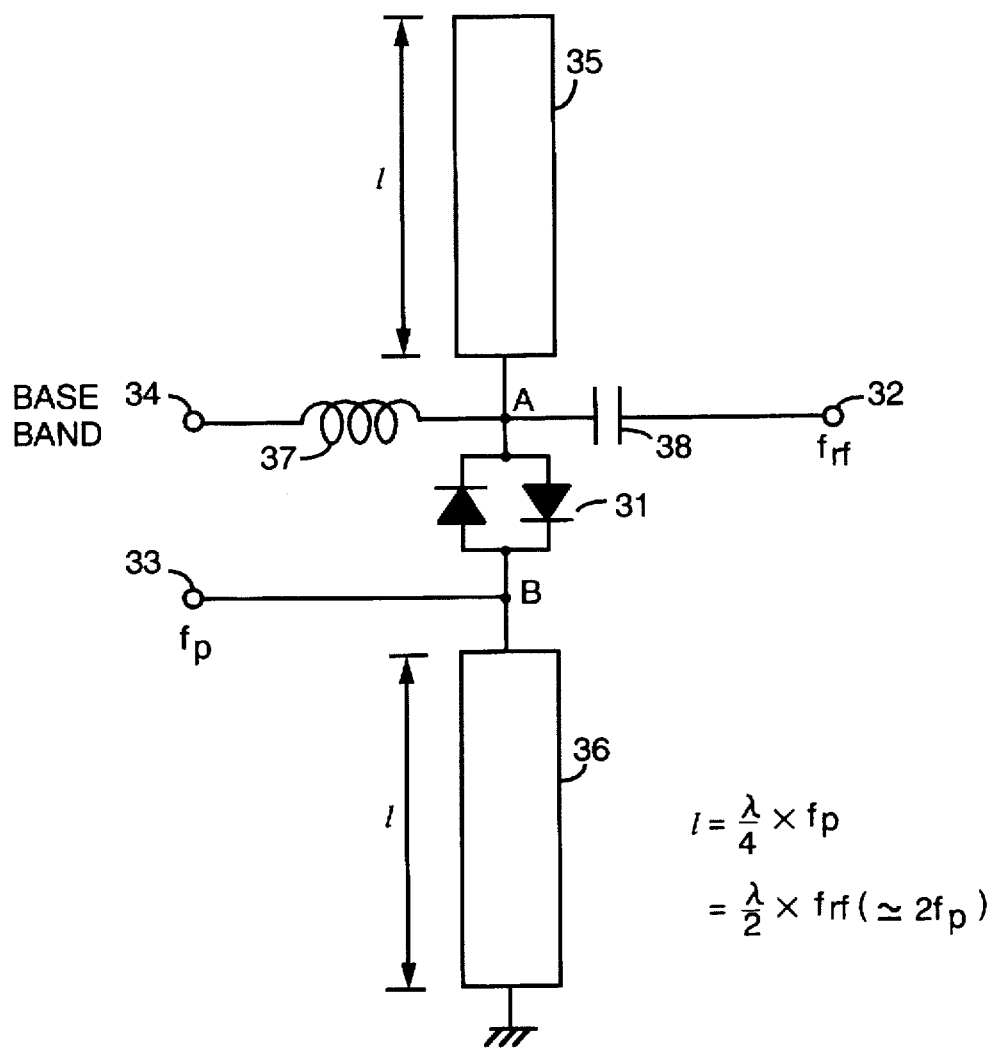
FIG. 40 shows a general configuration of even harmonic mixer.

FIG. 40 shows a configuration of a conventional even harmonic mixer, which is disclosed on MTT-S Digest, International Microwave Symposium, IEEE, June 1991, in Boston, page 882~879. The configuration of FIG. 40 comprises RF terminal 32, LO terminal 33, base band terminal 34, tip edge open stub 35, tip edge short stub 36, RF choke 37, and DC cut capacitor 38, where a local oscillation wave $f_p$ and a signal wave $f_{rf}$ ($=2f_p$) are branched using tip edge open stub 35, tip edge short stub 36.

Figure 41:
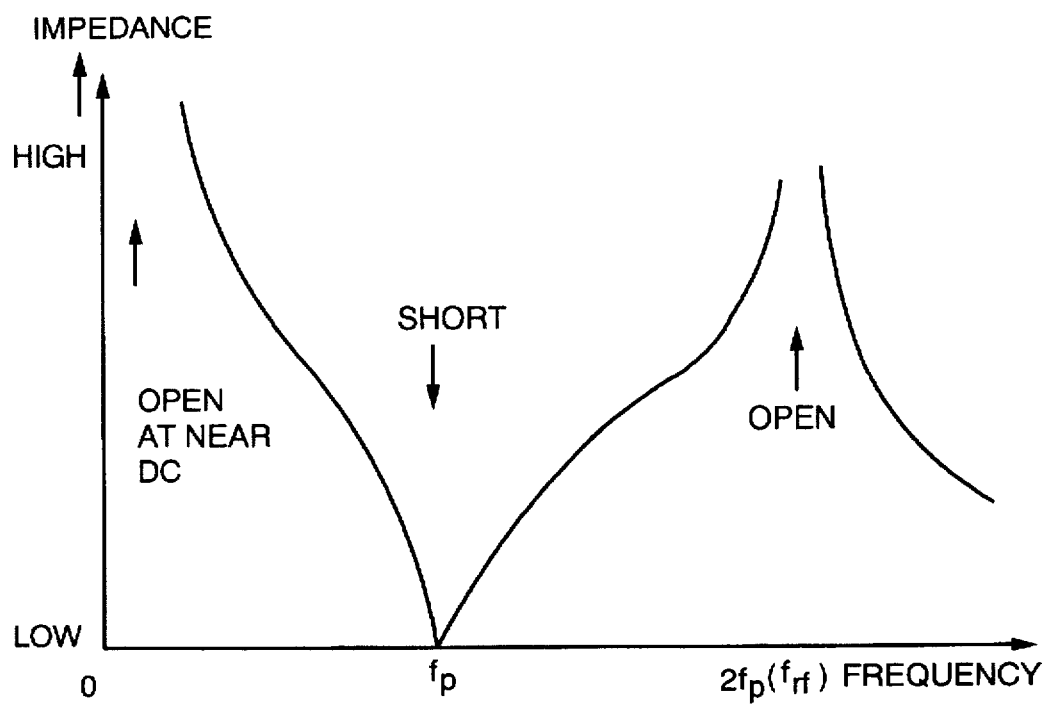
FIG. 41 shows a impedance characteristic of a diplexer in an even harmonic quadrature mixer according to a fourteenth embodiment of the present invention.
Figure 42:
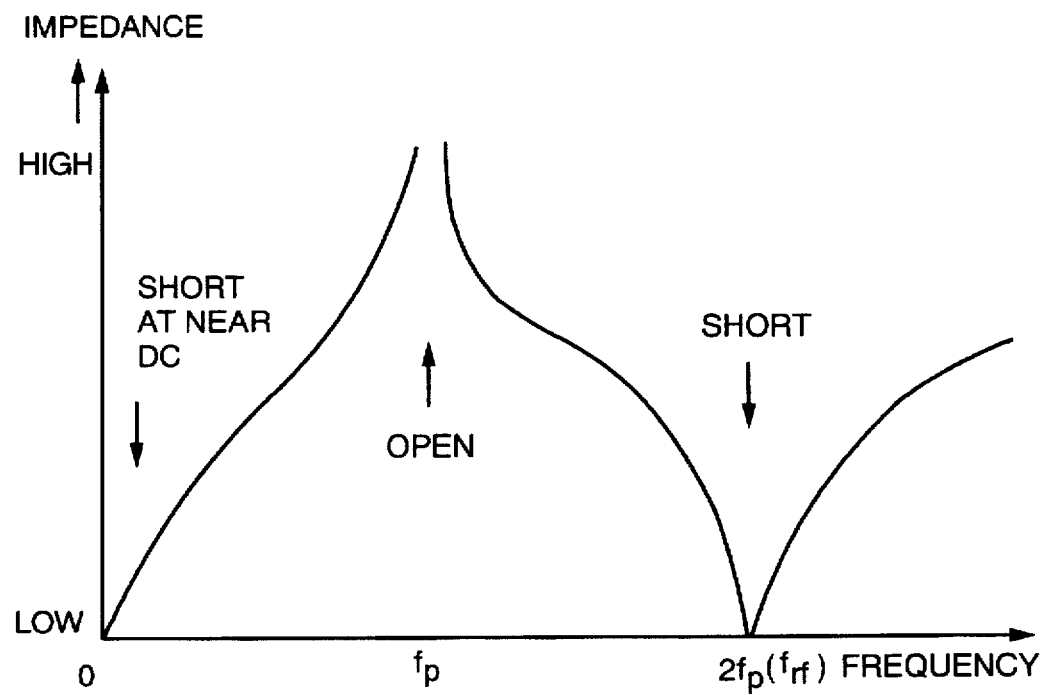
FIG. 42 shows a impedance characteristic of a diplexer in an even harmonic quadrature mixer according to the fourteenth embodiment of the present invention.

An operation is described as follows. The length l of each tip edge open stub 35 and tip edge short stub 36 is determined so that the wavelength of $f_p$ becomes about a quarter wavelength, namely a half wavelength of $f_{rf}$. FIG. 41 shows the impedance characteristic of tip edge open stub 35 observed from APDP 31. FIG. 42 shows the impedance characteristic of tip edge short stub 36 observed from APDP 31.

Tip edge open stub 35 is arranged between RF terminal 32 and base band terminal 34. The characteristic of tip edge open stub 35 is shown in FIG. 41. The impedance becomes high near DC and at the frequency $f_{rf}$ and then APDP 31 is connected to terminals 32, 34, respectively. On the other hand, the impedance becomes low near the frequency $f_p$ and there APDP 31 is grounded.

Tip edge short stub 36 is arranged on the side of LO terminal 33. The characteristic of tip edge short stub 36 is shown in FIG. 42. The impedance becomes low near DC and at the frequency $f_{rf}$ and there APDP 31 is grounded. On the other hand, the impedance becomes high near $f_p$ and there APDP 31 is connected to LO terminal 33.

Although the configuration of FIG. 40 is simple, it becomes larger if an even harmonic mixer of such configuration is realized in a relatively low frequency, since each length of tip edge open stub 35 and tip edge short stub 36 becomes longer.

According to a fourteenth embodiment, the size of even harmonic mixer becomes small, using a concentrated-constant wave diplexer which operates in the same way as the above-mentioned stubs.

Figure 43:
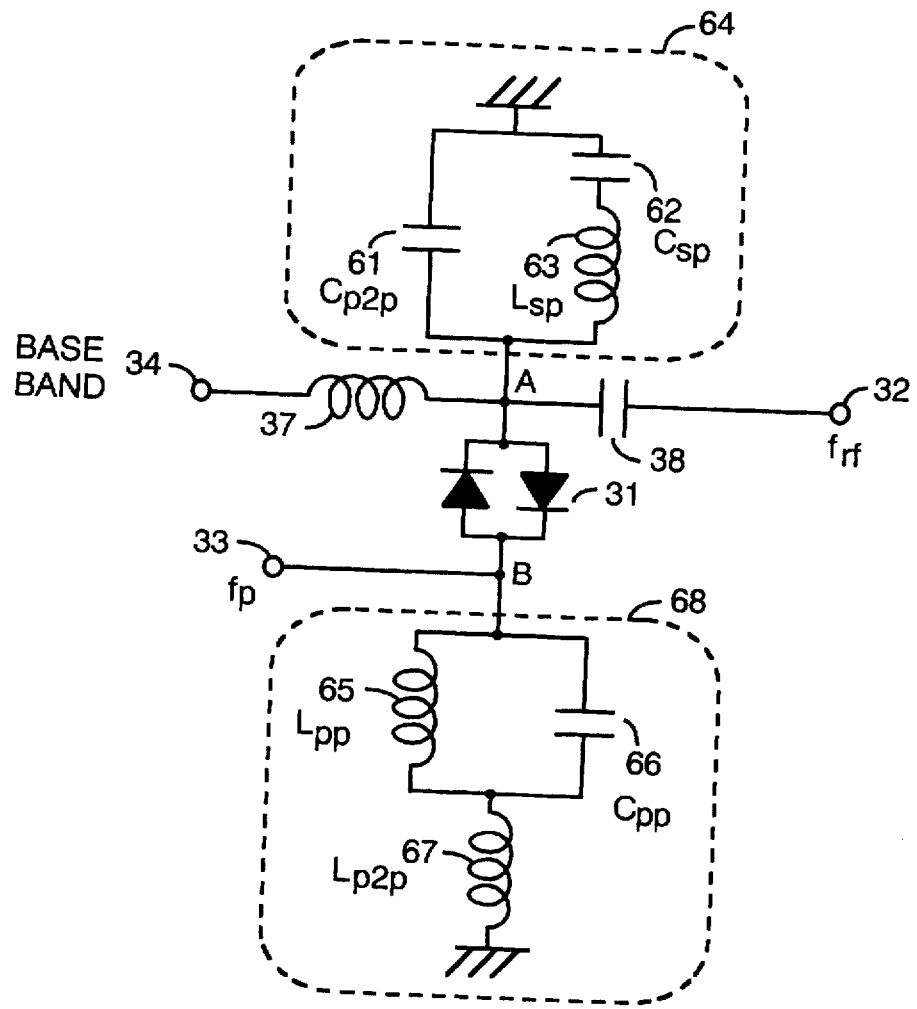
FIG. 43 shows a configuration of an even harmonic quadrature mixer according to the fourteenth embodiment of the present invention.

FIG. 43 shows a circuit configuration of even harmonic mixer of a fourteenth embodiment, comprising anti parallel diodes pair (APDP) 31 which comprises mixer diodes 30a, 30b connected by inverted polarity to each other and in parallel. In the following description, the two connection edge of APDP 31 are referred to as A edge and B edge for convenience of the description.

RF terminal 32 is connected to A edge of APDP 31 via capacitor 38 for rejecting DC current, to which a high frequency ($f_{rf}$) received signal is inputted. LO terminal 33 is connected to B edge of APDP 31, to which a local oscillation signal ($f_p$) is inputted. Base band terminal 34 is connected to A edge of APDP 31 via inductor 37 for blocking high frequency signals, from which a detected base band signal is outputted.

Concentrated-constant stub 64 is connected to A edge of APDP 31. Stub 64 comprises capacitors 61, 62, and inductor 63. In stub 64, the one end of capacitor 61 whose capacitance is $C_{p2p}$ is connected to A edge and the other end is connected to earth. Capacitor 62 whose capacitance is $C_{sp}$ and inductor 63 whose inductance is $L_{sp}$ are connected in series. This serial circuit of capacitor 62 and inductor 63 are further connected to capacitor 61 in parallel.

Concentrated-constant stub 68 is connected to B edge of APDP 31. Stub 68 comprises capacitor 66 and inductor 65, 67. In stub 68, inductor 65 whose inductance is $L_{pp}$ and capacitor 66 whose capacitance is $C_{pp}$ are connected in parallel. The one end of this parallel circuit is connected to B edge of APDP 31. The one end of inductor 67 whose inductance is $L_{s2p}$ is connected to the earth. The other end of inductor 67 is connected to the parallel circuit of inductor 65 and capacitor 66.

An operation of even harmonic mixer of FIG. 43 is described as follows. Stub 64 is designed to operate in the same way as tip edge open stub 35 in FIG. 40. In other words, capacitor 62 and inductor 63 resonate in serial at frequency $f_p$ so that the impedance becomes low, and also capacitor 61 and a series-resonant circuit of capacitor 62 and inductor 63 resonates in parallel at frequency $f_{rf}$ so that the impedance becomes high. Since stub 64 is open at DC (direct current), the impedance becomes high. Accordingly, stub 64 has the same characteristic as shown in FIG. 41.

Stub 68 is designed to operate in the same way as tip edge short stub 36 of FIG. 40. In other words, capacitor 66 and inductor 65 resonate in parallel in frequency $f_p$ so that the impedance becomes high, and inductor 67 and a parallel resonant circuit of capacitor 66 and inductor 65 resonate in series in frequency $f_{rf}$ so that the impedance becomes low. Since stub 68 is short at DC (direct current), the impedance becomes low. Accordingly, stub 68 has the same characteristic as shown in FIG. 42.

Both concentrated-constant stubs 64, 68 is equivalent to tip edge open stub 35 and tip edge short stub 36 in FIG. 40, respectively. Accordingly, even harmonic mixer in FIG. 43 operates in the same way as the mixer in FIG. 40.

According to the fourteenth embodiment, a diplexer can be made by stub which has the same impedance characteristic as the conventional stub using concentrated constant. Accordingly, the size of the mixer can be made smaller, without using the stubs which becomes larger when frequency is low.
Embodiment 15.

Figure 44:
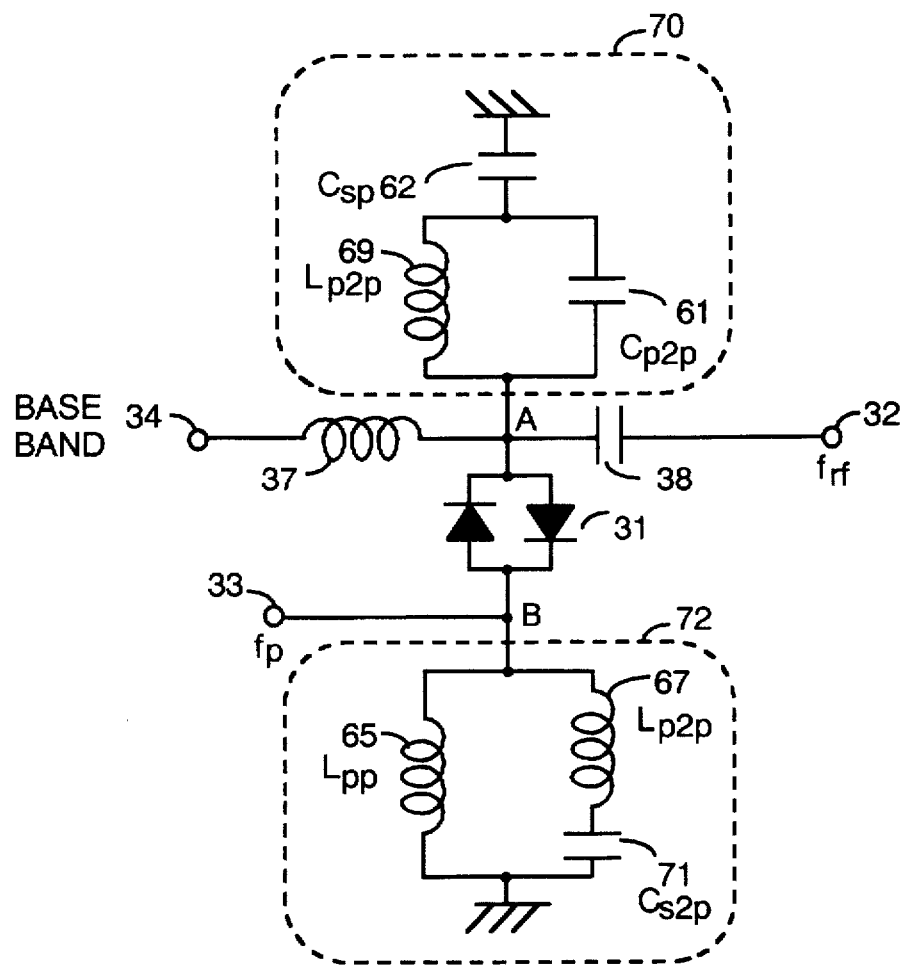
FIG. 44 shows a configuration of an even harmonic quadrature mixer according to a fifteenth embodiment of the present invention.

FIG. 44 shows a circuit configuration of even harmonic mixer according to a fifteenth embodiment, comprising concentrated-constant stub 70 connected to A edge of APDP 31. Stub 70 comprises capacitors 61, 62 and inductor 69. In stub 70, inductor 69 whose inductance is $L_{p2p}$ and capacitor 61 whose capacitance is $C_{p2p}$ are connected in parallel. One end of this parallel circuit is connected to A edge of APDP 31. The parallel circuit of inductor 69 and capacitor 61 and capacitor 62 whose capacitance is $C_{sp}$ are connected in series, namely the other end of this parallel circuit is connected to earth via capacitor 62.

Concentrated constant stub 72 is connected to B edge of APDP 31. Stub 72 comprises capacitor 71, and inductor 65, 67. In stub 72, inductor 67 whose inductance is $L_{s2p}$ and capacitor 71 whose capacitance is $C_{s2p}$ are connected in series and constitute a serial circuit. One end of this serial circuit is connected to B edge of APDP 31 and the other end is grounded. Inductor 67 and the serial circuit of inductor 65 and capacitor 71 is connected in parallel.

The anti parallel diodes pair (APDP) 31 comprising a parallel circuit of mixer diodes 30a, 30b which is inversely connected to each other in polarity, RF terminal 32, LO terminal 33, base band terminal 34, inductor 37, and capacitor 38 in this embodiment are the same as those shown in FIG. 43.

An operation of even harmonic mixer of FIG. 44 is described as follows. Stub 70 is designed so that it operates in the same manner as tip edge open stub 35 in FIG. 40 operates. More precisely, capacitor 61 and inductor 69 resonate in parallel in frequency $f_{rf}$ so that the impedance becomes high, and capacitor 62 as well as a parallel resonant circuit of capacitor 61 and inductor 69 resonate in series in frequency $f_p$ so that the impedance becomes low. Since stub 70 is open in DC (direct current), the impedance also becomes high there. Accordingly, stub 70 has the same characteristic as shown in FIG. 41.

Stub 72 is designed so that it operates in the same manner as tip edge short stub 36 in FIG. 40 operates. More precisely, capacitor 71 and inductor 67 resonate in series in frequency $f_{rf}$ so that the impedance becomes low, and inductor 65 as well as a serial resonant circuit of capacitor 71 and inductor 67 resonate in parallel in frequency $f_p$ so that the impedance becomes high. Since stub 70 becomes short in DC, the impedance becomes low. Accordingly, stub 70 has the same characteristic as shown in FIG. 42.

According to the fifteenth embodiment, a diplexer can be made by stub which has the same impedance characteristic as the conventional stub using concentrated constant. Accordingly, the size of the mixer can be made smaller.
Embodiment 16.

Figure 45:
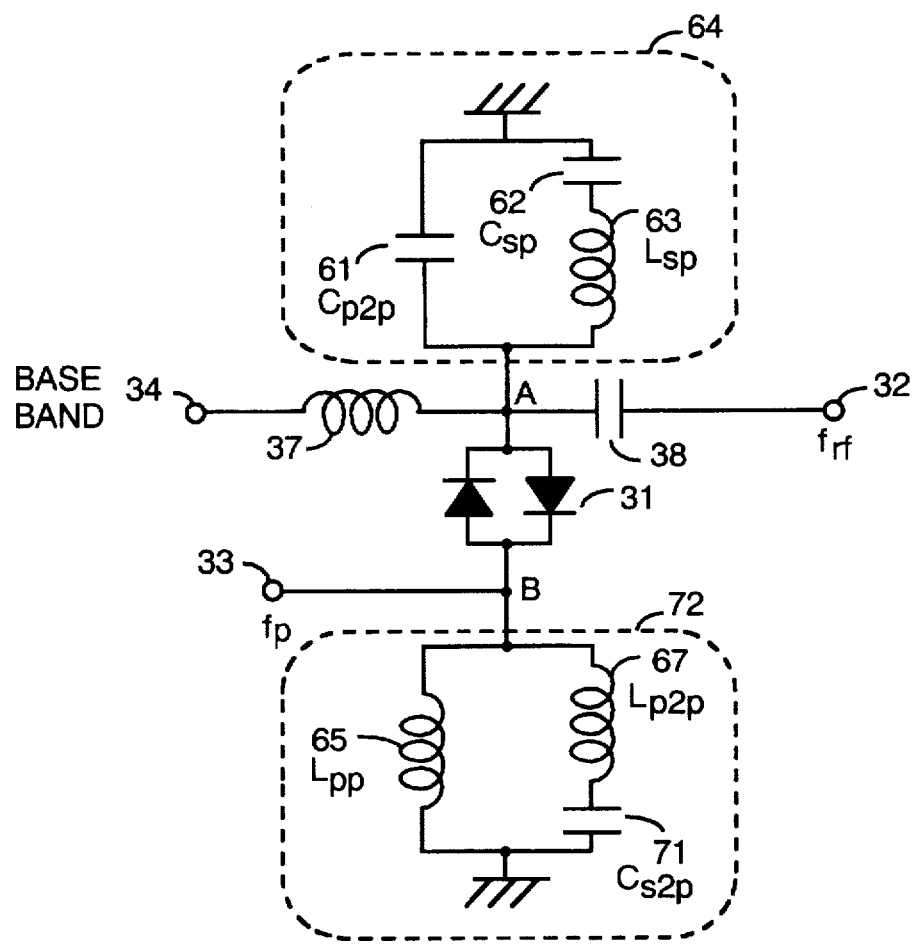
FIG. 45 shows a configuration of an even harmonic quadrature mixer according to a sixteenth embodiment of the present invention.

FIG. 45 shows a circuit configuration of even harmonic mixer of the sixteenth embodiment. The stub 64 in FIG. 43 and the stub 72 in FIG. 44 are combined to make even harmonic mixer in FIG. 45. Such even harmonic mixer of the sixteenth embodiment obtains the same effect as shown in the fourteenth embodiment.
Embodiment 17.

Figure 46:
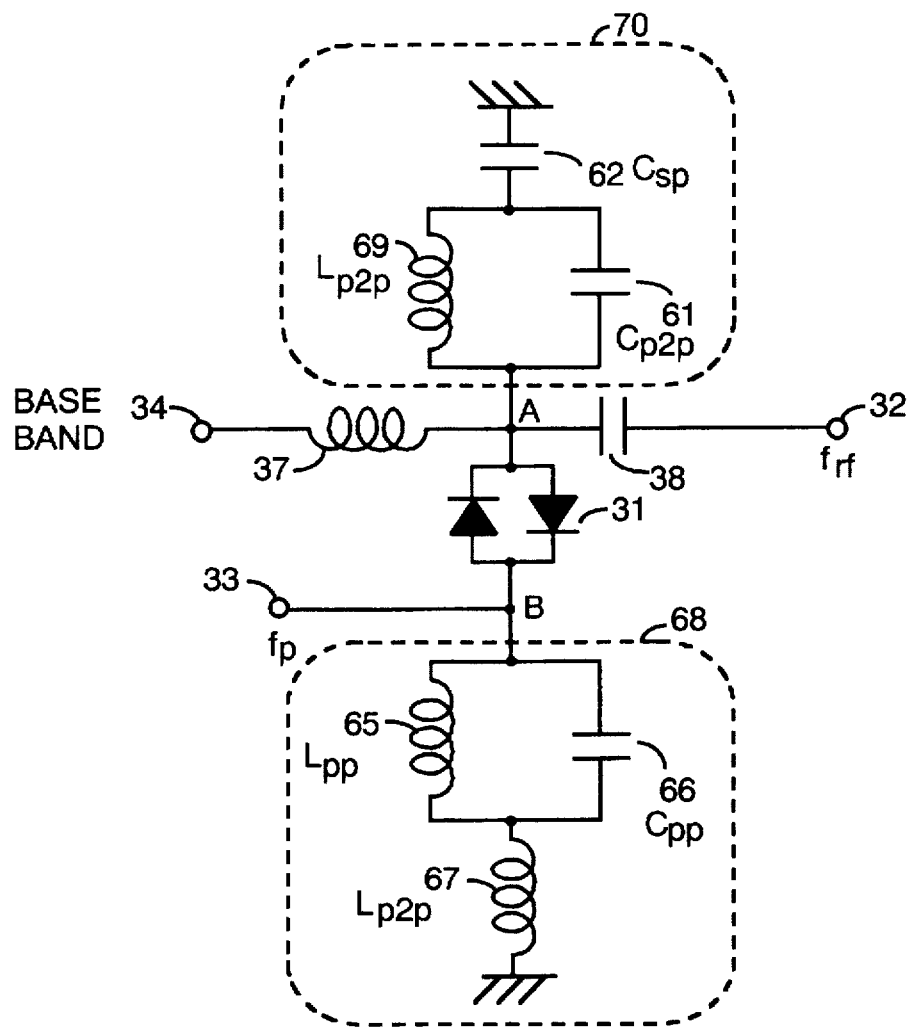
FIG. 46 shows a configuration of an even harmonic quadrature mixer according to a seventeenth embodiment of the present invention.

FIG. 46 shows a circuit configuration of even harmonic mixer of the seventeenth embodiment. The stub 70 in FIG. 44 and the stub 68 in FIG. 43 are combined to make even harmonic mixer in FIG. 46. Such even harmonic mixer of the seventeenth embodiment obtains the same effect as shown in the fourteenth embodiment.
Embodiment 18.

Figure 47:
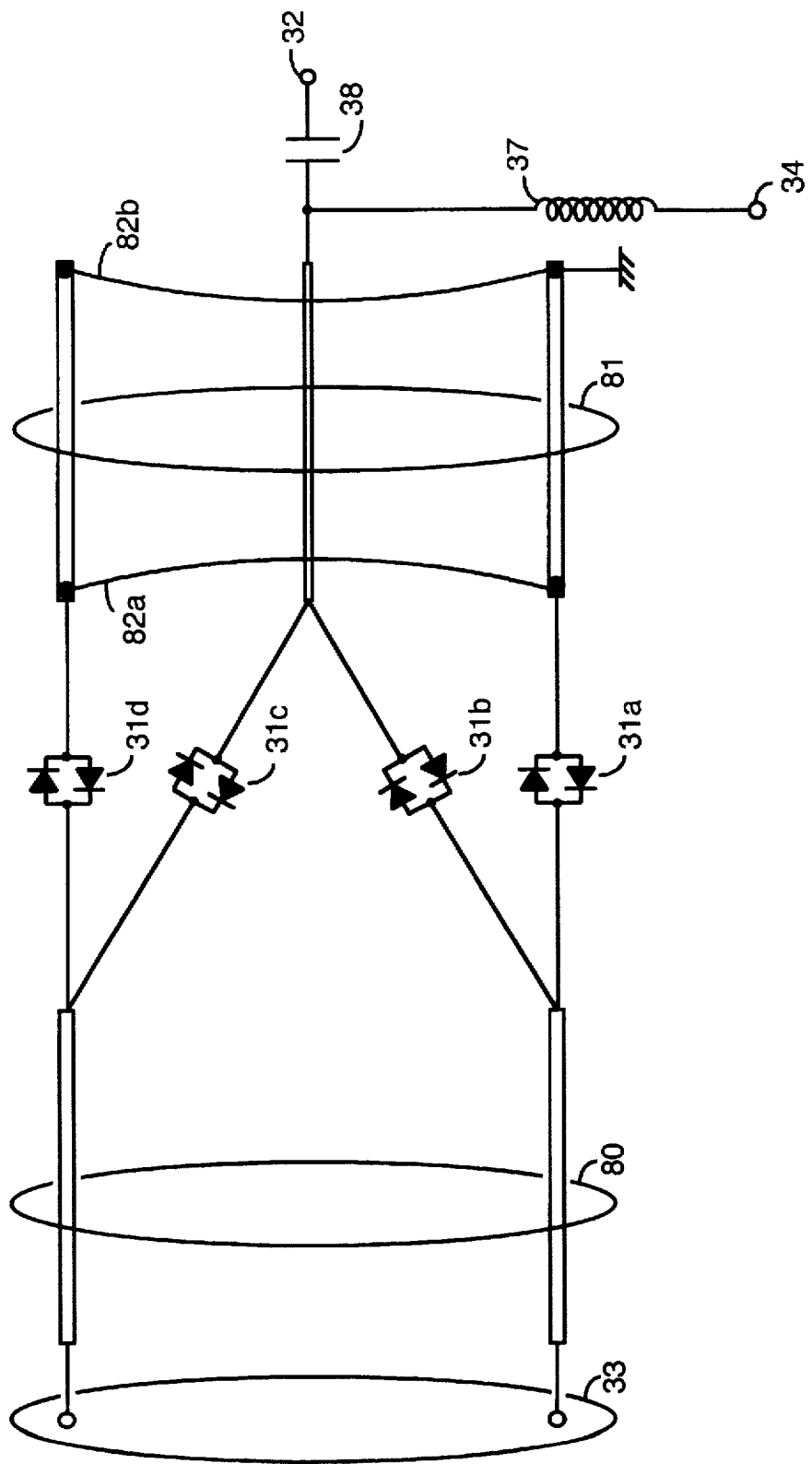
FIG. 47 shows a configuration of another even harmonic quadrature mixer.

FIG. 47 shows another example of conventional even harmonic mixer, disclosed at Autumn National Conference of the Institute of Electronics, Information and Communication Engineers, C-47 in 1993. The configuration of FIG. 47 comprises slot line 80, coplanar line 81 and wire 82 for restraining balancing mode excited to coplanar line. In this even harmonic mixer, four anti parallel diode pairs (APDP) 31a, 31b, 31c, and 31d are connected in ring shape between slot line 80 and coplanar line 81 which are facing each other. By excited phase, slot line 80 and coplanar line 81 are isolated from each other. This configuration has an advantageous features for branching the frequency for wide-range.

However, considering the connection of ground conductor, the integration of slot line 80 is hardly realized. Moreover, the frequency band is limited to narrow when connecting micro stripe line to the outside circuit.

Therefore, according to a eighteenth embodiment, even harmonic mixer comprises a differential amplifier instead of slot line 80.

Figure 48:
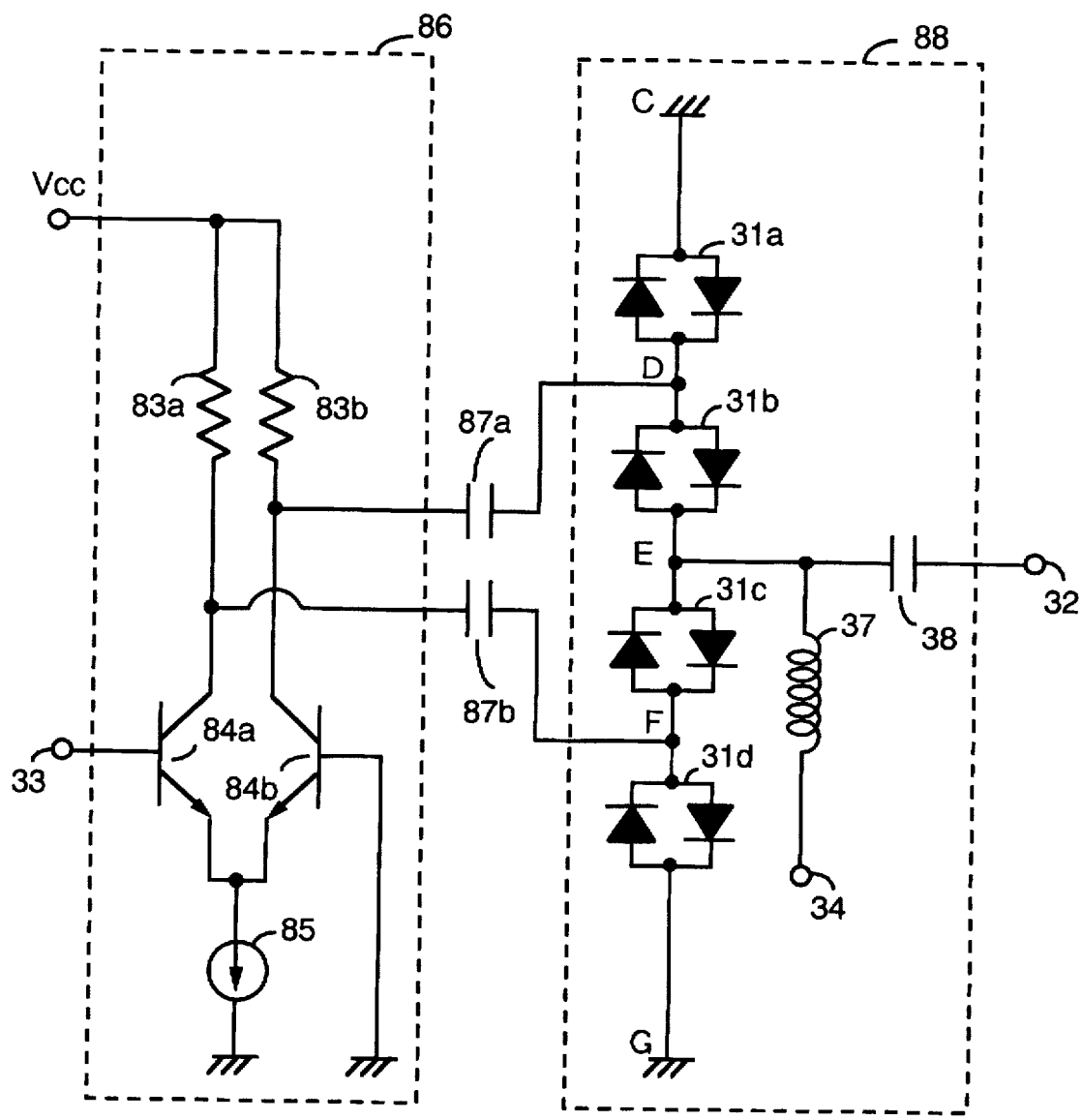
FIG. 48 shows a configuration of an even harmonic quadrature mixer according to an eighteenth embodiment of the present invention.

FIG. 48 shows a configuration of even harmonic mixer according to the eighteenth embodiment, comprising differential amplifier 86 for amplifying a local oscillation wave inputted into LO terminal 33 and output it as differential output. Differential amplifier 86 comprises resistors 83a, 83b, each one end of which are connected to VCC, transistors 84a, 84b, each corrector electrode of which is connected to resistors 83a, 83b, respectively, and current source 85 connected to the emitter electrodes of transistors 84a, 84b. Base electrode of transistor 84a is LO terminal 33. Base electrode of transistor 84b is grounded. Another end of current source 85 is also grounded too. Output terminal of differential amplifier 86 is connected respectively to collector electrodes of transistors 84a, 84b.

DC cut capacitors 87a, 87b are connected to the output terminal of differential amplifier 86. Mixing portion 88 detects a signal wave inputted into RF terminal according to a DC-cut output from differential amplifier 86 and then output it to base band terminal 34.

Mixing portion 88 comprises anti parallel diode pairs (APDP) 31a, 31b, 31c and 31d which are connected in a ring shape, capacitor 38 for DC-cutting a signal wave to RF terminal 32, inductor 37 for cutting high frequency signals to base band terminal 34. For convenience of description, the connection point of APDP 31a and 31b is referred to as D terminal, the connection point of APDP 31b and 31c is referred to as E terminal, the connection point of APDP 31c and 31d is referred to as F terminal. The grounded ends of APDP 31a, 31d are referred to as C terminal and G terminal, respectively. Output of differential amplifier 86 is connected to both D terminal and F terminal. E terminal is connected to both RF terminal 32 and base band terminal 34.

An operation of the mixer in FIG. 48 is described as follows. In differential amplifier 86, since transistors 84a, 84b are excited in inverted phase, the current for exciting the collector becomes inverted phase too. By such operation, differential amplifier 86 can be substituted for a balance-unbalance transducer, namely a balun. In this embodiment, focusing on the fact that slot line 80 in FIG. 47 is equivalent to a balanced line, differential amplifier 86 is substituted for a balun. An operation of mixing portion 88 is the same as that in case of FIG. 47.

According the eighteenth embodiment, since even harmonic mixer can be constructed without using a slot line, the size of mixer can be made smaller.
Embodiment 19.

Figure 49:
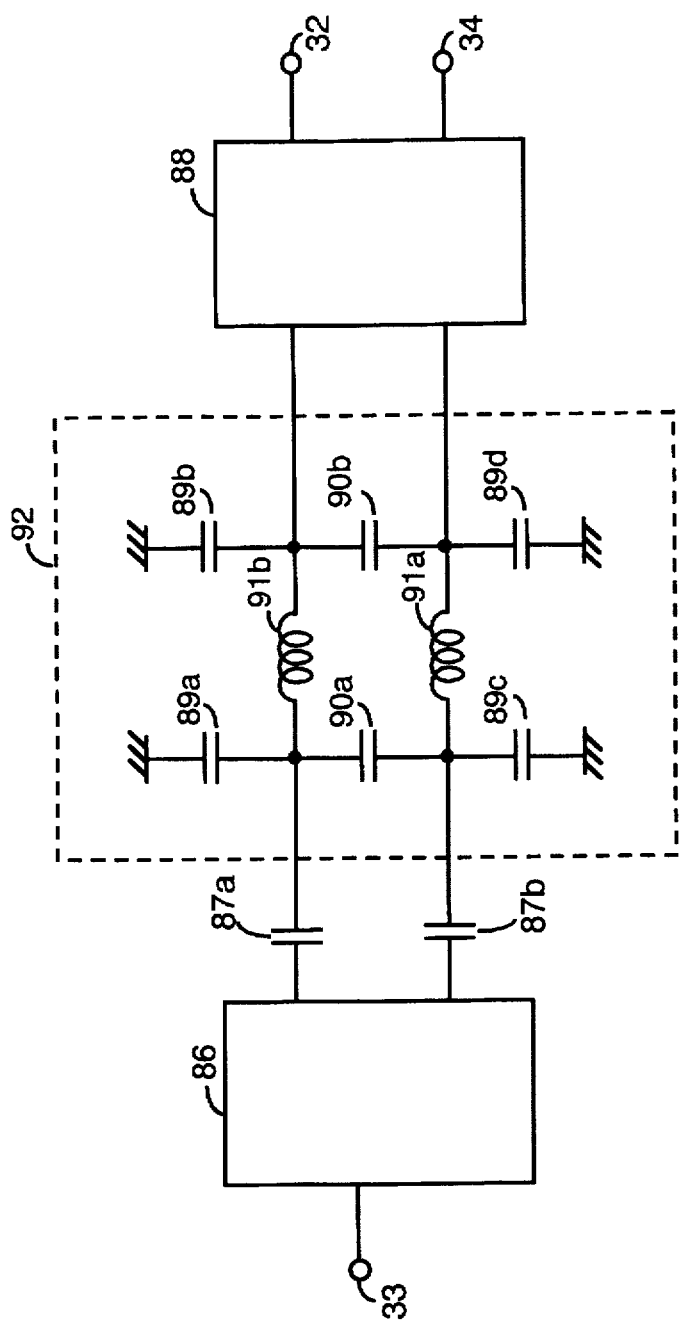
FIG. 49 shows a configuration of an even harmonic quadrature mixer according to a nineteenth embodiment of the present invention.

FIG. 49 shows a circuit configuration of even harmonic mixer according to the nineteenth embodiment. Even harmonic mixer in FIG. 49 further comprises filter 92 for removing harmonics generated in differential amplifier 86 between differential amplifier 86 and mixing portion 88 of even harmonic mixer shown in FIG. 48.

Filter 92 comprises capacitors 89a, 89b, 89c, 89d, 90a, 90b, and inductor 91a, 91b. Capacitors 89a, 90a, 89c are connected in series and one end of each capacitors 89a, and 89c are grounded. Capacitors 89b, 90b, 89d are connected in series and one end of each capacitors 89b, 89d are grounded. Connecting point of capacitors 89a, 90a and that of capacitors 89b, 90b are connected to each other via inductor 91b. Connecting point of capacitors 90a, 89c and that of capacitors 90b, 89d are connected via inductor 91a.

Filter 92 eliminate harmonics contained in a differential output outputted via capacitors 87a, 87b in both common mode and inverted phase mode. The capacitance of filter 92 is determined, taking this point into account.

According to the nineteenth embodiment, since even harmonic mixer is made without slot line, the size of the mixer can be made smaller. Moreover, the performance of a mixer is further improved, by eliminating harmonic components contained in outputs from differential amplifier.
Embodiment 20.

Figure 50:
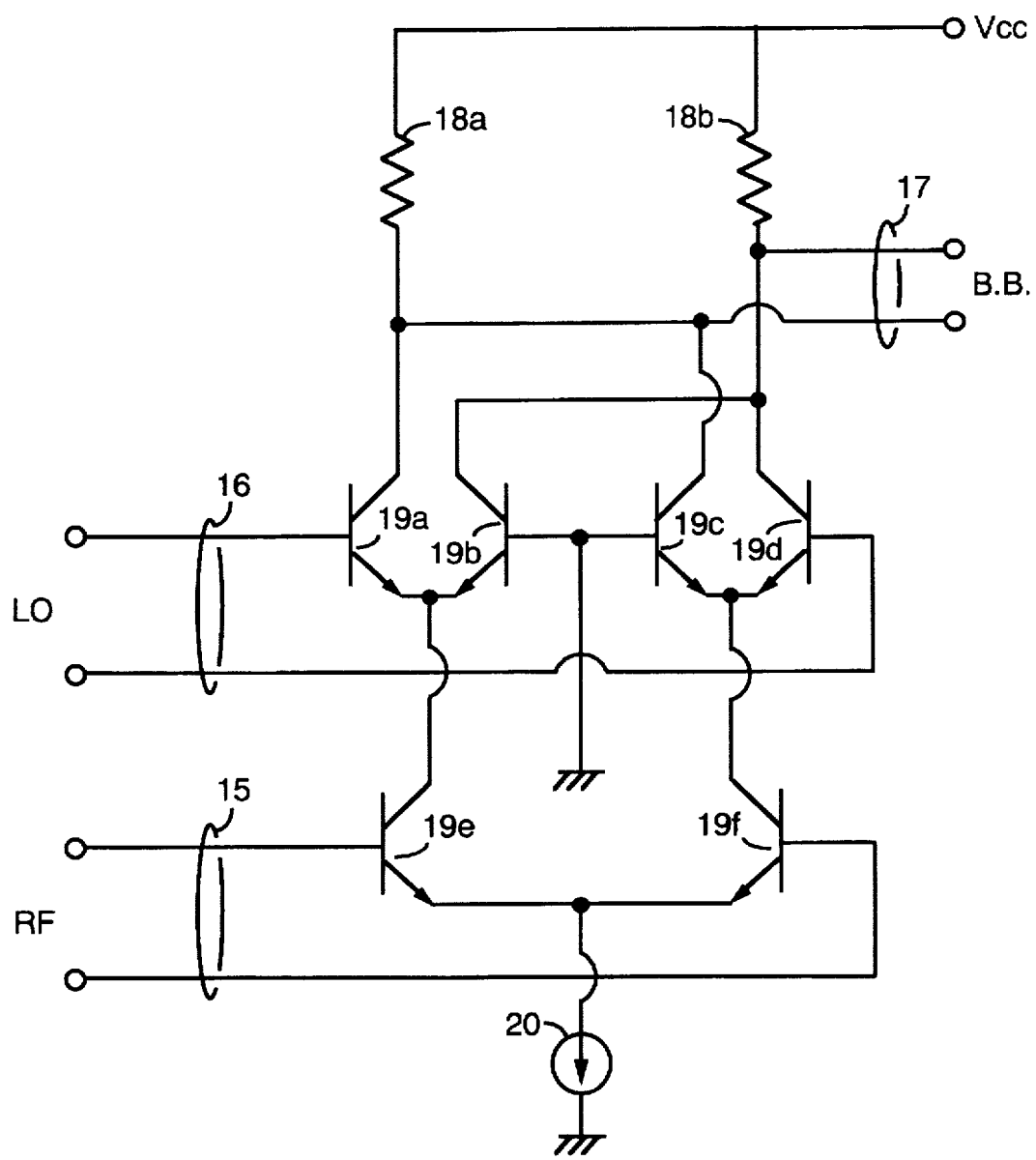
FIG. 50 shows a configuration of an even harmonic quadrature mixer according to a twentieth embodiment of the present invention.

FIG. 50 shows a circuit configuration of even harmonic mixer according to the twentieth embodiment. The configuration of FIG. 50 comprises resistors 18a, 18b, transistors 19a, 19b, 19c, 19d, 19e, 19f, current source 20. Inputs LO and RF are differential to each other. LO signals having inverted phase to each other are inputted to each base electrode of transistors 19a, 19d. RF signals having inverted phase to each other are inputted to each base electrode of transistors 19e, 19f. A mixed wave generated as a result of multiplying RF and LO in analog mode by means of transistors 19a~19f are outputted to a base band output terminal 17 connected to each collector of transistors 19a and 19c as well as 19b and 19d, respectively, for outputting differential signal.

Figure 58:
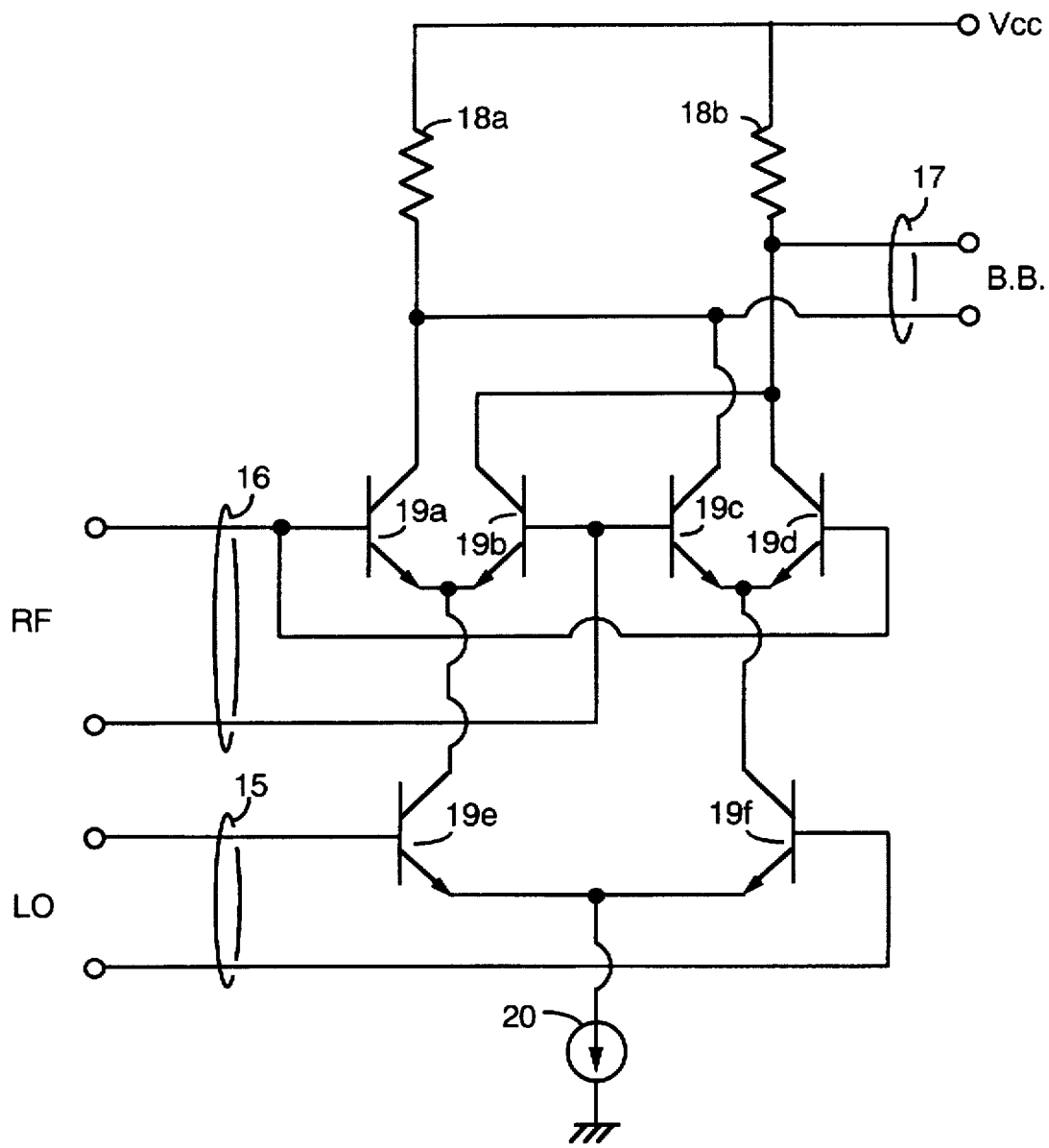
FIG. 58 shows a configuration of a conventional transistor balancing mixer.
Figure 59:
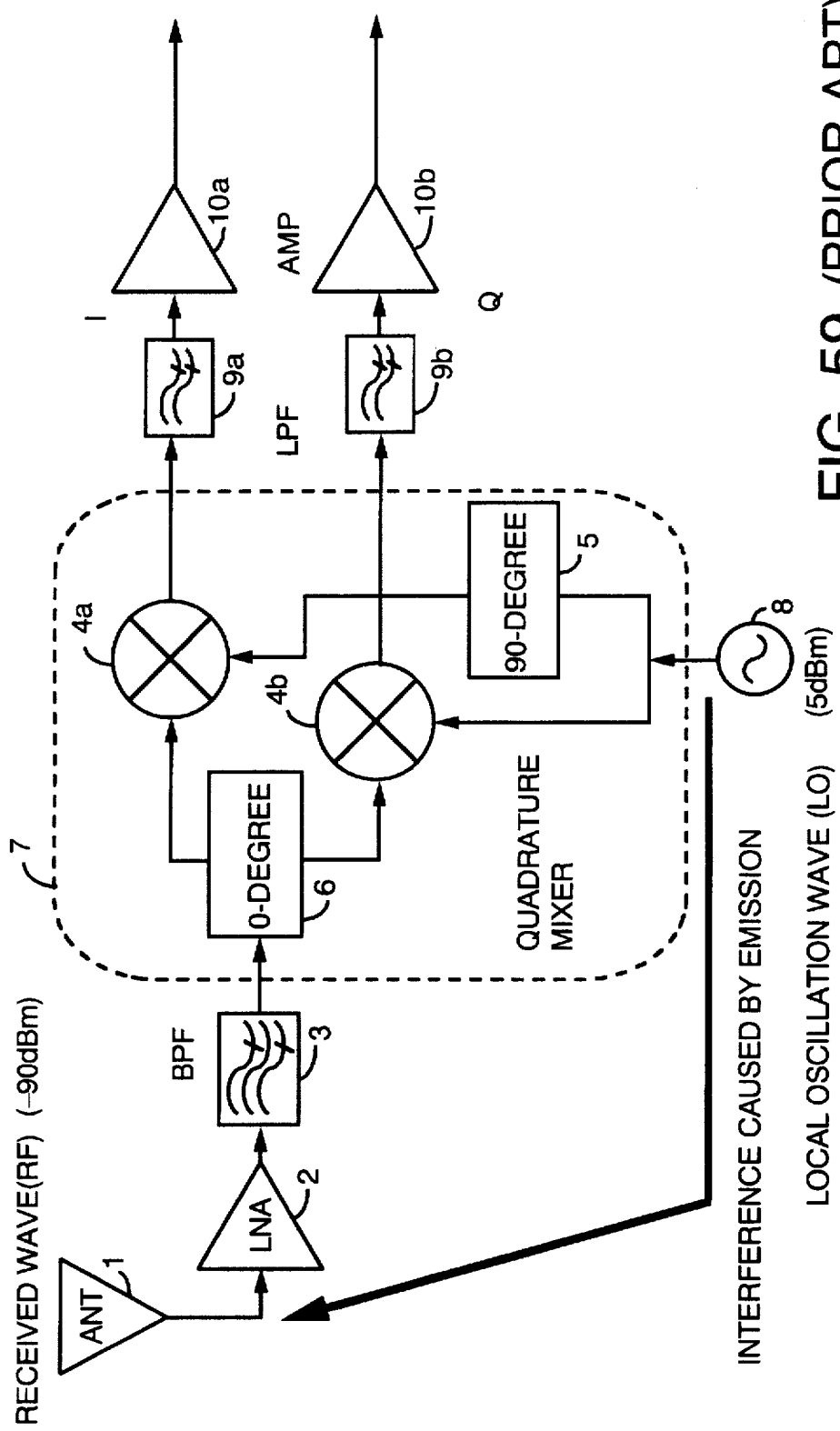
FIG. 59 illustrates an interference in a conventional receiver.
Figure 60:
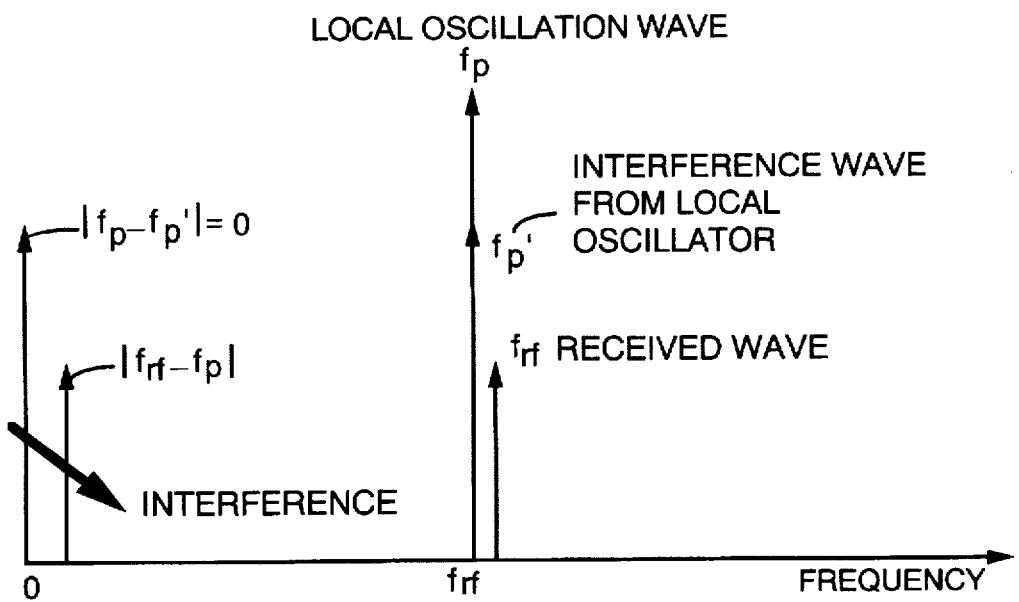
FIG. 60 shows a frequency relationship when an interference wave exists.
Figure 61:
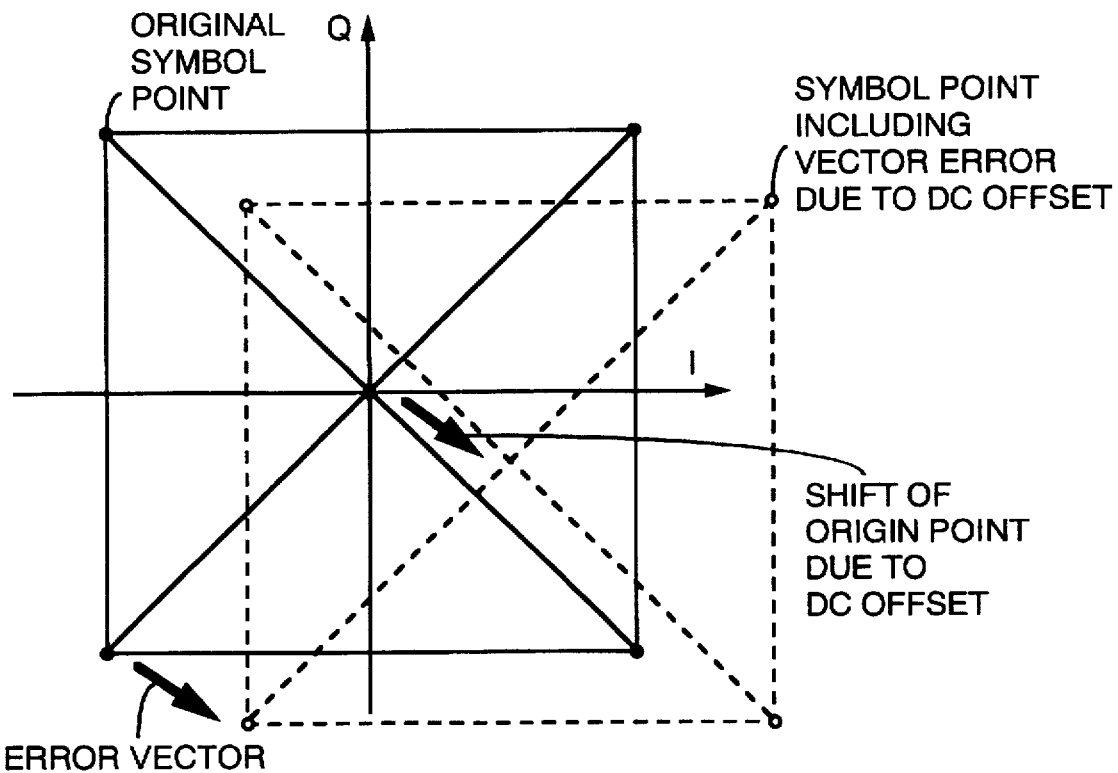
FIG. 61 illustrates I output and Q-output when an interference wave exists.
Figure 62:
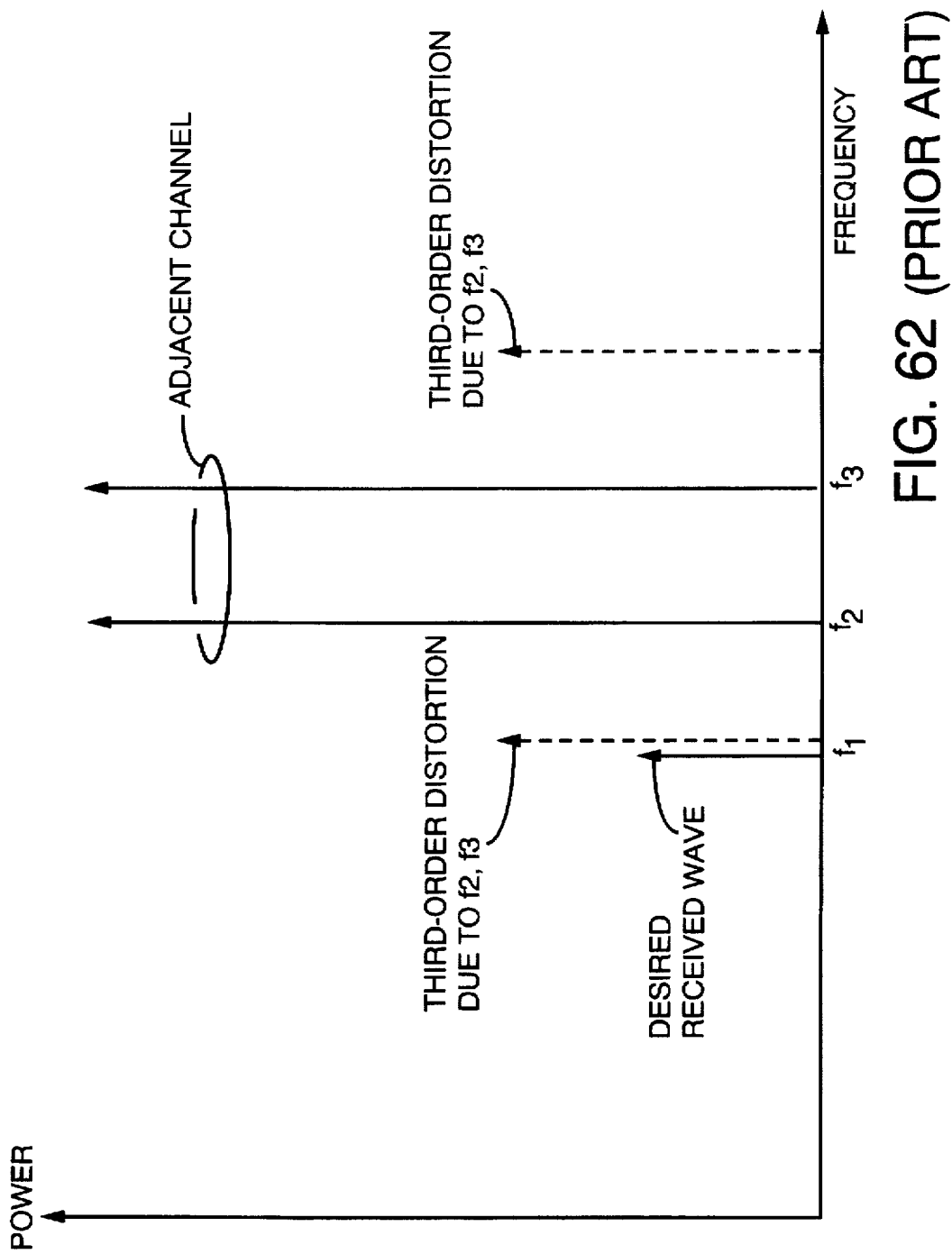
FIG. 62 shows a frequency relationship of third-order distortion.
Figure 63:
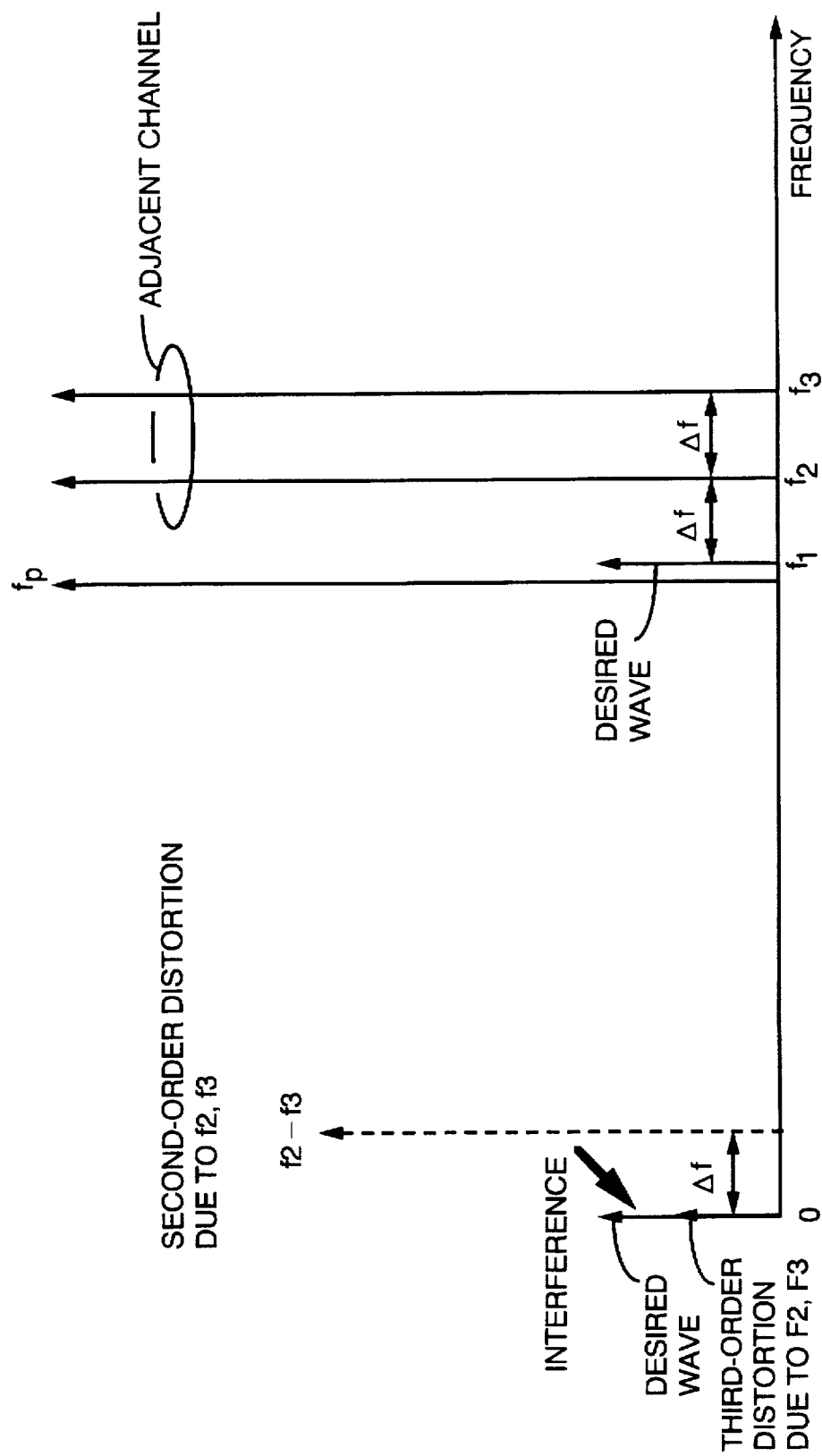
FIG. 63 shows a frequency relationship of the second-order distortion.

The even harmonic mixer of FIG. 50 are different from that of FIG. 58 in the exiting condition for transistors. In FIG. 50, transistors 19a and 19b are excited in inverted phase and transistors 19c and 19d are also excited in inverted phase. Transistors 19a and 19d are further excited in inverted phase. On the other hand, in the even harmonic mixer of FIG. 58, transistors 19a and 19d are excited in the common phase.

By exciting transistors 19a and 19d in inverted phase, mixing of fundamental waves can be restrained, the mixer of FIG. 50 operates as an even harmonic mixer. In such even harmonic mixer, no DC offset is generated even if the characteristics of each transistor is different, because rectified currents in each transistor are offset. In addition, RF and LO are not outputted to base band output terminal 17 because they are canceled.

The further detailed description is added as follows. In even harmonic mixer in FIG. 50, the base terminals of transistors 19b and 19c are grounded. LO signal is applied to transistors 19a, 19d so that the LO signal applied to transistor 19a and the LO signal applied to transistor 19d become inverted phase to each other. If the LO potential on terminal 16 is set to $\pm V_{LO}$, $+V_{LO}$ is applied to the base of transistor 19a, 0 [V] is applied to the base of transistors 19b, 19c, and $-V_{LO}$ is applied to the base of transistor 19d. Accordingly, the LO signals outputted to output terminal 17 are in common phase and they are not canceled to each other.

On the other hand, in transistors 19a, 19b, 19c, 19d, a double frequency wave of $V_{LO}$, namely $+V_{2LO}$ is generated due to the non-linearity of these transistors. With regard to the double frequency wave $+V_{2LO}$, a signal $+V_{2LO}$ is generated in transistor 19a, 0 [V] is generated in transistor 19b, 19c, and a signal $+V_{2LO}$ is generated in transistor 19d. Accordingly, the double frequency waves $+V_{2LO}$ outputted to output terminal 17 are in inverted phase and they are canceled to each other in the same manner as signals $V_{LO}$ in FIG. 58.

When RF signals are applied to the terminal 15 and their voltage is assumed to be ±V$_{rf}$, differential outputs +V$_{rf}$ and −V$_{rf}$ from a differential amplifier comprised of transistors 19e, 19f are provided respectively with transistors 19a, 19b and with transistors 19c, 19d, more precisely, +V$_{rf}$ are applied to transistors 19a, 19b and −V$_{rf}$ are applied to transistors 19c, 19d. Accordingly, the mixed waves as a result of multiplying V$_{LO}$ with V$_{rf}$ become V$_{LO}$·V$_{rf}$ in transistor 19a, 0 [V] in transistor 19b, 19c and V$_{LO}$·V$_{rf}$ in transistor 19d, respectively. Accordingly, the resulting mixed waves outputted to output terminal 17 are in inverted phase and are canceled to each other.

On the other hand, the mixed wave as a result of multiplying with V$_{2LO}$ becomes V$_{2LO}$·V$_{rf}$ in transistor 19a, 0 [V] in transistor 19b, 19c, and −V$_{2LO}$·V$_{rf}$ in transistor 19d, respectively. Accordingly, the resulting mixed waves outputted to output terminal 17 are in common phase and are not restrained to each other. Therefore, the configuration of FIG. 50 operates as an even harmonic mixer even if a transistor is used.

The twentieth embodiment realizes downsizing of the mixer since an even harmonic mixer can be comprised of a transistor. Such configuration is especially advantageous when the even harmonic mixer is comprised of monolithic construction.

Embodiment 21.

The characteristic of even harmonic mixer 40a and 40b can be uniformed if even harmonic quadrature mixer in FIG. 10 is integrated by monothilic IC on a single semiconductor substrate. Thereby, further improvement in the performance, such as vector accuracy, can be expected.

Embodiment 22.

In the above-mentioned embodiments 1~21 so far, an even harmonic quadrature mixer is used for a receiving apparatus. Such even harmonic quadrature mixer is also used as a vector modulator in a transmitting apparatus.

Figure 51:
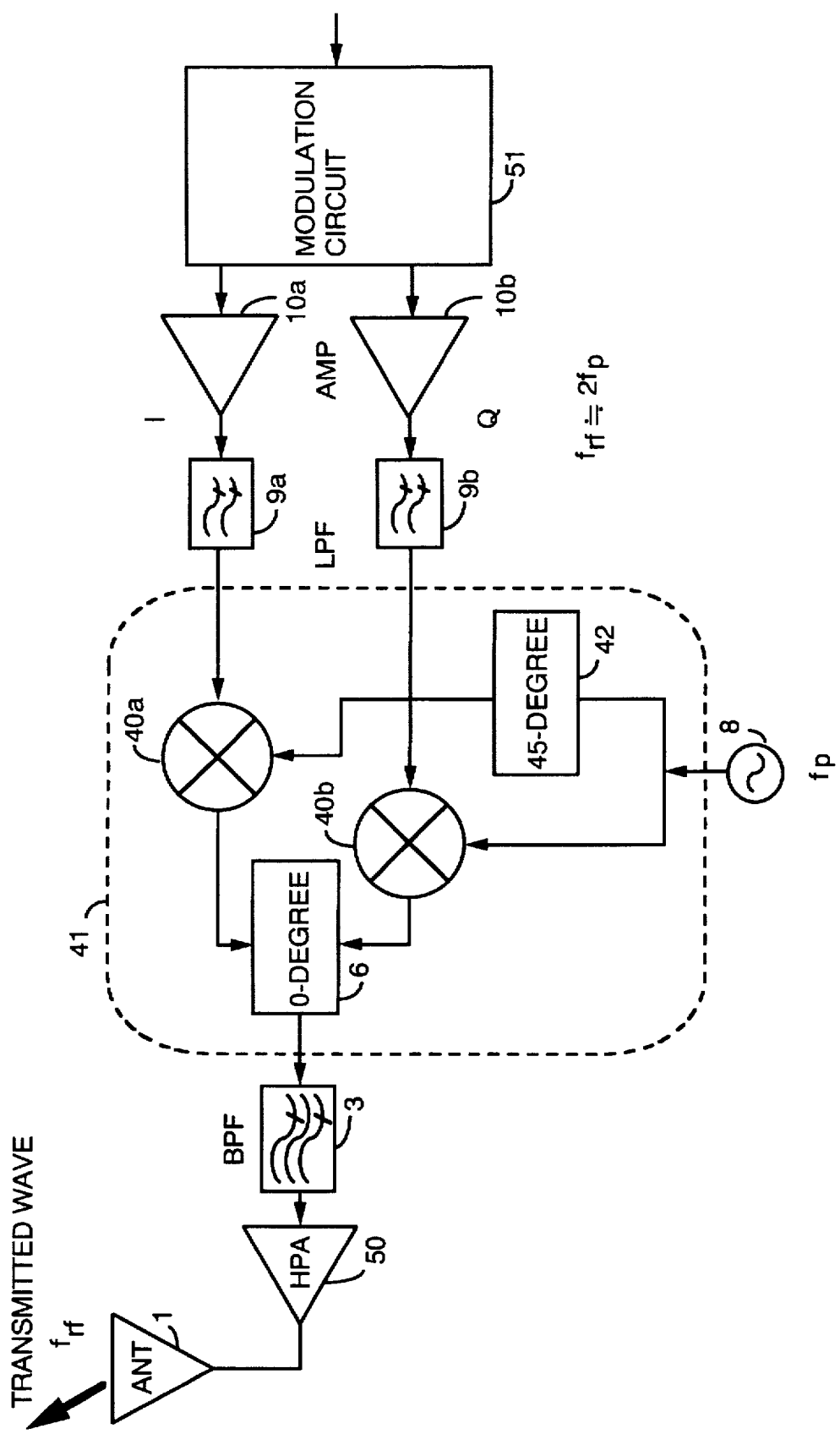
FIG. 51 shows a configuration of transmitting apparatus according to a twenty second embodiment of the present invention.
Figure 52:
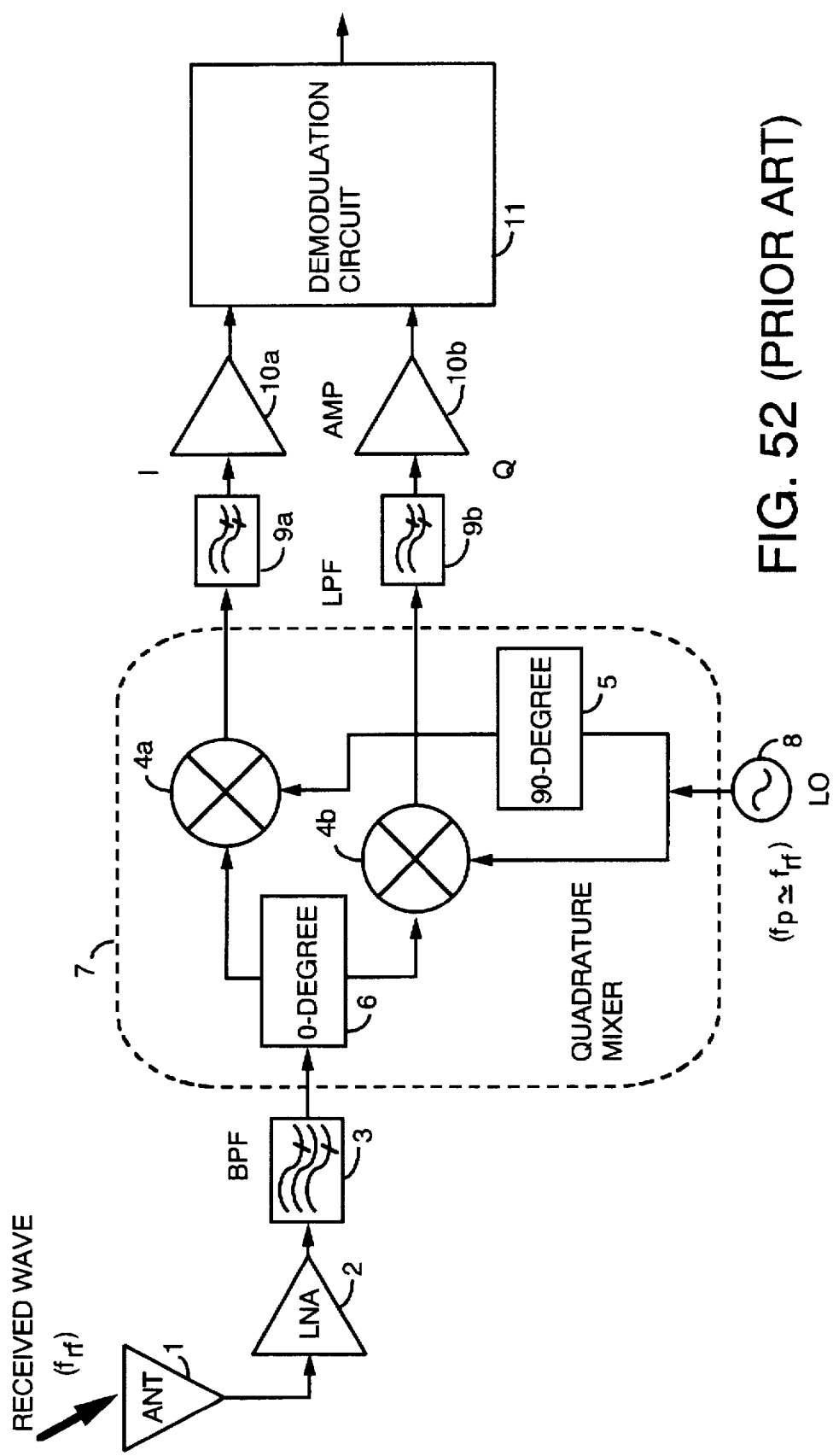
FIG. 52 shows a configuration of a conventional receiver.
Figure 53:
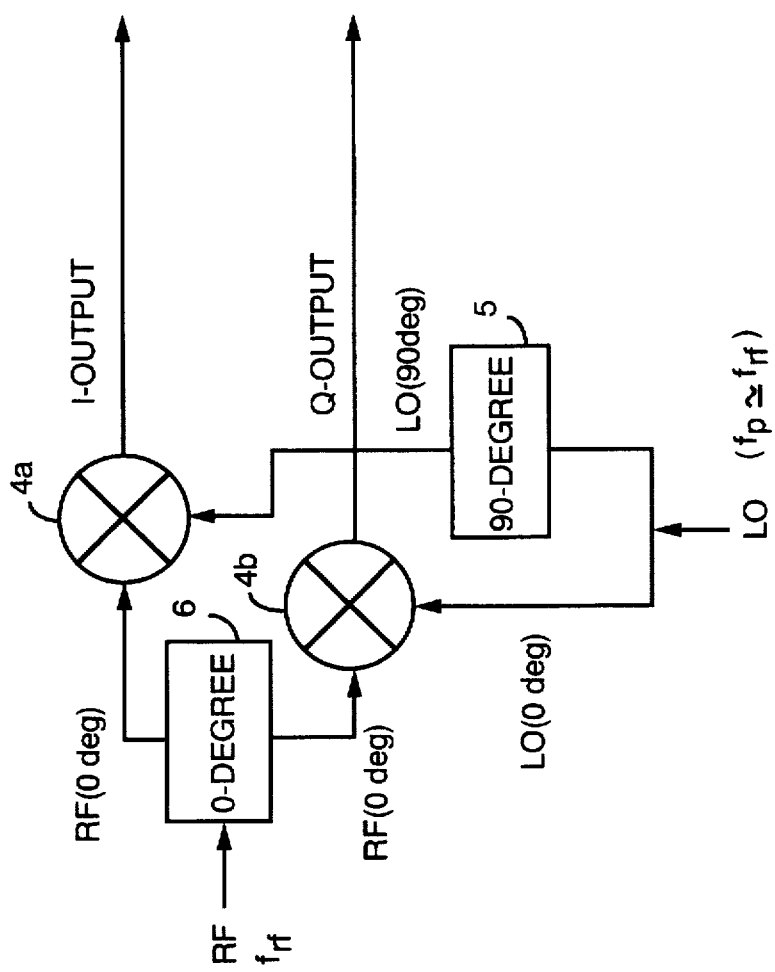
FIG. 53 shows a configuration of a conventional quadrature mixer.
Figure 54:
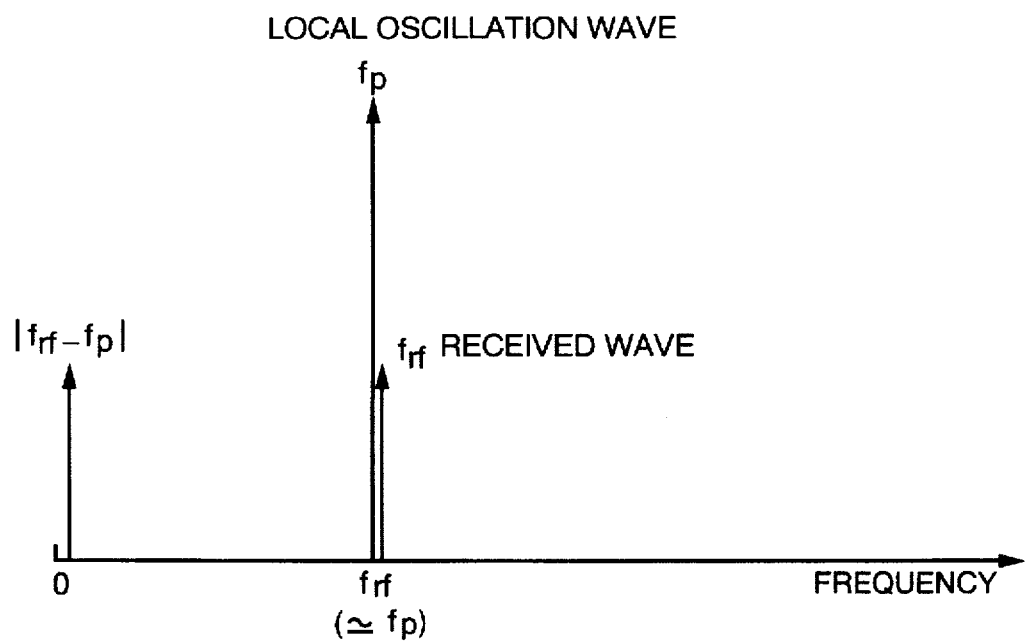
FIG. 54 shows a frequency relationship in a conventional receiver.
Figure 55:
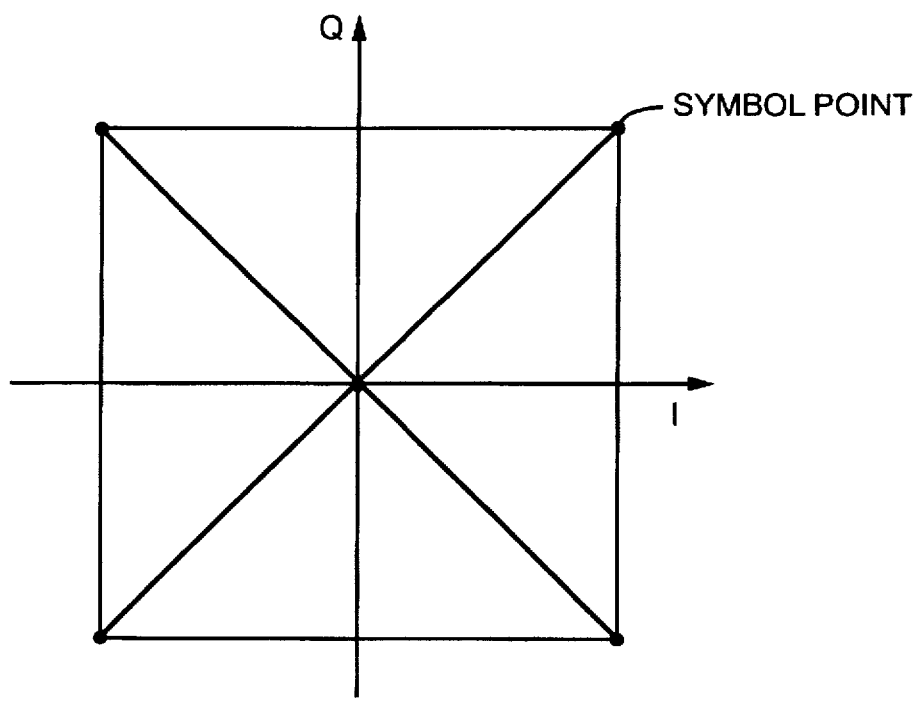
FIG. 55 illustrates I output and Q output.
Figure 56:
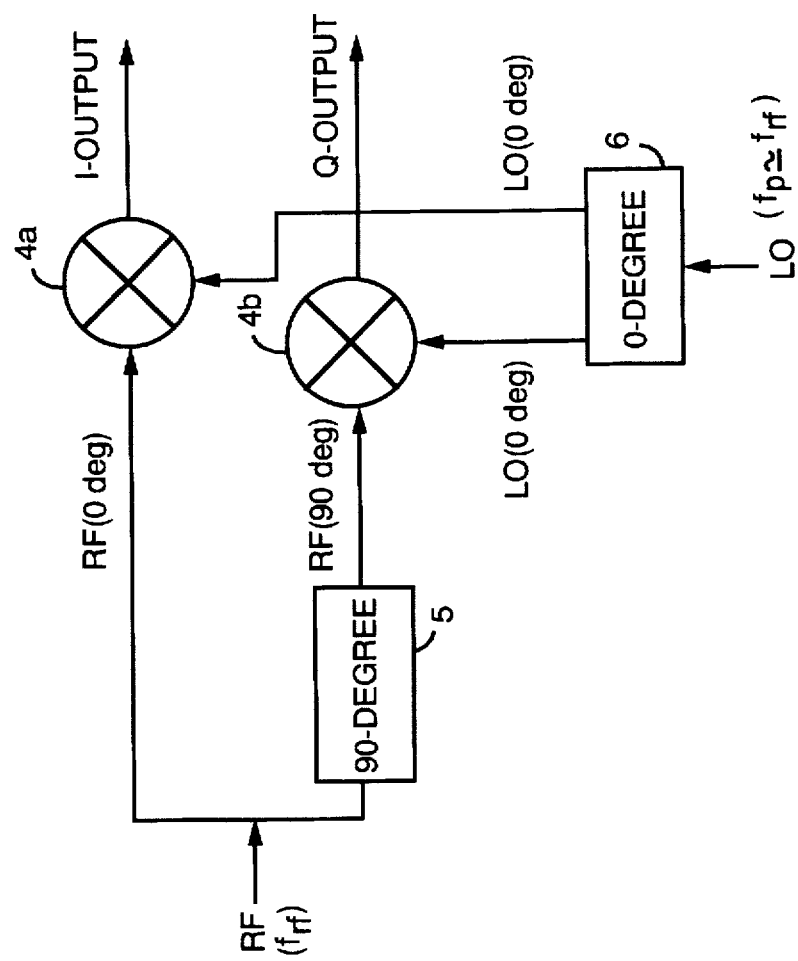
FIG. 56 shows another configuration of a conventional quadrature mixer.

FIG. 51 shows a configuration of transmitting apparatus having a vector modulator using an even harmonic quadrature mixer. The configuration of FIG. 51 comprises an antenna 1 for emitting signals, a high power amplifier 50 for providing transmission power to antenna 1, a band pass filter (BPF) 3 where only transmission signal outputted from even harmonic quadrature mixer can pass through, a local oscillator 8 for outputting local oscillation waves, an even harmonic quadrature mixer 41 which functions as a vector modulator for modulating I-signal and Q-signal according to a local oscillation wave, low pass filters (LPF) 9a, 9b where only signal waves contained in I-signal and Q-signal can pass through, base band amplifiers (AMP) 10a, 10b for amplifying I-signal and Q-signal and providing them with low pass filters 9a, 9b, respectively, and a modulator 51 for modulating data to I-signal and Q-signal.

Transmitting apparatus of FIG. 51 operates in the same way as a receiving apparatus except that even harmonic quadrature mixer 41 operates as a vector modulator since signal current is reverted inside the even harmonic quadrature mixer 41.

By applying any one of even harmonic quadrature mixers 41 in the above embodiments to the transmitting apparatus in FIG. 51, the transmitting apparatus is expected to obtain the same effect as those in each embodiment mentioned-above. When an even harmonic quadrature mixer 41 is used as a vector modulator, modulation accuracy is improved.

Although the mixers in the above-mentioned embodiments 1~22 are concerned to get base band outputs, the same description are also applicable to get outputs of the intermediate frequency.

What is claimed is:

1. A detector comprising:

a first distributor for distributing a signal wave;

a 45 degree shifter for shifting a local oscillation wave provided from a local oscillator;

a first even harmonic mixer for generating a mixed wave between a double frequency wave of said local oscillation wave from said shifter and said signal wave from said first distributor; and a second even harmonic mixer for generating a mixed wave between a double frequency wave of said local oscillation wave from said local oscillator and said signal wave from said first distributor.

2. A detector of claim 1: wherein said first distributor feeds said signal wave to said first even harmonic mixer and said second even harmonic mixer so that said signal wave is distributed equally in phase and magnitude;

said local oscillator feeds the local oscillation wave to said second even harmonic mixer; and said shifter feeds said local oscillation wave, which is different in phase by 45 degrees from said local oscillation wave but equal in magnitude, to said first even harmonic mixer.

3. A detector of claim 1 wherein a center frequency of said first distributor is set between a frequency of said signal wave and a frequency of said local oscillation wave.

4. A detector of claim 1 wherein a center frequency of said shifter is set between a frequency of said signal wave and a frequency of said local oscillation wave.

5. A detector of claim 1 comprising:

a first amplifier for amplifying an output from said first distributor and providing a first amplifier output to said first even harmonic mixer; and a second amplifier for amplifying an output from said first distributor and providing a second amplifier output to said second even hermonic mixer.

6. A detector of claim 1 comprising:

a third amplifier for amplifying an output from said local oscillator and for providing a third amplifier output to said second even harmonic mixer; and a fourth amplifier for amplifying an output from said shifter and providing a fourth amplifier output to said first even harmonic mixer.

7. A detector of claim 1 comprising:

a first filter arranged between said first distributor and said first even harmonic mixer so that said signal wave passes through said first filter, and a second filter arranged between said first distributor and said second even harmonic mixer so that said signal wave passes through said second filter.

8. A detector of claim 1 comprising:

a third filter arranged between said local oscillator and said second even harmonic mixer so that said local oscillation wave passes through said third filter; and a fourth filter arranged between said shifter and said first even harmonic mixer so that said phase shifted local oscillation wave passes through said fourth filter.

9. A detector of claim 7 wherein said filter blocks a frequency sum (f$_{in}$,+2f$_p$), when said signal wave frequency is f$_{in}$, and said local oscillation wave frequency is f$_p$.

10. A detector of claim 8 wherein
said filter blocks a frequency sum $(f_{in}+2f_p)$, when said signal wave frequency is $f_{in}$, and said local oscillation wave frequency is $f_p$.

11. A detector of claim 1, further comprising:
a doubled-wave restraining filter for restraining a double frequency wave contained in said local oscillation wave whereby a restrained local oscillation wave is provided to said shifter and said second even harmonic mixer.

12. A detector of claim 1, further comprising:
a limiter for restraining an amplitude fluctuation contained in said local oscillation wave whereby a restrained local oscillation wave is provided to said shifter and said second even harmonic mixer.

13. A detector of claim 1 further comprising:
a divider for dividing said local oscillation wave whereby a divided local oscillation wave is provided to said shifter and said second even harmonic mixer.

14. A detector of claim 1, further comprising:
a first load resistance having a value of above 50Ω on an output terminal of said first even harmonic mixer; and
said second load resistance having a value of above 50Ω on an output terminal of a second even harmonic mixer.

15. A detector of claim 1, further comprising:
a first low pass filter arranged on an output terminal of said first even harmonic mixer so that a frequency of a converted base band adjacent channel wave becomes a cutoff frequency; and
a second low pass filter arranged on an output terminal of said second even harmonic mixer so that a frequency of the converted base band adjacent channel wave becomes the cutoff frequency.

16. A detector of claim 1, wherein each of said first even harmonic mixer or said second even harmonic mixer comprises:
a diode pair comprised of two diodes connected in parallel, said two diodes are connected in opposite polarity to each other, a first terminal (A) at the parallel connection of said two diodes is connected to an input terminal of said signal wave and also connected to an output terminal of said mixed wave, a second terminal (B) of the parallel connection of said two diodes is connected to an input terminal of said local oscillation wave;
a first diplexer connected to said first terminal (A) of the parallel connection, said first diplexer being short at a frequency of said local oscillation wave, and being open at a frequency of said signal wave; and
a second diplexer connected to said second terminal (B) of the parallel connection, said second diplexer being open at a frequency of said local oscillation wave, and being short at a frequency of said signal wave.

17. A detector of claim 16 wherein
said first diplexer is comprised of a serial resonant circuit comprised of a first capacitor and an inductor connected in series, and a second capacitor connected in parallel with said serial resonant circuit.

18. A detector of claim 16 wherein
said first diplexer is comprised of a parallel resonant circuit comprised of a first capacitor and an inductor connected in parallel, and a second capacitor connected in series with said parallel resonant circuit.

19. A detector of claim 16 wherein
said second diplexer is comprised of a serial resonant circuit comprised of a capacitor and a first inductor connected in series, and a second inductor connected in parallel with said serial resonant circuit.

20. A detector of claim 16 wherein
said second diplexer is comprised of a parallel resonant circuit comprised of a capacitor and a first inductor connected in parallel, and a second inductor connected in series with said parallel resonant circuit.

21. A detector of claim 1 wherein each of said first even harmonic mixer or said second even harmonic mixer comprises:
a differential amplifier for amplifying said local oscillation wave to output said local oscillation wave as a first output and a second output which is inverted from first output; and
a mixing portion comprised of a diode ring, said diode ring comprising a plurality of diode pairs connected to each other in ring shape, each of said diode pairs comprised of two diodes connected in parallel, said two diodes of each diode pair being connected in opposite polarity, for outputting a mixed wave according to said two outputs from said differential amplifier.

22. A detector of claim 21, further comprising:
a filter connected between said differential amplifier and said mixing portion for removing harmonics included in an output waveform from said differential amplifier.

23. A detector of claim 1 wherein each of said first even harmonic mixer or said second even harmonic mixer comprises:
a first differential amplifier for amplifying said signal wave and for outputting said signal wave as a first output and a second output which is inverted from said first output;
a second differential amplifier for receiving said local oscillation wave and for generating a first double frequency wave of a local oscillation wave and then for multiplying said first double frequency wave and said first output from said first differential amplifier to output as differential signals; and
a third differential amplifier having an output terminal connected in parallel with an output of said second differential amplifier, for receiving said local oscillation wave and for generating a second double frequency wave which is in inverted phase to the first double frequency wave of a local oscillation wave generated in said second differential amplifier, and then for multiplying said second double frequency wave and said second output from said first differential amplifier to output as differential signals.

24. A receiving apparatus comprising:
an antenna;
an amplifier for amplifying a signal received by said antenna;
a local oscillator for generating a local oscillation wave;
a detector for detecting an output of said amplifier and for outputting a base band I-signal a base band Q-signal according to said local oscillation wave, said detector comprising a first distributor for distributing a signal wave output by said amplifier, a 45° shifter for shifting said local oscillation wave a first even harmonic mixer for generating said base band I-signal between a double frequency of local oscillation wave from said shifter and said signal wave from said first distributor, and a second even harmonic mixer for generating said base band Q-signal between a double frequency of said local oscillation wave from said local oscillator and said signal wave from said first distributor; and a demodulation circuit for demodulating data according to said I-signal and said Q-signal.

25. A transmitting apparatus comprising:

a modulation circuit for modulating data and providing an I-signal and a Q-signal;

a local oscillator for generating a local oscillation wave;

a vector modulator for modulating each of said I-signal and said Q-signal according to said local oscillation wave, said vector modulator comprising a 45° phase shifter for shifting said local oscillation wave, a first even harmonic mixer for generating a first mixed wave between a double frequency of said local oscillation wave from said shifter and said I-signal, a second even harmonic mixer for generating a second mixed wave between a double frequency of said local oscillation wave from said local oscillator and said Q-signal, and a combiner for combining said I-signal and said Q-signal and providing an output from said vector modulator;

an amplifier for amplifying the output from said vector modulator; and an antenna for transmitting an output from said amplifier.

* * * * *